US008846300B2

(12) United States Patent
Sato et al.

(10) Patent No.: US 8,846,300 B2
(45) Date of Patent: Sep. 30, 2014

(54) DEVELOPER FOR PROCESSING LITHOGRAPHIC PRINTING PLATE PRECURSOR, METHOD FOR MANUFACTURING LITHOGRAPHIC PRINTING PLATE BY USING THE DEVELOPER, AND PRINTING METHOD

(75) Inventors: Takashi Sato, Shizuoka (JP); Toshifumi Inno, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/638,114

(22) PCT Filed: Mar. 31, 2011

(86) PCT No.: PCT/JP2011/058357
§ 371 (c)(1),
(2), (4) Date: Sep. 28, 2012

(87) PCT Pub. No.: WO2011/125913
PCT Pub. Date: Oct. 13, 2011

(65) Prior Publication Data
US 2013/0014658 A1    Jan. 17, 2013

(30) Foreign Application Priority Data
Mar. 31, 2010  (JP) ................................. 2010-084414

(51) Int. Cl.
| B41M 5/00 | (2006.01) |
| B41N 1/00 | (2006.01) |
| G03F 7/00 | (2006.01) |
| G03F 7/26 | (2006.01) |
| G03F 7/32 | (2006.01) |

(52) U.S. Cl.
CPC ..................................... G03F 7/322 (2013.01)
USPC ..... 430/302; 430/270.1; 430/434; 101/450.1; 101/453; 101/463.1

(58) Field of Classification Search
USPC ...................................... 430/270.1, 302, 434
See application file for complete search history.

(56) References Cited

U.S. PATENT DOCUMENTS

| 2003/0215755 A1 | 11/2003 | Lundy et al. |
| 2005/0266349 A1 | 12/2005 | Van Damme et al. |
| 2006/0257783 A1 | 11/2006 | Sugasaki |
| 2009/0208869 A1 | 8/2009 | Kamiya et al. |
| 2012/0141935 A1 * | 6/2012 | Strehmel et al. ........... 430/270.1 |

FOREIGN PATENT DOCUMENTS

| CN | 1511712 A | 7/2004 |
| CN | 101223480 A | 7/2008 |
| EP | 1 868 036 A1 | 12/2007 |
| EP | 2080616 A1 * | 7/2009 |
| JP | 8-305039 A | 11/1996 |
| JP | 11-65126 A | 3/1999 |
| JP | 11-174689 A | 7/1999 |
| JP | 2002-40672 A | 2/2002 |
| JP | 2004-93744 A | 3/2004 |
| JP | 3690761 B | 8/2005 |
| JP | 2007-17913 A | 1/2007 |
| JP | 2007-47742 A | 2/2007 |
| JP | 2007-538279 A | 12/2007 |
| WO | 2010004778 A1 | 1/2010 |

OTHER PUBLICATIONS

Written Opinion (PCT/ISA/237) dated May 17, 2011, issued by the International Searching Authority in International Application No. PCT/JP2011/058357.
Extended European Search Report dated Nov. 11, 2013, issued by the European Patent Office in corresponding European Application No. 11765813.8.
International Search Report (PCT/ISA/210) dated May 17, 2011, issued by the International Searching Authority in International Application No. PCT/JP2011/058357.
Office Action, dated Nov. 18, 2013, issued by the Industrial Property Office of Australia, in counterpart Application No. 2011236976.
Office Action dated Mar. 27, 2014 issued by the State Intellectual Property Office of P.R. China in corresponding Chinese Application No. 201180018037.1.
Office Action dated Jun. 10, 2014, issued by the Japanese Patent Office in Japanese Application No. 2011-079675.

* cited by examiner

*Primary Examiner* — Chanceity Robinson
(74) *Attorney, Agent, or Firm* — Sughrue Mion, PLLC

(57) ABSTRACT

To provide a developer for processing of a lithographic printing plate precursor, containing a non-reducing sugar having bonded therein two or more monosaccharides and having a pH of 6 to 14 and thereby provide a developer having a pH stable to aging and an excellent film-forming property, a method for manufacturing a lithographic printing plate, where a lithographic printing plate excellent in developability and dispersibility of development scum and kept from staining of the non-image area can be manufactured even by simple processing of one solution and one step requiring no water washing step, a developer used therefor, and a printing method of performing printing by using the manufacturing method of a lithographic printing plate.

4 Claims, 2 Drawing Sheets

DEVELOPER FOR PROCESSING LITHOGRAPHIC PRINTING PLATE PRECURSOR, METHOD FOR MANUFACTURING LITHOGRAPHIC PRINTING PLATE BY USING THE DEVELOPER, AND PRINTING METHOD

TECHNICAL FIELD

The present invention relates to a developer for processing of a lithographic printing plate precursor, a method for manufacturing a lithographic printing plate by using the developer, and a printing method.

BACKGROUND ART

In general, a lithographic printing plate consists of an ink-receptive image area for receiving an ink in the printing process and a hydrophilic non-image area for receiving a fountain solution. Lithographic printing is a method utilizing the mutually repelling property of water and printing ink, where the ink-receptive image area and the hydrophilic non-image area of a lithographic printing plate are used as an ink-receiving area and a fountain solution-receiving area (a non-ink-receiving area), respectively, to make a difference in adherence of the ink on the surface of the lithographic printing plate and after depositing the ink only on the image area, the ink is transferred to a printing material such as paper, thereby performing the printing.

For manufacturing such a lithographic printing plate, a lithographic printing plate precursor (PS plate) comprising a hydrophilic support having provided thereon an ink-receptive photosensitive resin layer (photosensitive layer, image recording layer) has been conventionally used. Usually, a lithographic printing plate is obtained by performing plate making according to a method where a PS plate is exposed through an original such as lith film and while allowing the image recording layer in the portion working out to an image area to remain, the image recording layer in other unnecessary portions is dissolved and removed with an alkaline developer or an organic solvent to uncover the hydrophilic support surface and thereby form a non-image area.

On the other hand, in recent years, a digitization technology of electronically processing, storing and outputting image information by a computer has been widespread, and various new image outputting systems responding to the digitization technology have been put into practical use. Along with this, a computer-to-plate (CTP) technique is attracting attention, where digitized image information is carried on a highly converging radiant ray such as laser light and a lithographic printing plate precursor is scanned and exposed by this light to directly produce a lithographic printing plate without the intervention of a lith film. Accordingly, it is one of important technical challenges to obtain a lithographic printing plate precursor responsive to such a technology.

The plate-making process of a conventional lithographic printing plate precursor requires a step of dissolving and removing the unnecessary image recording layer with a developer or the like after exposure and in view of environment and safety, the problem to be solved includes processing with a developer closer to the neutral region or reduction in wastewater generation. Above all, the treatment of wastewater discharged along with wet processing is recently a great concern to the entire industrial world from the standpoint of consideration for global environment, and the demand to solve these problems is becoming stronger.

As described above, from both aspects of consideration for global environment and adaptation to space saving and low running cost, it is more strongly required than ever to decrease the alkali concentration of developer and simplify the processing step. However, as described earlier, the conventional development processing comprises three steps of development with an aqueous alkali solution having pH of 11 or more, washing of the alkali agent in a water washing bath, and treatment with a gum solution mainly composed of a hydrophilic resin. Therefore, the automatic developing machine itself requires a large space and furthermore, there remains unresolved the issue in terms of environment and running cost, such as problem of treatment of development wastewater, washing wastewater and gum wastewater.

In this connection, for example, Patent Document 1 has proposed a development method of performing the processing with a low-alkaline developer containing an alkali metal carbonate and an alkali metal hydrogencarbonate and having a pH of 8.5 to 11.5 and an electrical conductivity of 3 to 30 mS/cm, but the developer does not contain a water-soluble polymer compound and requires a water washing step and a gum solution treatment step, and the issue in terms of environment and running cost has not been resolved.

Also, as described below, in Patent Documents 2 to 4, a treatment with a developer containing a water-soluble polymer compound such as sugar is disclosed.

Patent Document 2 discloses development processing with a gum solution preferably at a pH of 3 to 9. However, this gum solution does not contain a base component and therefore, the polymer of the photosensitive layer must be made hydrophilic to enable development, incurring a problem that the press life is seriously impaired. In addition, the hydrophilic protection of the non-image area by the gum component is insufficient and with an increase in the number of printed matters, the non-image area tends to be deteriorated in the stain preventing property.

Patent Document 3 discloses a plate-making method using a developer containing cyclodextrin or a derivative thereof, and in Examples, a developer having a pH of 3 to 9 and containing cyclodextrin together with a hydroxypropyl etherified starch and gum arabic is used.

Patent Document 4 describes in Examples a plate-making method of performing development processing with a processing solution having a pH of 11.9 to 12.1 and containing a film-forming polymer, wherein the method does not include a gum treatment step. It is stated that the film-forming polymer is preferably, among others, a polyhydroxy compound, and a sugar alcohol such as sorbitol is described as the polyhydroxy compound.

However, the sorbitol is a relatively small compound having a molecular weight of 182 and a carbon number of 6 and is weak in the film-forming property or adsorbability to the support as compared with a polymer compound, and a printing plate obtained by such processing has poor scumming resistance due to desorption of the gum component during printing. Also, the plate is in a state of an alkali still adhering to the plate surface, giving rise to a problem in view of safety of the worker, and moreover, there is a problem that when a long time is passed after preparation of the printing plate until printing, the image area is gradually dissolved to incur reduction in the press life or ink receptivity.

Even by these techniques, it has been difficult to provide a development processing solution having a pH stable to aging over a wide pH region from alkaline to neutral and having excellent film-forming property and a development method ensuring that even by simple processing of one solution and one step requiring no water washing step, excellent developability and good dispersibility of development scum are achieved and the non-image area can be kept from staining.

RELATED ART

Patent Document

Patent Document 1: JP-A-11-65126 (the term "JP-A" as used herein means an "unexamined published Japanese patent application")

Patent Document 2: JP-T-2007-538279 (the term "JP-T" as used herein means a published Japanese translation of a PCT patent application)

Patent Document 3: International Publication No. 10/004,778

Patent Document 4: European Unexamined Patent Publication No. 1868036

SUMMARY OF THE INVENTION

Problems that the Invention is to Solve

An object of the present invention is to provide a developer having a pH stable to aging and having excellent film-forming property; a manufacturing method of a lithographic printing plate, ensuring that even by simple processing of one solution and one step requiring no water washing step, a lithographic printing plate excellent in developability and dispersibility of development scum and kept from staining of the non-image area can be manufactured; and a printing method of performing printing by using this manufacturing method of a lithographic printing plate.

Means for Solving the Problems

In the conventional plate-making process, because of having hydrophilicity and excellent film-forming property and being commercially available at a relatively low cost, a sugar typified by starch and dextrin is used as the water-soluble polymer compound added to a gum solution.

The present inventors have found that when a gum solution treatment step is omitted for simplifying the processing step, a hydrophilic polymer compound must be added to the developer but if the above-described sugar is added, the pH of the developer is reduced with aging, and also found that most of sugars are an aldose having a reducing moiety at the terminal and because an aldehyde group is produced resulting from ring opening in the developer and converted to a carboxylic acid group by nucleophilic addition of OH$^-$ ion thereto, the OH$^-$ ion is consumed in the developer to cause reduction in pH.

The fluctuation with aging of pH of the developer produces a serious adverse effect on the solubility of the image recording layer for the developer, that is, the developability of lithographic printing plate precursor and the dispersibility of development scum, and among others, the stain resistance is greatly impaired, leading to reduction in the performance of the lithographic printing plate.

Furthermore, as a result of intensive studies, the present inventors have found when a non-reducing sugar having bonded therein two or more monosaccharides is incorporated into the developer, the pH is prevented from reduction with aging and a processing requiring no gum treatment step after development processing becomes possible.

In addition, it has been found that because the non-reducing sugar having bonded therein two or more monosaccharides has an excellent film-forming property, in the case of, for example, a negative lithographic printing plate precursor, the sugar forms a highly hydrophilic film on the support surface of the non-image area exposed to the developer resulting from removal of the photosensitive layer in the unexposed area by development processing and enhances the hydrophilicity of the non-image area and at the same time, when the sugar is a non-reducing sugar having a functional group capable of interacting with the support, the sugar adheres more firmly to the support surface and scarcely desorbs from the support surface of the non-image area during printing, making it possible to maintain the hydrophilicity. It has been found that the same effects are obtained also in the case of a positive lithographic printing plate precursor.

Based on these findings, the present inventors have accomplished the present invention.

That is, the object above can be attained by the following means.

(1) A developer for processing of a lithographic printing plate precursor, characterized by containing a non-reducing sugar having bonded therein two or more monosaccharides and having a pH of 6 to 14.

(2) The developer as described in (1) above, containing substantially no reducing sugar.

(3) The developer as described in (1) or (2) above, wherein the non-reducing sugar is at least one of a disaccharide, an oligosaccharide and a reduced starch saccharification product.

(4) The developer as described in any one of (1) to (3) above, wherein the non-reducing sugar is at least one of an oligosaccharide and a reduced starch saccharification product and the molecular weight of the non-reducing sugar is 500 or more.

(5) The developer as described in any one of (1) to (4) above, wherein the non-reducing sugar is a reduced starch saccharification product having a molecular weight of 1,000 or more.

(6) The developer as described in any one of (1) to (5) above, wherein the non-reducing sugar has a functional group capable of interacting with the support surface of the lithographic printing plate precursor after development processing.

(7) The developer as described in any one of (1) to (6) above, wherein the pH of the developer is from 6.5 to 11.0.

(8) The developer as described in any one of (1) to (7) above, wherein the pH of the developer is from 6.9 to 10.0.

(9) The developer as described in any one of (1) to (8) above, wherein the developer further contains at least one surfactant selected from an anionic surfactant, an amphoteric surfactant and a nonionic surfactant.

(10) The developer as described in any one of (1) to (9) above, wherein the developer further contains a pH buffer.

(11) The developer as described in (10) above, wherein the pH buffer is a carbonate ion and a hydrogencarbonate ion.

(12) The developer as described in (10) above, wherein the pH buffer is a water-soluble amine compound and an ion of the amine compound.

(13) A method for manufacturing a lithographic printing plate, comprising imagewise exposing a negative lithographic printing plate precursor comprising a hydrophilic support having thereon, in order, a photosensitive layer containing (i) a polymerization initiator, (ii) a polymerizable compound and (iii) a binder polymer, and a protective layer, and removing the protective layer and the photosensitive layer of the unexposed area in the presence of the developer described in any one of (1) to (12) above.

(14) A method for manufacturing a lithographic printing plate, comprising imagewise exposing a positive lithographic printing plate precursor comprising a hydrophilic support having thereon an image recording layer containing a binder polymer and an infrared absorber, and removing the image recording layer of the exposed area in the presence of the developer described in any one of (1) to (12) above.

(15) The method for manufacturing a lithographic printing plate as described in (14) above, wherein the positive lithographic printing precursor has, on the hydrophilic support, an image recording layer comprising a lower layer containing a water-insoluble and alkali-soluble resin and an infrared absorber and an upper layer containing a water-insoluble and alkali-soluble polyurethane and a polyorganosiloxane.

(16) The method for manufacturing a lithographic printing plate as described in any one of (13) to (15) above, which is characterized by comprising no water washing step.

(17) The method for manufacturing a lithographic printing plate as described in any one of (13) to (16) above, wherein the hydrophilic support of the lithographic printing plate precursor is an aluminum support surface-treated with at least either one of an alkali metal silicate and an organic phosphonic acid.

(18) A printing method comprising manufacturing a lithographic printing plate by the manufacturing method of a lithographic printing plate described in any one of (13) to (17) above, and performing printing by using the lithographic printing plate.

(19) The printing method as described in (18) above, which is characterized by containing no water washing step after the manufacture of the lithographic printing plate until starting the printing.

Advantage of the Invention

According to the present invention, a developer having a pH stable to aging and an excellent film-forming property can be provided. Also, thanks to this developer, a method for manufacturing a lithographic printing plate, where a lithographic printing plate excellent in developability and dispersibility of development scum and kept from staining of the non-image area can be manufactured even by simple processing of one solution and one step requiring no water washing step, and a printing method of performing printing by using the manufacturing method of a lithographic printing plate, can be provided.

MODE FOR CARRYING OUT THE INVENTION

Figure 1:
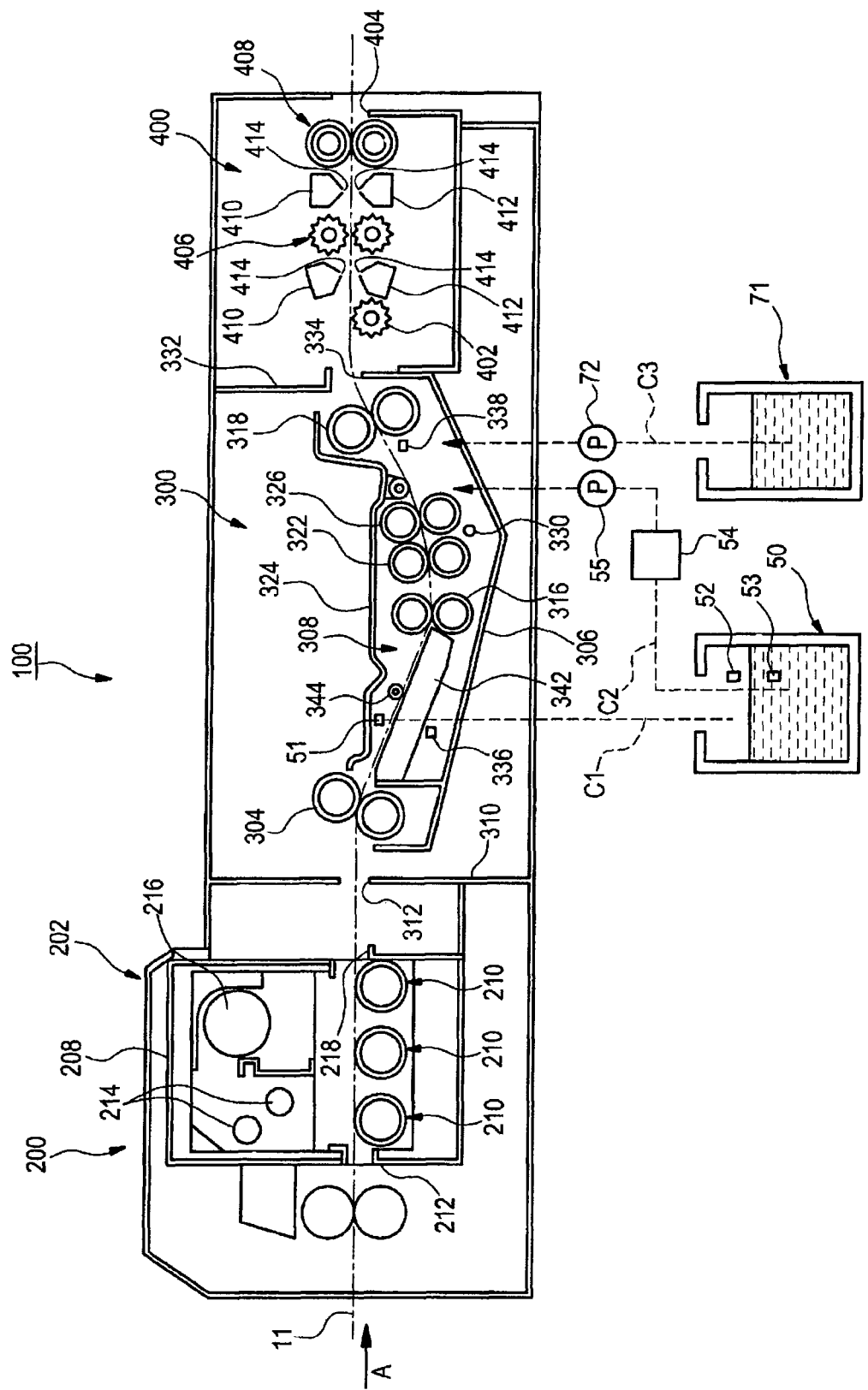
[FIG. 1] A schematic cross-sectional view of the automatic developing processor in an embodiment of the method for manufacturing a lithographic printing plate of the present invention.

The present invention is described in detail below.

The developer used in the present invention is an aqueous solution containing a non-reducing sugar having bonded therein two or more monosaccharides and having a pH of 6 to 14. The developer is preferably an aqueous solution using water as the main component (containing water in a ratio of 60 mass % or more), more preferably an aqueous solution containing a surfactant (e.g., anionic, nonionic, cationic, zwitterionic).

The pH of the developer is preferably from 6.5 to 11.0, more preferably from 6.8 to 10.5, still more preferably from 6.8 to 10.3, and most preferably from 6.9 to 10.0.

In the present invention, examples of the non-reducing sugar having bonded therein two or more monosaccharides (hereinafter, sometimes referred to as "specific non-reducing sugar"), which is added to the developer, include a disaccharide, a trisaccharide, an oligosaccharide, a polysaccharide, and a derivative thereof, which are formed by bonding monosaccharides or derivatives thereof (hereinafter, referred to as "constituent unit") each having two or more hydroxy groups in the molecule through a glycoside bond resulting from dehydrating condensation of hydroxy groups with one another.

The non-reducing sugar indicates a sugar having substantially no reducing terminal. The reducing terminal as used herein means a terminal capable of producing a reducing group (such as aldehyde group and ketone group) in a developer (particularly a developer whose pH is in the above-described preferred range).

That is, the non-reducing sugar used in the developer of the present invention produces substantially no reducing group in the developer. Therefore, according to the present invention, it is avoided from occurring that the reducing group further generates a carboxylic acid group by undergoing a nucleophilic reaction with $OH^-$ in the developer and due to resulting decrease of the $OH^-$ concentration and increase of the $H^+$ concentration in the developer, the pH of the developer is changed, and this is considered to enable obtaining a developer having a pH stable to aging.

Also, by using the developer of the present invention, a lithographic printing plate excellent in developability and dispersibility of development scum and kept from staining of the non-image area can be manufactured, and this is considered to be attributable to the fact that the pH of the developer of the present invention is stable to aging as described above and therefore, the development processing can be performed at a desired pH.

Furthermore, the developer of the present invention is a developer excellent in the film-forming property (excellent in the ability of forming a film on a printing plate), and this is considered to result because the specific non-reducing sugar used in the present invention is formed by bonding two or more monosaccharides and in turn, sufficient strength is imparted to the obtained film.

In the specific non-reducing sugar used in the present invention, the abundance of the reducing terminal is preferably 200 mmol or less, more preferably 150 mmol or less, still more preferably 70 mmol or less, per mol of the sugar, and it is most preferred that the sugar does not contain the reducing terminal at all.

The abundance of the reducing terminal in the specific non-reducing sugar can be measured, for example, by the Fehling's reaction that is generally known as one of chemical reactions attributable to the reducing property of aldehyde or sugar. When a developer appropriately diluted with pure water is added to a Fehling's solution and heated, a red precipitate of copper(I) oxide is produced, and the abundance of the reducing terminal can be determined from the mass of the precipitate.

The bond connecting a plurality of constituent units constituting the specific non-reducing sugar may be linear, branched or cyclic.

Specific examples of the specific non-reducing sugar include sugars illustrated below. These non-reducing sugars exhibit no reducing property.

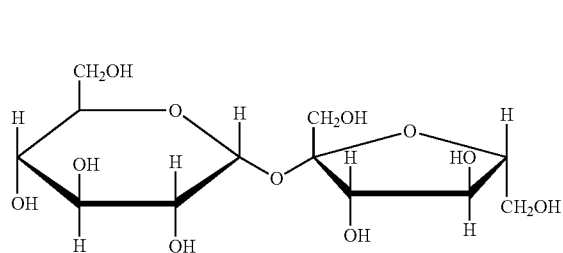
sucrose (molecular weight: 342)
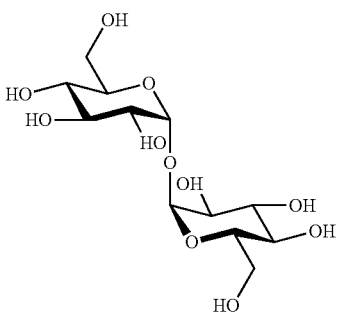
trehalose (molecular weight: 342)
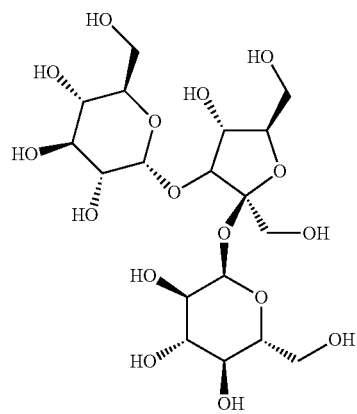
melezitose (molecular weight: 504)
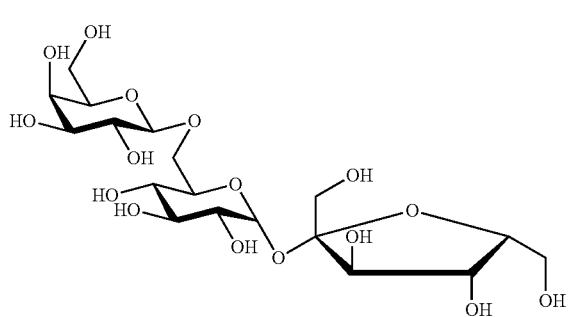
stachyose (molecular weight: 504)
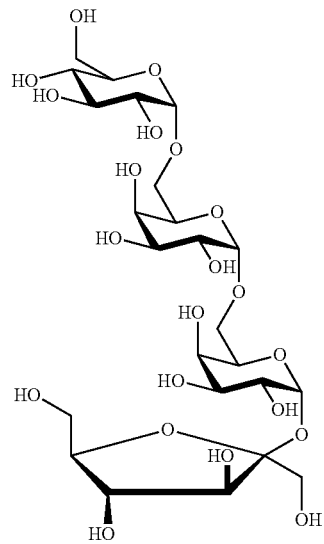
raffinose (molecular weight: 666)
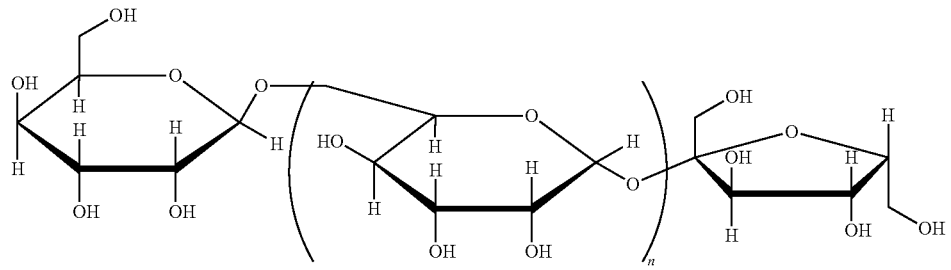
(n = 3 ~ 100000)

Also, a sugar that is made non-reducing by applying a chemical/physical treatment to a sugar having a reducing terminal capable of producing an aldehyde group, a ketone group or the like in an aqueous solution, and thereby allowing no appearance of an aldehyde group, a ketone group or the like may be used as the specific non-reducing sugar.

As one example of the chemical treatment, there may be exemplified a method where a moiety capable of producing an aldehyde group, a ketone group or the like is made into a non-reducing alcohol by applying hydrogenation to the reducing terminal.

The reducing method may be any method as long as general reduction can be achieved, and examples thereof include the method described in "Yuki Kagoubutsu no Gousei (Synthesis of Organic Compound) II" of *Jikken Kagaku Koza (Experimental Chemistry Course)*, 5th ed., Vol. 14 (compiled by The Chemical Society of Japan, Maruzen, pp. 1-48).

Specific examples of the sugar obtained by such a method include a reduced oligosaccharide, a reduced starch syrup, a reduced starch saccharification product, and a derivative thereof, which are a non-reducing sugar obtained by applying hydrogenation to a polysaccharide having a reducing property. Specific examples include Series HS available from Hayashibara Co., Ltd., and Diatol, Diatol L, Diatol K, Diatol N and Diatol P available from San-ei Sucrochemical Co., Ltd., which are commercially supplied as a food additive. Among others, preferred examples include HS-20, HS-30, HS-40, HS-60 and Mild Syrup available from Hayashibara Co., Ltd.

As another example of the chemical treatment, there may be exemplified a method of oxidizing a reducing terminal to produce a non-reducing carboxylic acid group.

The oxidizing method may be any method as long as general oxidation can be achieved, and examples thereof include a method using an oxidizing agent such as potassium chromate and potassium permanganate.

Here, the reducing sugar before applying a chemical treatment need not be particularly limited but for the purpose of protecting the plate surface from scratches, a sugar excellent in the film-forming property is more preferred. Examples thereof include gum arabic, a cellulose derivative (such as carboxymethyl cellulose, carboxyethyl cellulose, methyl cellulose, hydroxypropyl cellulose and methylpropyl cellulose) and a modified product thereof, a starch derivative (such as dextrin, maltodextrin, enzyme-decomposed dextrin, hydroxypropylated starch, hydroxypropylated starch enzyme-decomposed dextrin, carboxymethylated starch, phosphorylated starch and cyclodextrin), pullulan and a pullulan derivative, a roasted starch such as British gum, an enzymatically modified dextrin such as enzyme dextrin and Shardinger dextrin, an oxidized starch such as solubilized starch, a pregelatinized starch such as modified pregelatinized starch and unmodified pregelatinized starch, an esterified starch such as starch phosphate, fatty starch, starch sulfate, starch nitrate, starch xanthate and starch carbamate, an etherified starch such as carboxyalkyl starch, hydroxyalkyl starch, sulfoalkyl starch, cyanoethyl starch, allyl starch, benzyl starch, carbamylethyl starch and dialkylamino starch, a crosslinked starch such as methylol-crosslinked starch, hydroxyalkyl-crosslinked starch, phosphoric acid-crosslinked starch and dicarboxylic acid-crosslinked starch, and a starch graft polymer such as starch polyacrylamide copolymer, starch polyacrylic acid copolymer, starch polyvinyl acetate copolymer, starch polyacrylonitrile copolymer, cationic starch polyacrylic acid ester copolymer, cationic starch vinyl polymer copolymer, starch polystyrene maleic acid copolymer, starch polyethylene oxide copolymer and starch polypropylene copolymer.

The natural polymer compound which can be used as the reducing sugar before applying a chemical treatment is preferably a water-soluble soybean polysaccharide, starches such as starch, gelatin, hemicellulose extracted from soybean, sweet potato starch, potato starch, tapioca starch, wheat starch and corn starch, a polymer obtained from algae, such as carrageenan, laminaran, seaweed mannan, funori, Irish moss, agar and sodium alginate, a plant mucilage such as sunset hibiscus, mannan, quince seed, pectin, tragacanth gum, karaya gum, xanthine gum, guar bean gum, locust bean gum, carob gum and benzoin gum, a bacteria mucilage such as homopolysaccharide (e.g., dextran, glucan, levan) and heteropolysaccharide (e.g., succinoglucan, xanthan gum), or a protein such as glue, gelatin, casein and collagen. Among others, for example, gum arabic, a starch derivative such as dextrin and hydroxypropyl starch, a carboxymethyl cellulose or a soybean polysaccharide can be preferably used.

The specific non-reducing sugar used in the present invention more preferably has a functional group capable of interacting with the support surface. The functional group capable of interacting with the support surface contributes to adsorption of the non-image area to the support surface at the development by interacting with the support surface. The functional group capable of interacting with the support surface includes a group capable of undergoing interaction such as covalent bonding, ion bonding, hydrogen bonding and polar interaction, with a metal, a metal oxide, a hydroxyl group or the like present on the support. Among others, a functional group (adsorbing group) capable of adsorbing to the support surface is preferred.

Whether adsorptivity to the support surface is present or absent can be judged, for example, by the following method.

A test compound is dissolved in a readily-soluble solvent to prepare a coating solution, and the coating solution is coated and dried on a support to have a coating amount of 30 mg/m$^2$ after drying. The support coated with the test compound is thoroughly washed with the readily-soluble solvent and by measuring the residual amount of the test compound unremoved by the washing, the adsorption amount to the support is calculated. Here, the measurement of the residual amount may be direct quantitative determination of the amount of the residual compound or may be calculation after quantitatively determining the amount of the test compound dissolved in the washing solution. The quantitative determination of the compound can be performed, for example, by fluorescent X-ray measurement, reflection spectral absorbance measurement, liquid chromatography measurement, or infrared absorption measurement. The compound having adsorptivity to support is a compound that remains in an amount of 0.1 mg/m$^2$ or more even after performing the above-described washing treatment.

The adsorbing group to the support surface is a functional group capable of causing chemical bonding (such as ion bonding, hydrogen bonding, coordinate bonding and bonding by intermolecular force) with a substance (such as metal and metal oxide) or a functional group (such as hydroxyl group), which is present on the support surface. The adsorbing group is preferably an acid group or a cationic group.

The acid group preferably has an acid dissociation constant (pKa) of 7 or less. Examples of the acid group include a phenolic hydroxyl group, a carboxyl group, —SO$_3$H, —OSO$_3$H, —PO$_3$H$_2$, —OPO$_3$H$_2$, —CONHSO$_2$—, —SO$_2$NHSO$_2$— and —COCH$_2$COCH$_3$. Among these, a phosphoric acid group (—OPO$_3$H$_2$ or —PO$_3$H$_2$) is preferred. The acid group may be in the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and an iodonium group. Among these, an ammonium group, a phosphonium group and a sulfonium group are preferred, an ammonium group and a phosphonium group are more preferred, and an ammonium group is most preferred.

Preferred examples of the functional group capable of adsorbing to the support surface are illustrated below.

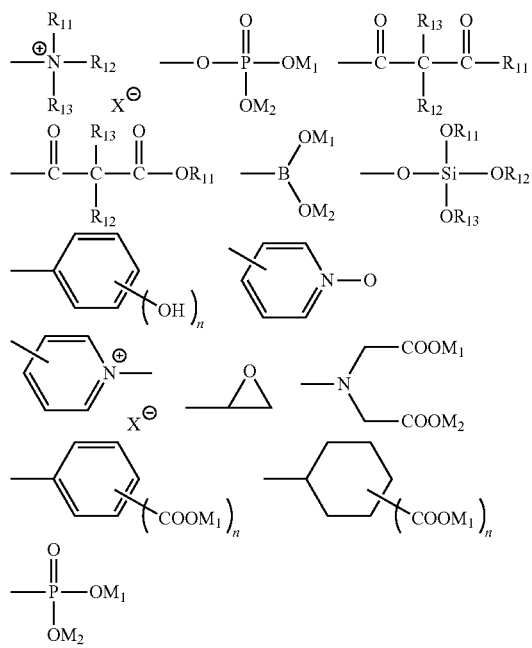

In the formulae, each of $R_{11}$ to $R_{13}$ independently represents a hydrogen atom, an alkyl group, an aryl group, an alkynyl group or an alkenyl group. Each of $M_1$ and $M_2$ independently represents a hydrogen atom, a metal atom or an ammonium group. $X^-$ represents a counter anion. n is an integer of from 1 to 5.

In particular, the adsorbing group is preferably an onium group (such as ammonium group and pyridinium group), a phosphoric ester group or a salt thereof, a phosphonic acid group or a salt thereof, a boric acid group or a salt thereof, or a β-diketone group (such as acetylacetone group), and most preferably a phosphoric acid ester group or a phosphonic acid group.

Specific examples of the specific non-reducing sugar having a functional group capable of interacting with the support surface include a sugar deprived of reducing property by further hydrogenating a phosphoric acid-modified starch after phosphoric acid esterification of a hydroxy group, and a sugar deprived of reducing property by further hydrogenating a starch after octenylsuccinic acid esterification of a hydroxy group.

The specific non-reducing sugar may have a constituent unit having only one functional group capable of interacting with the support surface or a constituent unit having two or more functional groups capable of interacting with the support surface.

The content ratio of the constituent unit having a functional group capable of interacting with the support surface in the specific non-reducing sugar is preferably from 2 to 80 mol %, more preferably from 2 to 70 mol %, still more preferably from 5 to 50 mol %, yet still more preferably from 10 to 40 mol %, based on all constituent units in the specific non-reducing sugar.

It is also preferred that the specific non-reducing sugar has a hydrophilic group other than a hydroxy group. Suitable examples of the hydrophilic group include a carboxyl group, a carboxylate group, a hydroxyethyl group, a hydroxypropyl group, a polyoxyalkylene group such as polyoxyethylene group and polyoxypropylene group, an amino group, an aminoethyl group, an aminopropyl group, an ammonium group, an amido group, a carboxymethyl group, a sulfonic acid group or a salt thereof, and a group having a betaine structure.

In the present invention, the hydrophilic group imparts high hydrophilicity to the non-reducing sugar and contributes to stain prevention of the non-image area.

Above all, the hydrophilic group is preferably a sulfonic acid group (—SO$_3$H) or a salt thereof (—SO$_3$M (wherein M represents a counter cation except for a proton (H$^+$))), an amido group (—CONR— (wherein R represents a hydrogen atom or an organic group)), a polyalkylene oxy group, or a group having a betaine structure. The betaine structure is a structure where the electric charge is neutralized by having both a cation structure and an anion structure in one group. The cation structure in the betaine structure is not particularly limited but is preferably a quaternary nitrogen cation.

The anion structure in the betaine structure is not particularly limited but is preferably —COO$^-$, —SO$_3^-$, —PO$_3^{2-}$ or —PO$_3$H$^-$, more preferably -COO$^-$ or —SO$_3^-$.

The hydrophilic group is more preferably a sulfonic acid group or a salt thereof, or a group having a betaine structure.

Chemical structures preferred as the hydrophilic group are illustrated below, but the present invention is not limited thereto.

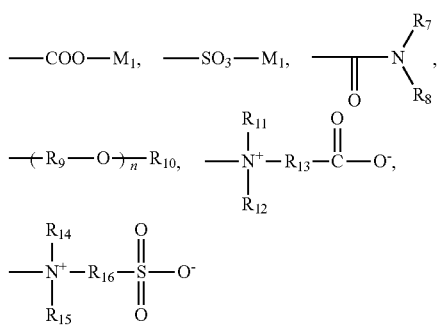

In the formulae, M$_1$ has the same meaning as M$_1$ above.

Each of $R_7$, $R_8$, $R_{11}$, $R_{12}$, $R_{14}$ and $R_{15}$ independently represents a hydrogen atom or a linear or branched alkyl group having a carbon number of 1 to 6. $R_9$ represents a linear or branched alkylene group having a carbon number of 1 to 6 and is preferably an ethylene group. $R_{10}$ represents a hydrogen atom or an alkyl group having a carbon number of 1 to 12. n represents an integer of 1 to 100 and is preferably an integer of 1 to 30. Each of $R_{13}$ and $R_{16}$ independently represents a divalent organic group and represents, for example, a divalent linking group selected from the group consisting of a divalent aliphatic group, a divalent aromatic group and a combination thereof.

The specific non-reducing sugar may have a constituent unit having only one hydrophilic group or a constituent unit having two or more hydrophilic groups. The content ratio of the hydrophilic group-containing constituent unit in the specific non-reducing sugar is preferably form 30 to 98 mol %, more preferably from 40 to 90 mol %, still more preferably from 50 to 90 mol %, based on all constituent units in the sugar.

The developer of the present invention may contain one specific non-reducing sugar alone or two or more specific non-reducing sugars.

The content of the specific non-reducing sugar in the developer of the present invention is preferably from 0.1 to 20 mass %, more preferably from 0.5 to 10 mass %, still more preferably from 1 to 7 mass %. Within this range, a high effect of preventing the non-image area from staining can be more unfailingly obtained.

The mass average molecular weight of the specific non-reducing sugar is preferably 300 or more, more preferably 500 or more, still more preferably 1,000 or more, and is preferably 1,000,000 or less, more preferably 500,000 or less.

From the standpoint that the film-forming property is more excellent and the plate surface can be more successfully protected from scratches, the specific non-reducing sugar is preferably at least one of a disaccharide, an oligosaccharide and a reduced starch saccharification product, more preferably at least one of an oligosaccharide having a molecular weight of 500 or more and a reduced starch saccharification product having a molecular weight of 500 or more, still more preferably a reduced starch saccharification product having a molecular weight of 1,000 or more.

On the other hand, the developer of the present invention preferably contains substantially no reducing sugar (a sugar having a reducing terminal capable of producing an aldehyde group, a ketone group or the like in the developer). More specifically, the content of the reducing sugar in the developer is preferably 1.5 mass % or less, more preferably 1.0 mass % or less, still more preferably less than 0.5%, based on the mass of the developer, and it is yet still more preferred to contain no reducing sugar. In the case where the developer contains a reducing sugar, the content thereof is usually 0.0001 mass % or more based on the mass of the developer.

In the developer of the present invention, a surfactant such as anionic surfactant, cationic surfactant, a nonionic surfactant and zwitterionic surfactant is preferably added. The surfactant is preferably an anionic surfactant, a nonionic surfactant or a zwitterionic surfactant.

The anionic surfactant is not particularly limited but examples thereof include fatty acid salts, abietates, hydroxyalkanesulfonates, alkanesulfonates, dialkylsulfosuccinates, linear alkylbenzenesulfonates, branched alkylbenzenesulfonates, alkylnaphthalenesulfonates, alkyldiphenylether (di)sulfonates, alkylphenoxypolyoxyethylene alkylsulfonates, salts of polyoxyethylene alkylsulfophenyl ether, sodium N-methyl-N-oleyltaurates, monoamide disodium N-alkylsulfosuccinates, petroleum sulfonates, sulfated castor oil, sulfated tallow oil, salts of sulfuric ester of fatty acid alkyl ester, salts of alkylsulfuric ester, salts of sulfuric ester of polyoxyethylene alkyl ether, salts of sulfuric ester of fatty acid monoglyceride, salts of sulfuric ester of polyoxyethylene alkylphenyl ether, salts of sulfuric ester of polyoxyethylene styrylphenyl ether, salts of alkylphosphoric ester, salts of phosphoric ester of polyoxyethylene alkyl ether, salts of phosphoric ester of polyoxyethylene alkylphenyl ether, partially saponified produces of styrene-maleic anhydride copolymer, partially saponified products of olefin-maleic anhydride copolymer, and naphthalene sulfonate formalin condensates. Among these, alkylbenzenesulfonates, alkylnaphthalenesulfonates and alkyldiphenylether (di)sulfonates are preferably used.

The cationic surfactant is not particularly limited and a conventionally known cationic surfactant may be used. Examples thereof include alkylamine salts, quaternary ammonium salts, alkylimidazolinium salts, polyoxyethylene alkylamine salts and polyethylene polyamine derivatives.

The nonionic surfactant is not particularly limited, but examples thereof include a polyethylene glycol-type higher alcohol ethylene oxide adduct, an alkylphenol ethylene oxide adduct, an alkylnaphthol ethylene oxide adduct, a phenol ethylene oxide adduct, a naphthol ethylene oxide adduct, a fatty acid ethylene oxide adduct, a polyhydric alcohol fatty acid ester ethylene oxide adduct, a higher alkylamine ethylene oxide adduct, a fatty acid amide ethylene oxide adduct, a fatty oil ethylene oxide adduct, a polypropylene glycol ethylene oxide adduct, a dimethylsiloxane-ethylene oxide block copolymer, a dimethylsiloxane-(propylene oxide-ethylene oxide) block copolymer, a fatty acid ester of polyhydric alcohol-type glycerol, a fatty acid ester of pentaerythritol, a fatty acid ester of sorbitol or sorbitan, a fatty acid ester of sucrose, an alkyl ether of polyhydric alcohol, and a fatty acid amide of alkanolamines. Among these, those having an aromatic ring and an ethylene oxide chain are preferred, and an alkyl-substituted or unsubstituted phenol ethylene oxide adduct and an alkyl-substituted or unsubstituted naphthol ethylene oxide adduct are more preferred.

The zwitterionic surfactant is not particularly limited but includes an amine oxide type such as alkyldimethylamine oxide, a betaine type such as alkylbetaine, and an amino acid type such as alkylamino-fatty acid sodium salt.

In particular, an alkyldimethylamine oxide which may have a substituent, an alkylcarboxybetaine which may have a substituent, and an alkylsulfobetaine which may have a substituent, are preferably used. As for specific examples thereof, a compound represented by formula (2) in paragraph [0256] of JP-A-2008-203359, compounds represented by formulae (I), (II) and (VI) in paragraph [0028] of JP-A-2008-276166, and compounds illustrated in paragraphs [0022] to [0029] of JP-A-2009-47927 may be used.

Two or more kinds of surfactants may be used, and the proportion of the surfactant in the developer is preferably from 0.01 to 20 mass %, more preferably from 0.1 to 10 mass %.

The developer used in the present invention preferably further contains a pH buffer.

As the pH buffer for use in the present invention, a buffer exhibiting a buffering action at pH of 6 to 14 can be used without any particular limitation. Examples of the weakly alkaline (pH: 6 to 11) buffer include (a) a carbonate ion and a hydrogencarbonate ion, (b) a borate ion, (c) a water-soluble amine compound and an ion of the amine compound, and a combination thereof. That is, for example, (a) a combination of a carbonate ion and a hydrogencarbonate ion, (b) a borate ion, or (c) a combination of a water-soluble amine compound and an ion of the amine compound exhibits a pH buffering action in the developer, so that the pH can be prevented from fluctuation even when the developer is used for a long period of time and in turn, deterioration of developability, generation of development scum, and the like, which are attributable to fluctuation of pH, can be suppressed. Above all, a combination of a carbonate ion and a hydrogencarbonate ion, or a combination of a water-soluble amine compound and an ion of the amine compound is preferred.

As the buffer that exerts the buffering action at a high pH exceeding pH 11, (d) an alkali metal silicate such as sodium silicate and/or an alkaline earth metal silicate, can be used. Either one of these may be used, or both may be used in combination.

For allowing (a) a carbonate ion and a hydrogencarbonate ion to be present in the developer, a carbonate and a hydrogencarbonate may be added to the developer, or a carbonate ion and a hydrogencarbonate ion may be generated by adjusting the pH after the addition of a carbonate or a hydrogencarbonate. The carbonate and hydrogencarbonate are not particularly limited and are preferably an alkali metal salt. The alkali metal includes lithium, sodium and potassium, with sodium being preferred. One of these may be used alone, or two or more thereof may be used in combination.

For allowing (b) a borate ion to be present in the developer, a boric acid or a borate is added to the developer and then, the pH is adjusted with an alkali or by using an alkali and an acid, whereby an appropriate amount of borate ion is generated.

The boric acid or borate used here is not particularly limited, but examples of the boric acid include orthoboric acid, metaboric acid, and tetraboric acid, with orthoboric acid and tetraboric acid being preferred. The borate includes an alkali metal salt and an alkaline earth metal salt, and examples thereof include orthoborate, diborate, metaborate, tetraborate, pentaborate, and octaborate. Among these, orthoborate and tetraborate, particularly an alkali metal tetraborate, are preferred. Preferred examples of the tetraborate include sodium tetraborate, potassium tetraborate and lithium tetraborate, with sodium tetraborate being preferred. Two or more borates may be used in combination.

Above all, the boric acid or borate used in the present invention is preferably orthoboric acid, tetraboric acid, or sodium tetraborate. In the developer, a boric acid and a borate may be used in combination.

An ion of (c) a water-soluble amine compound can be generated in an aqueous solution of a water-soluble amine compound, and an alkali or an acid may be further added to the aqueous solution of a water-soluble amine compound or may be incorporated into the aqueous solution by adding a compound that is originally in a salt form of an amine compound.

The water-soluble amine compound is not particularly limited but is preferably a water-soluble amine compound having a group capable of promoting water solubility. Examples of the group capable of promoting water solubility include a carboxylic acid group, a sulfonic acid group, a sulfinic acid group, a phosphonic acid group, and a hydroxyl group. The water-soluble amine compound may contain a plurality of these groups.

In the case of promoting water solubility of the amine compound by a carboxylic acid group, a sulfonic acid group, a sulfinic acid group, or a phosphonic acid group, the amine compound corresponds to an amino acid. An amino acid is in the equilibrium state in an aqueous solution, and when the acid group is, for example, a carboxylic acid group, the equilibrium state is expressed as shown below. The amino acid as used in the present invention means state B below, and the ion of amino acid means state C. The counter ion in state C is preferably sodium ion or potassium ion.

(For example, each of $R_1$ and $R_2$ independently represents a hydrogen atom, an alkyl group, an aryl group or the like, and R represents a linking group.)

Specific examples of the water-soluble amine compound having a carboxylic acid group, a sulfonic acid group or a sulfinic acid group include an amino acid such as glycine, iminodiacetic acid, lysine, threonine, serine, aspartic acid, parahydroxyphenylglycine, dihydroxyethylglycine, alanine, anthranilic acid and tryptophan; a fatty acid aminesulfonic acid such as sulfamic acid, cyclohexylsulfamic acid and taurine; and a fatty acid aminesulfinic acid such as aminoethanesulfinic acid. Among these, glycine and iminodiacetic acid are preferred.

Specific examples of the water-soluble amine compound having a phosphonic acid group (including a phosphinic acid group) include 2-aminoethylphosphonic acid, 1-aminoethane-1,1-diphosphonic acid, 1-amino-1-phenylmethane-1,1-diphosphonic acid, 1-dimethylaminoethane-1,1-diphosphonic acid, and ethylenediaminopentamethylenephosphonic acid, with 2-aminoethylphosphonic acid being preferred.

The water-soluble amine compound having a hydroxyl group as the group capable of promoting water solubility means an alkylamine having a hydroxyl group on the alkyl group (state B below), and the ion thereof means an ammonium ion of the amino group (state A below).

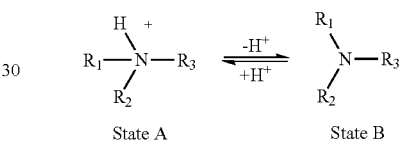

State A      State B (For example, each of $R_1$, $R_2$ and $R_3$ independently represents a hydrogen atom, an alkyl group, an aryl group or the like, and at least one member thereof is an alkyl group having a hydroxyl group.)

Specific examples of the water-soluble amine compound having a hydroxyl group include monoethanolamine, diethanolamine, trimethanolamine, triethanolamine, tripropanolamine, and triisopropanolamine. Among these, triethanolamine and diethanolamine are preferred. The counter ion of ammonium ion is preferably chloride ion.

The water-soluble amine compound and the ion of the amine compound are not particularly limited, but a water-soluble amine compound selected from monoethanolamine, diethanolamine, triethanolamine, N-hydroxyethylmorpholine and 4-dimethylaminopyridine, and an ion of the amine compound are preferred. One of these may be used alone, or two or more thereof may be used in combination.

Examples of the alkali which can be used to adjust the pH include sodium hydroxide, potassium hydroxide, lithium hydroxide, sodium carbonate, potassium carbonate, ammonium carbonate, sodium hydrogencarbonate, potassium

[Chem. 4]

(Equilibrium State of Amino Acid (when the acid group is carboxylic acid))

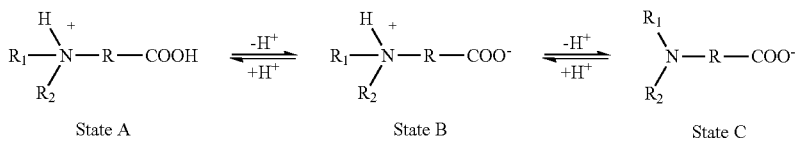

State A      State B      State C hydrogencarbonate, ammonium hydrogencarbonate, an organic alkali agent, and a combination thereof. Also, the acid which can be used includes an inorganic acid such as hydrochloric acid, sulfuric acid and nitric acid. By adding such an alkali or an acid, the pH can be finely adjusted.

In the case where (a) a combination of a carbonate ion and a hydrogencarbonate ion is employed as the pH buffer, the total amount of a carbonate ion and a hydrogencarbonate ion is preferably from 0.05 to 5 mol/L, more preferably from 0.07 to 2 mol/L, still more preferably from 0.1 to 1 mol/L, based on the entire mass of the developer. When the total amount is 0.05 mol/L or more, the developability and processing capacity are less likely to be impaired, whereas when it is 5 mol/L or less, a precipitate or a crystal is hardly produced and furthermore, neutralization in the wastewater treatment of developer scarcely involves gelling, as a result, the wastewater treatment is less likely to be hindered.

In the case where (b) a borate ion is employed as the pH buffer, the total amount of the borate ion is preferably from 0.05 to 5 mol/L, more preferably from 0.1 to 2 mol/L, still more preferably from 0.2 to 1 mol/L, based on the entire mass of the developer. When the total amount of the borate is 0.05 mol/L or more, the developability and processing capacity are less likely to be impaired, whereas when it is 5 mol/L or less, a precipitate or a crystal is hardly produced and furthermore, neutralization in the wastewater treatment of developer scarcely involves gelling, as a result, the wastewater treatment is less likely to be hindered.

In the case where (c) a water-soluble amine compound and an ion of the amine compound are employed as the pH buffer, the total amount of a water-soluble amine compound and an ion of the amine compound is preferably from 0.005 to 5 mol/L, more preferably from 0.01 to 2 mol/L, still more preferably from 0.01 to 1 mol/L, based on the entire mass of the developer. When the total amount of a water-soluble amine compound and an ion of the amine compound is in this range, the developability and processing capacity are not impaired and on the other hand, the wastewater treatment is facilitated.

In the case where (d) at least either one of an alkali metal silicate and an alkaline earth metal silicate is employed as the pH buffer, the total amount of at least either one of an alkali metal silicate and an alkaline earth metal silicate is preferably from 0.005 to 5 mol/L, more preferably from 0.01 to 2 mol/L, still more preferably from 0.01 to 1 mol/L, based on the entire mass of the developer.

The developer of the present invention may contain an organic solvent. Examples of the organic solvent which may be contained include aliphatic hydrocarbons (e.g. hexane, heptane, "Isopar E, H, G" (Exxon Chemical Co., Ltd.), gasoline, kerosene), aromatic hydrocarbons (e.g. toluene, xylene), a halogenated hydrocarbon (e.g. methylene dichloride, ethylene dichloride, triclene, monochlorobenzene), and a polar solvent. Examples of the polar solvent include alcohols (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol, methylamyl alcohol), ketones (e.g., acetone, methyl ethyl ketone, ethyl butyl ketone, methyl isobutyl ketone, cyclohexanone), esters (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate, butyl levulinate), and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide, N-methylpyrrolidone).

As for the organic solvent contained in the developer, two or more organic solvents may be used in combination.

Also, when the organic solvent is insoluble in water, the solvent may be solubilized in water by using a surfactant or the like and then used. In the case of incorporating an organic solvent into the developer, in view of safety and inflammability, the solvent is desirably in a concentration of less than 40 mass %. The concentration is preferably less than 10 mass %, more preferably less than 5 mass %.

In addition to those described above, the developer may contain an antiseptic, a chelating compound, a defoaming agent, an organic acid, an inorganic acid, an inorganic salt, and the like. Specifically, compounds described in paragraphs [0266] to [0270] of JP-A-2007-206217 may be preferably used.

The developer can be used as a development replenisher, if desired, and is preferably applied to the later-described automatic development processor. In the case of performing the development by using an automatic processor, the developer becomes fatigued in accordance with the processing amount and therefore, the processing ability may be restored by using a replenisher or a fresh developer.

<Manufacturing Method of Lithographic Printing Plate>

The lithographic printing plate precursor is exposed to a laser through a transparent original having a line image, a halftone dot image or the like or is imagewise exposed by scanning a laser beam based on digital data.

As for the preferred wavelength of the light source, a wavelength of 300 to 450 nm or a wavelength of 750 to 1,400 nm is preferably used. In the case of 300 to 450 nm, a lithographic printing plate precursor containing, in the photosensitive layer, a sensitizing dye having an absorption maximum in the region above is used, and in the case of 750 to 1,400 nm, a lithographic printing plate precursor containing an infrared absorber which is a sensitizing dye having absorption in that region is used. The light source of 300 to 450 nm is suitably a semiconductor laser. The light source of 750 to 1,400 nm is suitably a solid laser or semiconductor laser capable of emitting an infrared ray. The exposure mechanism may be any of an internal drum system, an external drum system, a flat bed system and the like.

In the present invention, the lithographic printing plate precursor is imagewise exposed as above and then subjected to development processing by using the developer of the present invention, whereby a lithographic printing plate is manufactured.

The specific non-reducing sugar contained in the developer of the present invention has an excellent film-forming ability, so that development and gum solution treatment can be performed at the same time.

Also, when the developer is a developer at a pH of 6 to 11, a post-water washing step is not particularly required and after performing development and gum solution treatment with one solution, a drying step can be performed. Alternatively, the lithographic printing plate can be immediately set on a printing machine and used for printing. Furthermore, a pre-water washing step is also not particularly required, and removal of the protective layer can be performed simultaneously with development and gum solution treatment. Incidentally, after development and gum treatment, it is preferred to remove the excess developer by using a squeeze roller and then perform drying.

In the case where the developer is an alkali developer at a pH of more than 11 to 14, the protective layer may be removed in a pre-water washing step, if desired. After performing development with the developer of the present invention, the alkali may be removed by water washing in a post-water washing step, if desired. Also, a gum solution treatment may be performed, if desired, and the plate may be dried in a drying step, if desired.

One preferred embodiment of the method for manufacturing a lithographic printing plate according to the present invention is characterized by not containing a water washing step. Here, "not containing a water washing step" means to contain absolutely no water washing step between an image exposure step of the lithographic printing plate precursor and completion of the manufacture of a lithographic printing plate through a development processing step. That is, according to this embodiment, a lithographic printing plate is manufactured without performing a water washing step not only between an image exposure step and a development processing step but also after the development processing step. The lithographic printing plate manufactured can be directly used for printing.

In the present invention, development of the lithographic printing plate precursor is performed according to a conventional method at a temperature of generally from 0 to 60° C., preferably on the order of 15 to 40° C., for example, by a method of dipping the exposed lithographic printing plate precursor in the developer and rubbing the plate with a brush, or a method of spraying the developer and rubbing the plate with a brush. Such processing in an automatic developing machine is advantageously unburdened by dealing with development scum derived from the protective layer/image recording layer, which is generated in the case of on-press development.

In addition, as for the plate-making process, the entire surface of the plate may be heated before exposure, during exposure, or between exposure and development, if desired. By the heating, the image-forming reaction in the image recording layer is accelerated, which produces an advantage such as enhancement of sensitivity and press life and stabilization of the sensitivity. Furthermore, for the purpose of enhancing the image strength/press life, it is also effective to perform entire post-heating or entire exposure of the image after development. Usually, the heating before development is preferably performed under a mild condition of 150° C. or less. If the temperature is too high, there may arise a problem, for example, that the unexposed area is cured. The heating after development utilizes a very harsh condition, and the heating temperature is usually from 100 to 500° C. If the temperature is low, a sufficient effect of strengthening the image may not be obtained, whereas if it is excessively high, a problem such as deterioration of the support and thermal decomposition of the image area may arise.

The development processing with the developer of the present invention can be suitably performed by an automatic development processor equipped with developer supply means and a rubbing member. An automatic development processor using a rotating brush roller as the rubbing member is particularly preferred.

The automatic development processor is preferably further equipped with means for removing the excess developer, such as squeeze roller, or drying means such as hot air apparatus, after the development processing means.

One example of the automatic development processor used in the method for manufacturing a lithographic printing plate of the present invention is briefly described below by referring to FIG. 1.

The automatic development processor 100 shown in FIG. 1 comprises a chamber having an outer shape formed by a machine frame 202 and has a pre-heating unit 200, a developing unit 300 and a drying unit 400 continuously formed along the transport direction (arrow A) of a transport path 11 for a lithographic printing plate precursor.

The pre-heating unit 200 comprises a heating chamber 208 having a transport inlet 212 and a transport outlet 218, and a skewer roller 210, a heater 214 and a circulation fan 216 are disposed in the inside thereof.

The developing unit 300 is separated from the pre-heating unit 200 by an outer panel 310, and a slit-like insertion opening 312 is provided in the outer panel 310.

In the inside of the developing unit 300, a processing tank 306 having a developing tank 308 filled with a developer and an insertion roller pair 304 for guiding the lithographic printing plate precursor into the inside of the processing tank 306 are provided. The top of the developing tank 308 is covered with a shielding cover 324.

In the inside of the developing tank 308, a guide roller 344, a guide member 342, a submerged roller pair 316, a brush roller pair 322, a brush roller pair 326 and a carrying-out roller pair 318 are provided in order from the upstream side in the transport direction. The lithographic printing plate precursor transported into the inside of the developing tank 308 is dipped in the developer, and the non-image area is removed in the course of passing between the rotating brush roller pairs 322 and 326.

A spray pipe 330 is provided under the brush roller pairs 322 and 326. The spray pipe 330 is connected to a pump (not shown), so that the developer in the developing tank 308 sucked by the pump can be ejected from the spray pipe 330 into the developing tank 308.

On a sidewall of the developing tank 308, an overflow opening 51 is provided to form a top edge of a first circulation pipeline C1, and the excess developer flows in the overflow opening 51, passes through the first circulation pipeline C1 and is discharged into an external tank 50 provided outside the developing unit 300.

A second circulation pipeline C2 is connected to the external tank 50, and a filter unit 54 and a developer supply pump 55 are provided in the second circulation pipeline C2. The developer is supplied from the external tank 50 to the developing tank 308 by the developer supply pump 55. Also, level meters 52 and 53 are provided in the external tank 50.

The developing tank 308 is connected to a replenishing water tank 71 through a third circulation pipeline C3. A water-replenishing pump 72 is provided in the third circulation pipeline C3, and water pooled in the replenishing water tank 71 is supplied to the developing tank 308 by the water-replenishing pump 72.

A liquid temperature sensor 336 is disposed on the upstream side of the submerged roller pair 316, and a liquid level meter 338 is disposed on the upstream side of the carrying-out roller pair 318.

In a partition board 332 disposed between the developing unit 300 and the drying unit 400, a slit-like insertion opening 334 is provided. Also, a shutter (not shown) is provided in the passage between the developing unit 300 and the drying unit 400, and the passage is closed by the shutter when the lithographic printing plate precursor 11 is not passing through the passage.

In the drying unit 400, a support roller 402, ducts 410 and 412, a transport roller pair 406, ducts 410 and 412, and a transport roller pair 408 are provided in this order. A slit hole 414 is provided at the tip of each of the ducts 410 and 412. Also, in the drying unit 400, drying means (not shown) such as hot air supply means and heat generating means is provided. A discharge port 404 is provided in the drying unit 400, and the lithographic printing plate dried by the drying means is discharged from the discharge port 404.

Figure 2:
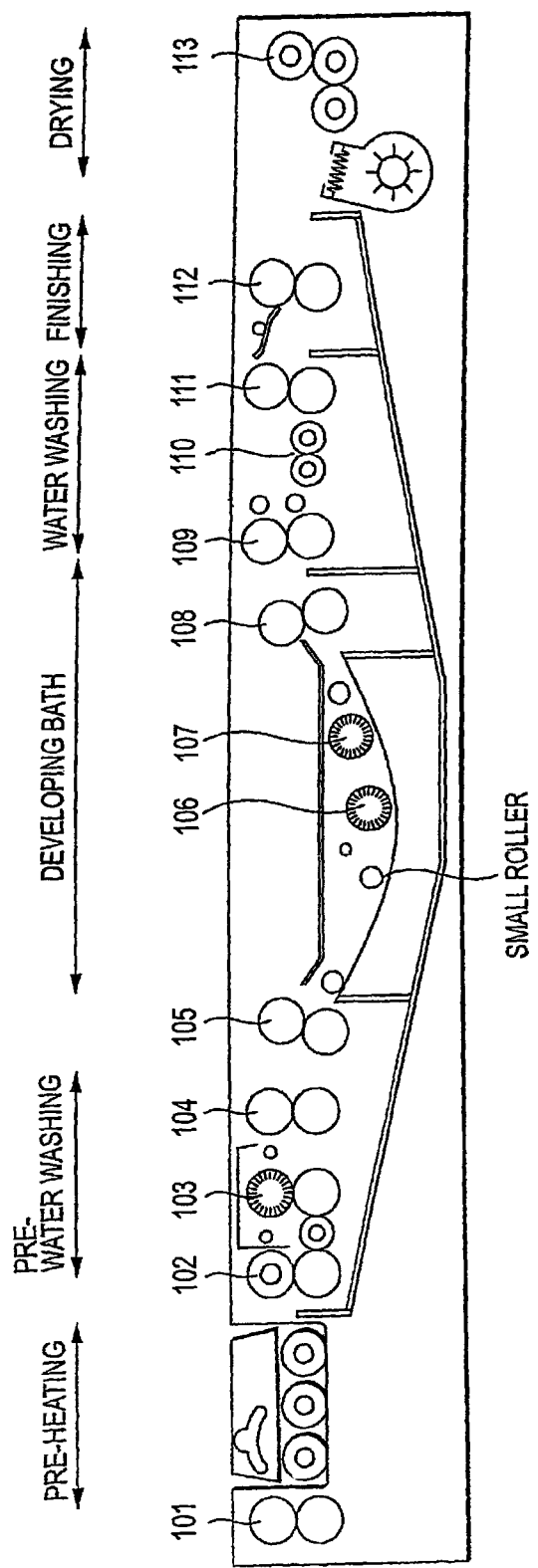
[FIG. 2] A schematic cross-sectional view of the automatic developing processor in another embodiment of the method for manufacturing a lithographic printing plate of the present invention.

Another example of the automatic development processor used in the method for manufacturing a lithographic printing plate of the present invention is briefly described below by referring to FIG. 2. Similarly to FIG. 1, the automatic development processor shown in FIG. 2 comprises a chamber having an outer shape formed by a machine frame and has a pre-heating unit, a pre-water washing unit, a developing bath (developing unit), a water washing unit, a finisher unit and a drying unit, which are continuously formed along the transport direction for a lithographic printing plate precursor.

The pre-heating unit comprises a heating chamber having a transport inlet and a transport outlet, and a transport roller pair 101, a heater and a circulation fan are disposed in the inside thereof.

In the inside of the pre-water washing unit, a transport roller pair 102, two spray pipes for water washing, a rotating brush roller 103, and a transport roller pair 104 for nipping the washing water are disposed.

In the inside of the developing bath, a processing tank having a developing tank filled with a developer and an insertion roller pair 105 for guiding the lithographic printing plate precursor into the inside of the processing tank are provided. The top of the developing tank is covered with a shielding cover.

In the inside of the developing tank, a submerged roller pair, a brush roller pair 106, a brush roller pair 107 and a carrying-out roller pair 108 are provided in order from the upstream side in the transport direction. The lithographic printing plate precursor transported into the inside of the developing tank is dipped in the developer, and the non-image area is removed in the course of passing between the rotating brush roller pairs 106 and 107.

A liquid temperature sensor is disposed on the upstream side of the submerged roller pair, and a liquid level meter is disposed on the upstream side of the carrying-out roller pair.

In a partition board disposed between the developing bath and the water washing unit, a slit-like insertion opening is provided.

In the water washing unit, a transport roller pair 109, two spray pipes for water washing, a receiving roller 110, and a transport roller pair 111 are disposed.

In a partition board disposed between the water washing unit and the finisher unit, a slit-like insertion opening is provided.

In the finisher unit, a pipe for jetting a finisher solution, a guide for applying a finisher solution onto a transport roller, and a transport roller pair 112 are disposed.

In the drying unit, drying means (not shown) such as hot air supply means and heat generating means, a hot air fan, a support roller, and a transport roller pair 113 are provided in this order. A discharge port is provided in the drying unit, and the lithographic printing plate dried by the drying means is discharged from the discharge port.

The image forming system of the lithographic printing plate precursor processed by the developer of the present invention may be either a negative type or a positive type.

A negative lithographic printing plate precursor and a positive lithographic printing plate precursor are described below.

[Negative Lithographic Printing Plate Precursor]

The negative lithographic printing plate precursor has a photosensitive layer on a hydrophilic support and preferably further has a protective layer. It is also preferred to provide an undercoat layer on the support.

The photosensitive layer (sometimes referred to as image recording layer) preferably contains a polymerization initiator, a polymerizable compound and a binder polymer, and it is also preferred to further contain a sensitizing dye and a chain transfer agent.

(a) Sensitizing Dye

The photosensitive layer of the present invention preferably contains a sensitizing dye. The sensitizing dye can be used without any particular limitation as far as it enters an excited state by absorbing light upon image exposure and provides energy to the later-described polymerization initiator by way of electron transfer, energy transfer, heat generation or the like to thereby enhance the polymerization initiation function. In particular, a sensitizing dye having an absorption maximum at 300 to 450 nm or at 750 to 1,400 nm is preferably used.

Examples of the sensitizing dye having an absorption maximum in the wavelength region of 300 to 450 nm include merocyanine dyes, benzopyranes, coumarins, aromatic ketones, anthracenes, styryls and oxazoles.

Out of sensitizing dyes having an absorption maximum in the wavelength region of 300 to 450 nm, the dye preferred in view of high sensitivity is a dye represented by the following formula (IX):

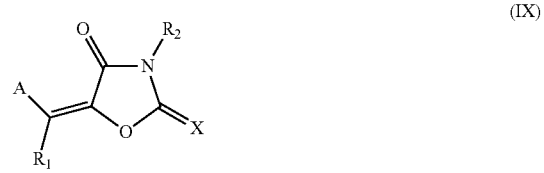

(IX)

(In formula (IX), A represents an aryl or heteroaryl group which may have a substituent, X represents an oxygen atom, a sulfur atom or N—($R_3$), each of $R_1$, $R_2$ and $R_3$ independently represents a monovalent nonmetallic atomic group, and the pair of A and $R_1$ or the pair of $R_2$ and $R_3$ may be combine with each other to form an aliphatic or aromatic ring.)

Formula (IX) is described in more detail. Each of $R_1$, $R_2$ and $R_3$ is independently a monovalent nonmetallic atomic group, preferably a hydrogen atom, a substituted or unsubstituted alkyl group, a substituted or unsubstituted alkenyl group, a substituted or unsubstituted aryl group, a substituted or unsubstituted heteroaryl residue, a substituted or unsubstituted alkoxy group, a substituted or unsubstituted alkylthio group, a hydroxyl group, or a halogen atom.

A in formula (IX) is described below. A represents an aryl or heteroaryl group which may have a substituent. Examples of the aryl or heteroaryl group which may have a substituent are the same as those of the substituted or unsubstituted aryl group and the substituted or unsubstituted aromatic heterocyclic residue described for $R_1$, $R_2$ and $R_3$ in formula (IX).

As for specific examples of such a sensitizing dye, compounds described in paragraphs [0047] to [0053] of JP-A-2007-58170, paragraphs [0036] and [0037] of JP-A-2007-93866 and paragraphs [0042] to [0047] of JP-A-2007-72816 are preferably used.

In addition, sensitizing dyes described in JP-A-2006-189604, JP-A-2007-171406, JP-A-2007-206216, JP-A-

2007-206217, JP-A-2007-225701, JP-A-2007-225702, JPA-2007-316582 and JP-A-2007-328243 may be also preferably used.

The sensitizing dye having an absorption maximum at 750 to 1,400 nm (hereinafter, sometimes referred to as "infrared absorber"), which is preferably used in the present invention, is described below. As the infrared absorber, a dye or a pigment is preferably used.

As for the dye, commercially available dyes and known dyes described in literatures such as *Senryo Binran* (*Dye Handbook*), compiled by The Society of Synthetic Organic Chemistry, Japan (1970) can be used. Specific examples of the dye includes an azo dye, a metal complex salt azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt, and a metal thiolate complex.

Among these dyes, a cyanine dye, a squarylium dye, a pyrylium salt, a nickel thiolate complex, and an indolenine cyanine dye are preferred, and a cyanine dye and an indolenine cyanine dye are more preferred. A particularly preferred example is a cyanine dye represented by the following formula (a):

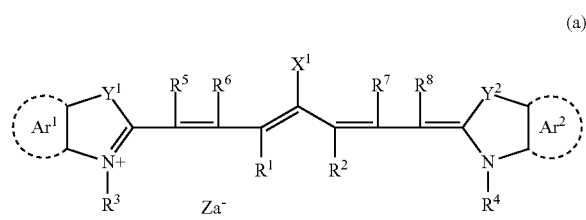

(a)

In formula (a), $X^1$ represents a hydrogen atom, a halogen atom, —$NPh_2$, —$X^2$-L or a group shown below, wherein $X^2$ represents an oxygen atom, a nitrogen atom or a sulfur atom, and L represents a hydrocarbon group having a carbon number of 1 to 12, an aryl group containing a heteroatom (N, S, O, halogen atom or Se), or a hydrocarbon group having a carbon number of 1 to 12 and containing a heteroatom. $X_a^-$ has the same meaning as $Z_a^-$ described later. $R^a$ represents a hydrogen atom or a substituent selected from an alkyl group, an aryl group, a substituted or unsubstituted amino group and a halogen atom.

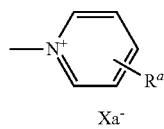

Each of $R^1$ and $R^2$ independently represents a hydrocarbon group having a carbon number of 1 to 12. In view of storage stability of the coating solution for photosensitive layer, $R^1$ and $R^2$ are preferably a hydrocarbon group having a carbon number of 2 or more. Also, $R^1$ and $R^2$ may combine with each other to form a ring, and in the case of forming a ring, it is particularly preferred to form a 5-membered ring or a 6-membered ring.

$Ar^1$ and $Ar^2$, which may be the same or different, each represents an aryl group which may have a substituent. Preferred examples of the aryl group include a benzene ring and a naphthalene ring. Preferred examples of the substituent include a hydrocarbon group having a carbon number of 12 or less, a halogen atom, and an alkoxy group having a carbon number of 12 or less. $Y^1$ and $Y^2$, which may be the same or different, each represents a sulfur atom or a dialkylmethylene group having a carbon number of 12 or less. $R^3$ and $R^4$, which may be the same or different, each represents a hydrocarbon group having a carbon number of 20 or less, which may have a substituent. Preferred substituents include an alkoxy group having a carbon number of 12 or less, a carboxyl group and a sulfo group. $R^5$, $R^6$, $R^7$ and $R^8$, which may be the same or different, each represents a hydrogen atom or a hydrocarbon group having a carbon number of 12 or less. From the standpoint of availability of raw materials, a hydrogen atom is preferred. $Za^-$ represents a counter anion. However, when the cyanine dye represented by formula (a) has an anionic substituent in the structure thereof and charge neutralization is not required, $Za^-$ is not necessary. In view of storage stability of the coating solution for photosensitive layer, $Za^-$ is preferably a halide ion, a perchlorate ion, a tetrafluoroborate ion, a hexafluorophosphate ion or a sulfonate ion, more preferably a perchlorate ion, a hexafluorophosphate ion or an arylsulfonate ion.

Specific examples of the cyanine dye represented by formula (a) which can be suitably used include compounds described in paragraphs [0017] to [0019] of JP-A-2001-133969, paragraphs [0016] to [0021] of JP-A-2002-023360 and paragraphs [0012] to [0037] of JP-A-2002-040638. Compounds described in paragraphs [0034] to [0041] of JP-A-2002-278057 and paragraphs [0080] to [0086] of JP-A-2008-195018 are preferred, and compounds described in paragraphs [0035] to [0043] of JP-A-2007-90850 are most preferred.

Also, compounds described in paragraphs [0008] and [0009] of JP-A-5-5005 and paragraphs [0022] to [0025] of JP-A-2001-222101 may be preferably used.

One of these infrared absorbing dyes may be used alone, or two or more thereof may be used in combination. Also, an infrared absorber other than the infrared absorbing dye such as pigment may be used in combination. As the pigment, compounds described in paragraphs [0072] to [0076] of JP-A-2008-195018 are preferred.

The amount of the sensitizing dye added is preferably from 0.05 to 30 parts by mass, more preferably from 0.1 to 20 parts by mass, and most preferably from 0.2 to 10 parts by mass, per 100 parts by mass of the entire solid content of the photosensitive layer.

(b) Polymerization Initiator

The photosensitive layer of the present invention contains a polymerization initiator (hereinafter, sometimes referred to as "initiator compound"). In the present invention, a radical polymerization initiator is preferably used.

As the initiator compound for use in the present invention, those known to one skilled in the art can be used without limitation. Specific examples of the initiator compound include a trihalomethyl compound, a carbonyl compound, an organic peroxide, an azo-based compound, an azide compound, a metallocene compound, a hexaarylbiimidazole compound, an organic boron compound, a disulfone compound, an oxime ester compound, an onium salt, and an iron arene complex. Among these, at least one compound selected from a hexaarylbiimidazole compound, an onium salt, a trihalomethyl compound and a metallocene compound is preferred, and a hexaarylbiimidazole compound is more preferred. Two or more of these polymerization initiators may be appropriately used in combination.

Examples of the hexaarylbiimidazole-based compound include lophine dimers described in European Patents 24,629 and 107,792 and U.S. Pat. No. 4,410,621, such as 2,2'-bis(o- chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

In particular, the hexaarylbiimidazole-based compound is preferably used in combination with a sensitizing dye having an absorption maximum at 300 to 450 nm.

The onium salt suitably used in the present invention is preferably a sulfonium salt, an iodonium salt or a diazonium salt, more preferably a diaryliodonium salt or a triarylsulfonium salt. In particular, the onium salt is preferably used in combination with an infrared absorber having an absorption maximum at 750 to 1,400 nm.

Other polymerization initiators which can be preferably used include polymerization initiators described in paragraphs [0071] to [0129] of JP-A-2007-206217.

One of the polymerization initiators suitable for the present invention may be used alone, or two or more thereof may be used in combination.

In the present invention, the amount of the polymerization initiator used in the photosensitive layer is preferably from 0.01 to 20 mass %, more preferably from 0.1 to 15 mass %, still more preferably from 1.0 to 10 mass %, based on the mass of all solid contents in the photosensitive layer.

(c) Polymerizable Compound

In the present invention, the polymerizable compound for use in the photosensitive layer is an addition-polymerizable compound having at least one ethylenically unsaturated double bond and is selected from compounds having at least one, preferably two or more, terminal ethylenically unsaturated double bonds. Such a compound has a chemical form such as monomer, prepolymer (that is, dimer, trimer or oligomer) or a mixture thereof. Examples of the monomer include an unsaturated carboxylic acid (such as acrylic acid, methacrylic acid, itaconic acid, crotonic acid, isocrotonic acid and maleic acid), and esters or amides thereof. Preferably, esters of an unsaturated carboxylic acid with a polyhydric alcohol compound, and amides of an unsaturated carboxylic acid with a polyvalent amine compound are used. Also, for example, an addition reaction product of unsaturated carboxylic acid esters or amides having a nucleophilic substituent such as hydroxyl group, amino group and mercapto group, with monofunctional or polyfunctional isocyanates or epoxies, and a dehydration condensation reaction product with a monofunctional or polyfunctional carboxylic acid are preferably used. Furthermore, an addition reaction product of unsaturated carboxylic acid esters or amides having an electrophilic substituent such as isocyanate group and epoxy group, with monofunctional or polyfunctional alcohols, amines or thiols, and a displacement reaction product of unsaturated carboxylic acid esters or amides having a leaving substituent such as halogen group and tosyloxy group, with monofunctional or polyfunctional alcohols, amines or thiols are also preferred. As another example, compounds in which the above-described unsaturated carboxylic acid is replaced by an unsaturated phosphonic acid, styrene, vinyl ether or the like can be also used. These are described in references including JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer that is an ester of a polyhydric alcohol compound with an unsaturated carboxylic acid include, as an acrylic acid ester, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate, and polyester acrylate oligomer; and as a methacrylic acid ester, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis[p-(methacryloxyethoxy)phenyl]dimethylmethane. Specific examples of the monomer that is an amide of a polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriamine trisacrylamide, xylylenebisacrylamide, and xylylenebismethacrylamide.

A urethane-based addition-polymerizable compound produced using an addition reaction between an isocyanate and a hydroxy group is also preferred, and specific examples thereof include a vinyl urethane compound having two or more polymerizable vinyl groups per molecule obtained by adding a hydroxy group-containing vinyl monomer represented by the following formula (A) to a polyisocyanate compound having two or more isocyanate groups per molecule, described in JP-B-48-41708 (the term "JP-B" as used herein means an "examined Japanese patent publication"):

$$CH_2=C(R_4)COOCH_2CH(R_5)OH \quad (A)$$

(wherein each of $R_4$ and $R_5$ represents H or $CH_3$).

In addition, urethane acrylates described in JP-A-51-37193, JP-B-2-32293, JP-B-2-16765, JP-A-2003-344997 and JP-A-2006-65210, urethane compounds having an ethylene oxide-based skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are also preferred.

A photo-oxidizable polymerizable compound described in JP-T-2007-506125 is also preferred and above all, a polymerizable compound containing at least one urea group and/or tertiary amino group is preferred. Specifically, the polymerizable compound includes the following compound.

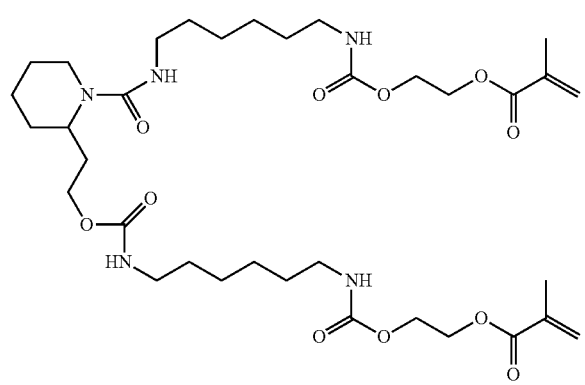 [SMILES: C=C(C)C(=O)OCCOC(=O)NCCCCCCNC(=O)OCCC1CCCCN1C(=O)NCCCCCCNC(=O)OCCOC(=O)C(=C)C]

Details of the use method for the polymerizable compound, such as structure, individual or combination use and amount added, can be arbitrarily determined in accordance with the performance design of the final lithographic printing plate precursor. The polymerizable compound is used in a range of preferably from 5 to 75 mass %, more preferably from 25 to 70 mass %, still more preferably from 30 to 60 mass %, based on the entire solid content of the photosensitive layer.

(d) Binder Polymer

In the present invention, the photosensitive layer contains a binder polymer. As the binder polymer, a polymer capable of loading photosensitive layer components on a support and removable with the developer of the present invention is used. For example, (meth)acrylic polymer, a polyurethane, a polyvinyl alcohol, a polyvinylbutyral, a polyvinylformal, a polyamide, a polyester or an epoxy resin is used as the binder polymer. In particular, a (meth)acrylic polymer, a polyurethane or a polyvinylbutyral is preferably used.

In the present invention, the "(meth)acrylic polymer" means a copolymer containing, as a polymerization component, a (meth)acrylic acid or a (meth)acrylic acid derivative such as (meth)acrylic acid ester (e.g., alkyl ester, aryl ester, allyl ester), (meth)acrylamide and (meth)acrylamide derivative. The "polyurethane" means a polymer produced by a condensation reaction of a compound having two or more isocyanate groups and a compound having two or more hydroxyl groups. The "polyvinylbutyral" means a polymer synthesized by a reaction (acetalization reaction) between a polyvinyl alcohol obtained by partially or fully saponifying polyvinyl acetate and a butylaldehyde under acidic conditions and includes a polymer in which an acid group or the like is introduced, for example, by a method of reacting the remaining hydroxy group with a compound having an acid group or the like.

One suitable example of the (meth)acrylic polymer for use in the present invention includes a copolymer containing a repeating unit having an acid group. Examples of the acid group include a carboxylic acid group, a sulfonic acid group, a phosphonic acid group, a phosphoric acid group and a sulfonamide group, with a carboxylic acid group being preferred. The repeating unit having an acid group, which is preferably used, is a repeating unit derived from a (meth)acrylic acid, or a repeating unit represented by the following formula (I):

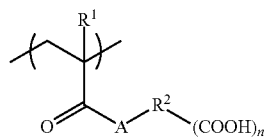

(I)

(In formula (I), $R^1$ represents a hydrogen atom or a methyl group, $R^2$ represents a single bond or an (n+1)-valent linking group, A represents an oxygen atom or $-NR^3-$, $R^3$ represents a hydrogen atom or a monovalent hydrocarbon group having a carbon number of 1 to 10, and n represents an integer from 1 to 5.)

The linking group represented by $R^2$ in formula (I) is preferably composed of one or more atoms selected from the group consisting of a hydrogen atom, a carbon atom, an oxygen atom, a nitrogen atom, a sulfur atom and a halogen atom, and the number of atoms constituting the linking group represented by $R^2$ is preferably from 1 to 80. Specific examples of the linking group include an alkylene group, a substituted alkylene group, an arylene group and a substituted arylene group. The linking group may have a structure where a plurality of such divalent groups are connected through any of an amido bond, an ether bond, a urethane bond, a urea bond and an ester bond. $R^2$ is preferably a single bond, an alkylene group, a substituted alkylene group, or a structure where a plurality of at least either alkylene groups or substituted alkylene groups are connected through at least any one of an amido bond, an ether bond, a urethane bond, a urea bond and an ester bond, more preferably a single bond, an alkylene group having a carbon number of 1 to 5, a substituted alkylene group having a carbon number of 1 to 5, or a structure where a plurality of at least either alkylene groups having a carbon number of 1 to 5 or substituted alkylene groups having a carbon number of 1 to 5 are connected through at least any one of an amido bond, an ether bond, a urethane bond, a urea bond and an ester bond, and most preferably a single bond, an alkylene group having a carbon number of 1 to 3, a substituted alkylene group having a carbon number of 1 to 3, or a structure where a plurality of at least either alkylene groups having a carbon number of 1 to 3 or substituted alkylene groups having a carbon number of 1 to 3 are connected through at least any one of an amido bond, an ether bond, a urethane bond, a urea bond and an ester bond.

The substituent in the substituted alkylene group and substituted arylene group includes a monovalent nonmetallic atomic group excluding a hydrogen atom, and examples thereof include a halogen atom ($-F$, $-Br$, $-Cl$, $-I$), a hydroxyl group, a cyano group, an alkoxy group, an aryloxy group, a mercapto group, an alkylthio group, an arylthio group, an alkylcarbonyl group, an arylcarbonyl group, a carboxyl group or a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having a carbon number of 1 to 5, more preferably a hydrogen atom or a hydrocarbon group having a carbon number of 1 to 3, and most preferably a hydrogen atom or a methyl group. n is preferably from 1 to 3, more preferably 1 or 2, and most preferably 1.

The ratio (mol %) of the carboxylic acid group-containing copolymerization component in all copolymerization components of the (meth)acrylic polymer is preferably from 1 to 70% in view of developability. From the standpoint of satisfying both developability and press life, the ratio is more preferably from 1 to 50%, still more preferably from 1 to 30%.

The (meth)acrylic polymer for use in the present invention preferably further contains a crosslinking group. The "crosslinking group" as used herein means a group capable of crosslinking the binder polymer in the course of a radical polymerization reaction that occurs in the photosensitive layer upon exposure or heating of the lithographic printing plate precursor. The crosslinking group is not particularly limited as long as it has such a function, but examples of the functional group capable of causing an addition polymerization reaction include an ethylenically unsaturated bond group, an amino group and an epoxy group. Also, the crosslinking group may be a functional group capable of becoming a radical upon irradiation with light, and examples thereof include a thiol group and a halogen atom. Among others, an ethylenically unsaturated bond group is preferred. The ethylenically unsaturated bond group is preferably a styryl group, a (meth)acryloyl group or an allyl group.

In the (meth)acrylic polymer, for example, a free radical (a polymerization initiating radical or a propagating radical in the course of polymerization of the polymerizable compound) is added to the crosslinking functional group to cause addition polymerization between polymers directly or through a polymerization chain of the polymerizable compound, and a bridge is formed between polymer molecules, whereby curing is effected. Alternatively, an atom (for example, a hydrogen atom on the carbon atom adjacent to the functional crosslinking group) in the polymer is withdrawn by a free radical to produce a polymer radical, and the polymer radicals combine with each other to form a bridge between polymer molecules and thereby effect curing.

The content of the crosslinking group (the content of radical-polymerizable unsaturated double bond determined by iodine titration) in the (meth)acrylic polymer is preferably from 0.01 to 10.0 mmol, more preferably from 0.05 to 9.0 mmol, and most preferably from 0.1 to 8.0 mmol, per g of the binder polymer.

The (meth)acrylic polymer for use in the present invention may contain a polymerization unit of (meth)acrylic acid alkyl or aralkyl ester, a polymerization unit of (meth)acrylamide or a derivative thereof, a polymerization unit of α-hydroxymethyl acrylate, or a polymerization unit of a styrene derivative, in addition to the acid group-containing polymerization unit and the crosslinking group-containing polymerization unit which are described above. The alkyl group in the (meth)acrylic acid alkyl ester is preferably an alkyl group having a carbon number of 1 to 5, or an alkyl group having the above-described substituent with a carbon number of 2 to 8, more preferably a methyl group. Examples of the (meth)acrylic acid aralkyl ester include benzyl (meth)acrylate. Examples of the (meth)acrylamide derivative include N-isopropylacrylamide, N-phenylmethacrylamide, N-(4-methoxycarbonylphenyl)methacrylamide, N,N-dimethylacrylamide and morpholinoacrylamide. Examples of the α-hydroxymethyl acrylate include ethyl α-hydroxymethylacrylate and cyclohexyl α-hydroxymethylacrylate. Examples of the styrene derivative include styrene and 4-tert-butylstyrene.

Preferred examples of the polyurethane for use in the present invention include polyurethane resins described in paragraphs [0099] to [0210] of JP-A-2007-187836, paragraphs [0019] to [0100] of JP-A-2008-276155, paragraphs [0018] to [0107] of JPA-2005-250438 and paragraphs [0021] to [0083] of JP-A-2005-250158.

Preferred examples of the polyvinylbutyral for use in the present invention include polyvinylbutyrals described in paragraphs [0006] to [0013] of JP-A-2001-75279.

For example, a polyvinylbutyral having introduced therein an acid group shown below is also preferably used.

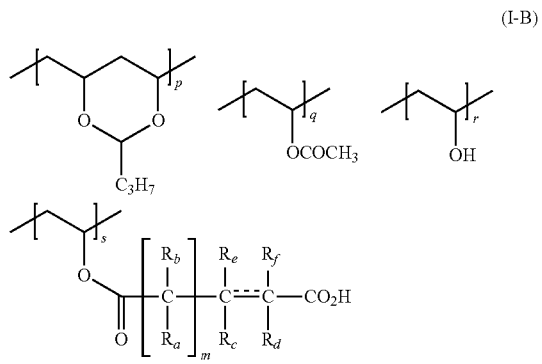

(I-B)

In formula (I-B), the ratio of respective repeating units is preferably p/q/r/s=from 50 to 78 mol %/from 1 to 5 mol %/from 5 to 28 mol %/from 5 to 20 mol %.

Each of Ra and Rb is a monovalent substituent, each of Rc, Rd, Re and Rf is independently a monovalent substituent which may have a substituent, or a single bond, and m is an integer of 0 or 1. The substituent represented by Ra, Rb, Rc, Rd, Re and Rf is preferably a hydrogen atom, an alkyl group which may have a substituent, a halogen atom, or an aryl group which may have a substituent, more preferably a hydrogen atom, a linear alkyl group such as methyl group, ethyl group and propyl group, an alkyl group substituted with a carboxylic acid, a halogen atom, a phenyl group, or a phenyl group substituted with a carboxylic acid. The pair of Rc and Rd or the pair of Re and Rf may form a ring structure. The bond between the carbon atom to which Rc and Re are bonded and the carbon atom to which Rd and Rf are bonded is a single bond, a double bond or an aromatic double bond, and in the case of a double bond or an aromatic double bond, Re and Rd, Re and Rf, Rc and Rf, or Rc and Rd combine with each other to from a single bond.

The polyvinylbutyral represented by formula (I-B) can be obtained by reacting, according to a known method, a compound represented by the following formula (I-B') with a hydroxy group of a polymer that is synthesized by a reaction (acetalization reaction) between a polyvinyl alcohol obtained by partially or fully saponifying polyvinyl acetate and a butylaldehyde under acidic conditions. In formula (I-B'), respective groups and m have the same definitions as in formula (I-B).

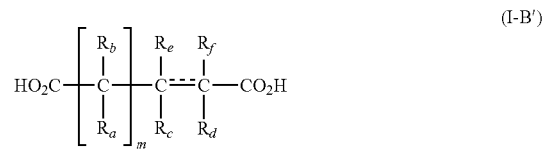

(I-B')

Furthermore, a part of the acid groups in the binder polymer may be neutralized with a basic compound. Examples of the basic compound include a compound containing a basic nitrogen, and an alkali metal hydroxide or quaternary ammonium hydroxide.

The binder polymer has a mass average molecular weight of preferably 5,000 or more, more preferably from 10,000 to 300,000, and has a number average molecular weight of preferably 1,000 or more, more preferably from 2,000 to 250,000. The polydispersity (mass average molecular weight/number average molecular weight) is preferably from 1.1 to 10.

As for the binder polymer, one polymer may be used alone, or a mixture of two or more polymers may be used. In view of good strength of the image area and good image formability, the content of the binder polymer is preferably from 5 to 75 mass %, more preferably from 10 to 70 mass %, still more preferably from 10 to 60 mass %, based on the entire solid content of the photosensitive layer.

The total content of the polymerizable compound and the binder polymer is preferably 90 mass % or less based on the entire solid content of the photosensitive layer. If it exceeds 90 mass %, decrease in the sensitivity and deterioration of the developability may be sometimes caused. The total content thereof is more preferably from 35 to 80 mass %.

In the present invention, the ratio between the polymerizable compound and the binder polymer in the photosensitive layer of the lithographic printing plate precursor is adjusted, whereby permeability of the developer into the photosensitive layer is more increased and the developability is further improved. That is, the mass ratio of polymerizable compound/binder polymer in the photosensitive layer is preferably 1.2 or more, more preferably from 1.25 to 4.5, and most preferably from 2 to 4.

The photosensitive layer preferably contains a chain transfer agent. The chain transfer agent is defined, for example, in *Kobunshi Jiten (Polymer Dictionary)*, Third Edition, pp. 683 to 684, compiled by The Society of Polymer Science, Japan (2005). As the chain transfer agent, for example, compounds having SH, PH, SiH or GeH in the molecule are used. Such a compound can donate hydrogen to a low active radical species to generate a radical or can be oxidized and then deprotonated to generate a radical.

In particular, a thiol compound (such as 2-mercaptobenzimidazoles, 2-mercaptobenzothiazoles, 2-mercaptobenzoxazoles, 3-mercaptotriazoles and 5-mercaptotetrazoles) may be preferably used in the photosensitive layer of the present invention.

The amount of the chain transfer agent added is preferably from 0.01 to 20 parts by mass, more preferably from 1 to 10 parts by mass, and most preferably from 1 to 5 parts by mass, per 100 parts by mass of the entire solid content of the photosensitive layer.

<Other Components of Photosensitive Layer>

Furthermore, various additives can be incorporated into the photosensitive layer, if desired. Examples of the additive include a surfactant for promoting developability and improving the coating surface state, a microcapsule for balancing developability and press life, a hydrophilic polymer for improving developability and enhancing the dispersion stability of microcapsule, a coloring agent or print-out agent for enabling visual recognition of the image area and the non-image area, a polymerization inhibitor for preventing unnecessary thermal polymerization of the radical polymerizable compound during production or storage of the photosensitive layer, a hydrophobic low molecular compound such as higher fatty acid derivative for avoiding polymerization inhibition due to oxygen, a fine inorganic or organic particle for increasing the strength of cured film in the image area, a hydrophilic low molecular compound for enhancing developability, a co-sensitizer for increasing sensitivity, and a plasticizer for improving plasticity. For all of these compounds, a known compound may be used and, for example, compounds described in paragraphs [0161] to [0215] of JP-A-2007-206217, paragraph [0067] of JP-T-2005-509192 and paragraphs [0023] to [0026] and [0059] to [0066] of JP-A-2004-310000 can be used. As for the surfactant, a surfactant which may be added to the later-described developer may be also used.

[Positive Lithographic Printing Plate Precursor]

The positive lithographic printing plate precursor has, on a hydrophilic support, an image recording layer (sometimes referred to as a photosensitive layer) containing a binder polymer and an infrared absorber, and the image recording layer may be a single layer or may comprise a lower layer and an upper layer.

Suitable examples of the positive lithographic printing plate precursor in which the image recording layer is a single layer include those described in JP-A-7-285275, JP-A-10-268512, JP-A-10-282672, and JP-A-2005-258451.

Suitable examples of the positive lithographic printing plate precursor in which the image recording layer comprises a lower layer and an upper layer include those where the lower layer contains (A) a water-insoluble and alkali-soluble resin as the binder polymer and (B) an infrared absorber and the upper contains (C) a water-insoluble and alkali-soluble resin as the binder polymer and (D) a polyorganosiloxane.

Respective components of the positive lithographic printing plate precursor in which the image recording layer comprises a lower layer and an upper layer are described in detail below.

(A) Water-Insoluble and Alkali-Soluble Resin

In the present invention, the water-insoluble and alkali-soluble resin (A) which can be used in the lower layer is not particularly limited as long as it is a resin having a property of being insoluble in water and being dissolved upon contact with an alkaline developer, but the resin is preferably a homopolymer having an acidic group in at least either the main chain or the side chain of the polymer, a copolymer thereof, or a mixture of these polymers.

The acidic group is —COOH, —SO$_3$H, —OSO$_3$H, —PO$_3$H$_2$, —OPO$_3$H$_2$, —CONHSO$_2$, —SO$_2$NHSO$_2$—, a phenolic hydroxyl group or an active imide group, preferably —COOH, —SO$_3$H, —OPO$_3$H$_2$ or —SO$_2$NHSO$_2$—, more preferably —COOH.

Accordingly, this resin can be suitably obtained by polymerizing a mixture of monomers containing one or more ethylenically unsaturated monomers having the above-described acidic group (hereinafter, sometimes referred to as "alkali-solubility-imparting monomer"). The alkali-solubility-imparting monomer includes an acrylic acid, a methacrylic acid, a compound represented by the following formula, and a mixture thereof. In the following formula, each R$^4$ represents a hydrogen atom or CH$_3$.

Incidentally, in the description of the present invention, the term "(meth)acrylate" is sometimes used when indicating either one or both of acrylate and methacrylate, and the term "(meth)acryl" is sometimes used when indicating either one or both of acryl and methacryl.

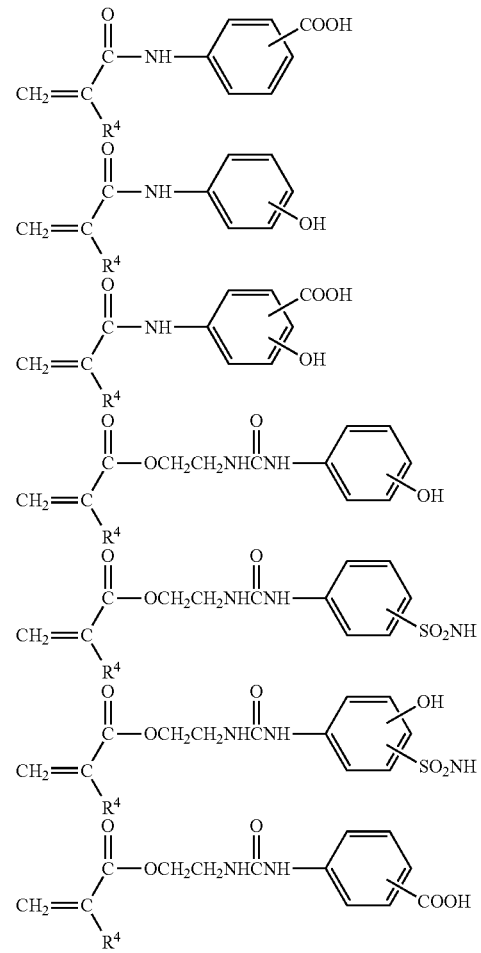

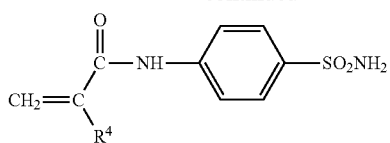

In the present invention, the water-insoluble and alkali-soluble resin (A) in the lower layer is preferably a polymer compound obtained by copolymerizing the alkali-solubility-imparting monomer and additionally, other polymerizable monomers. In this case, as for the copolymerization ratio, the copolymer preferably contains the alkali-solubility-imparting monomer in a ratio of 10 to 70 mol %, more preferably 20 mol % or more. When the copolymerization component of the alkali-solubility-imparting monomer is in this range, the resin becomes insoluble in water and soluble in an alkaline developer, and good developability is obtained.

Examples of other polymerizable monomers which can be used for the preparation of the water-insoluble and alkali-soluble resin (A) include the following compounds:

alkyl acrylates and alkyl methacrylates, such as methyl acrylate, ethyl acrylate, propyl acrylate, benzyl acrylate, methyl methacrylate, ethyl methacrylate, cyclohexyl methacrylate and benzyl methacrylate; acrylic acid esters and methacrylic acid esters each having an aliphatic hydroxyl group, such as 2-hydroxyethyl acrylate and 2-hydroxyethyl methacrylate; acrylamides and methacrylamides, such as acrylamide, methacrylamide, N-methylacrylamide, N-ethylacrylamide and N-phenylacrylamide; vinyl esters such as vinyl acetate, vinyl chloroacetate, vinyl butyrate and vinyl benzoate; styrenes such as styrene, α-methylstyrene, methylstyrene and chloromethylstyrene; other nitrogen atom-containing monomers such as N-vinylpyrrolidone, N-vinylpyridine, acrylonitrile and methacrylonitrile; and maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide and N-hydroxyphenylmaleimide.

Among these other ethylenically unsaturated monomers as comonomer, (meth)acrylic acid esters, (meth)acrylamides, maleimides and (meth)acrylonitrile are preferably used.

Specific examples of the copolymer of the water-insoluble and alkali-soluble resin (A) are illustrated below. In all specific examples, the mass average molecular weight is from 20,000 to 50,000. However, the present invention is not limited to these specific examples. In the followings, the ratio of repeating units is the molar ratio.

(1)

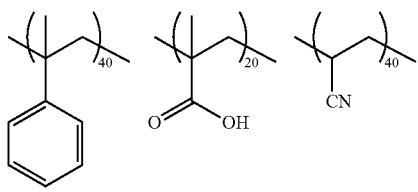

(2)

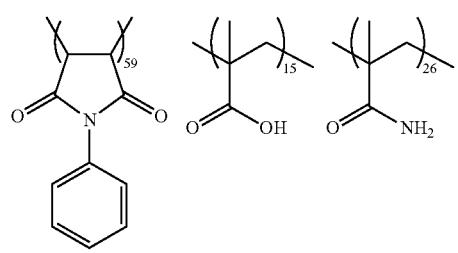

(3)

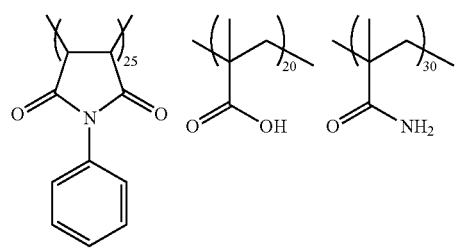

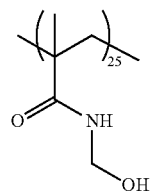

(4)

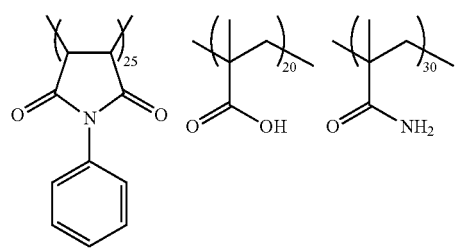

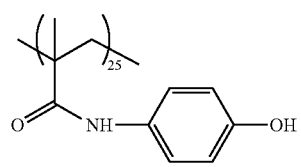

(5)

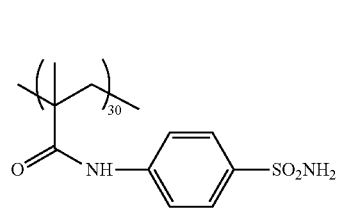

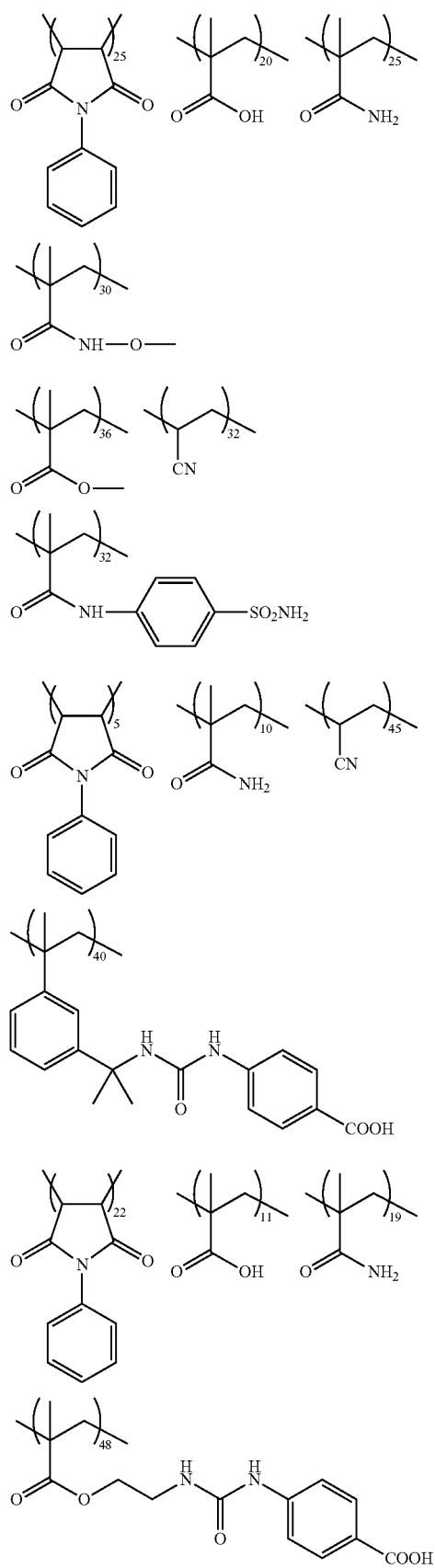
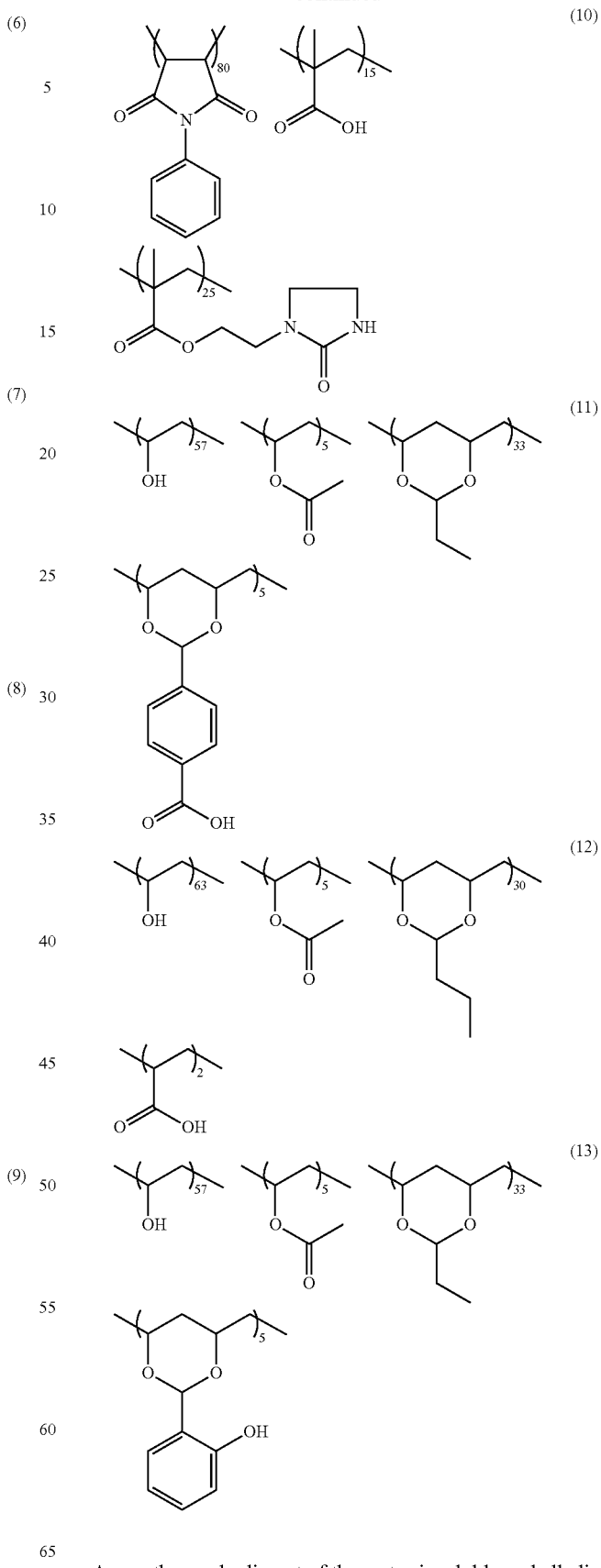
As another embodiment of the water-insoluble and alkali-soluble resin (A), a resin having a phenolic hydroxyl group is also preferred. Examples of the resin having a phenolic hydroxyl group include a novolak resin such as phenol formaldehyde resin, m-cresol formaldehyde resin, p-cresol formaldehyde resin, m-/p-mixed cresol formaldehyde resin and phenol/cresol (may be any of m-, p-, and m-/p-mixed) mixed formaldehyde resin.

In addition, a phenol-formaldehyde condensate having, as a substituent, an alkyl group with a carbon number of 3 to 8, such as tert-butylphenol formaldehyde resin and octylphenol formaldehyde resin described in U.S. Pat. No. 4,123,279, may be used in combination.

One of these phenolic hydroxyl group-containing resins may be used alone, or two or more thereof may be used in combination.

In the present invention, the water-insoluble and alkali-soluble resin (A) used in the lower layer of the image recording layer is preferably a resin having a mass average molecular weight of 2,000 or more and a number average molecular weight of 500 or more, more preferably a resin having a mass average molecular weight of 5,000 to 300,000, a number average molecular weight of 800 to 250,000, and a polydispersity (mass average molecular weight/number average molecular weight) of 1.1 to 10. For the values of these molecular weights, a value calculated in terms of molecular weight of a polystyrene standard by GPC (gel permeation chromatography) measurement is used.

As for the water-insoluble and alkali-soluble resin (A) used in the lower layer of the image recording layer of the present invention, one resin may be used but two or more resins may be also used.

The content of the water-insoluble and alkali-soluble resin (A) is preferably from 50 to 98 mass %, more preferably from 65 to 95 mass %, based on the entire solid content of the lower layer of the image recording layer. When the content of the water-insoluble and alkali-soluble resin (A) is in this range, the image recording layer has high sensitivity and good durability.

(B) Infrared Absorber

In the present invention, the lower layer of the image recording layer contains (B) an infrared absorber. The infrared absorber (B) is not particularly limited as long as it is a dye or pigment capable of absorbing infrared light to generate heat, and various dyes and pigments known as an infrared absorber may be used.

Examples of the dye as the infrared absorber include cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

For the dye as the infrared absorber, near infrared absorption sensitizers described in U.S. Pat. No. 5,156,938 may be also suitably used and in particular, substituted aryl benzo (thio)pyrylium salts described in U.S. Pat. No. 3,881,924, trimethine thiapyrylium salts described in JP-A-57-142645 (U.S. Pat. No. 4,327,169), pyrylium-based compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethine thiopyrylium salts described in U.S. Pat. No. 4,283,475, pyrylium compounds described in JP-B-5-13514 and JP-B-5-19702, and commercial products such as Epolight III-178, Epolight III-130 and Epolight III-125 all produced by Epoline Corp., are preferably used.

Other particularly preferred examples of the dye include near infrared absorption dyes described as formulae (I) and (II) in U.S. Pat. No. 4,756,993.

As the infrared absorber preferably used in the lower layer of the image recording layer of the present invention, the following compounds are preferred.

Among these infrared absorber dyes, cyanine dyes A and F are more preferred.

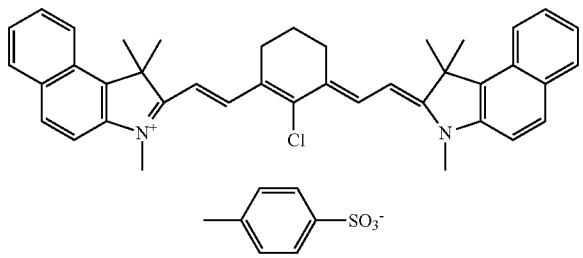

Cyanine Dye A

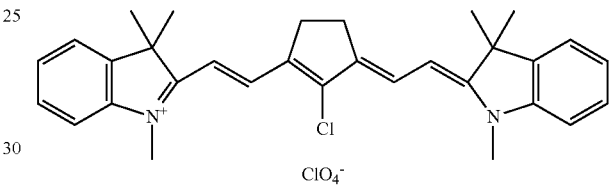

Cyanine Dye B

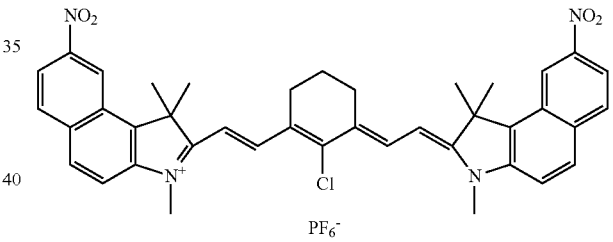

Cyanine Dye C

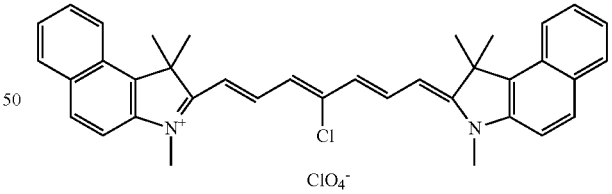

Cyanine Dye D

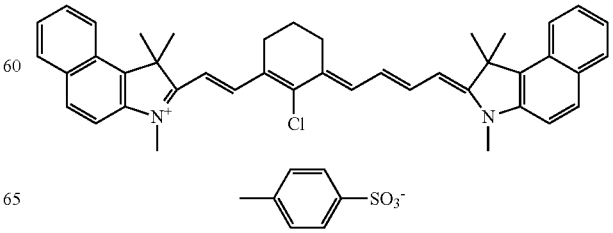

Cyanine Dye E

Cyanine Dye F

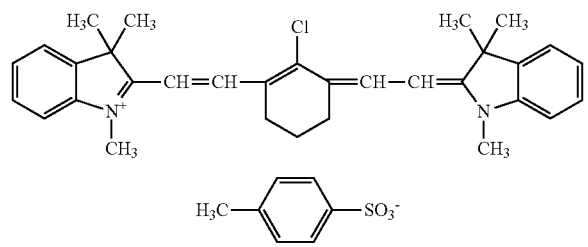

The pigment includes commercial pigments and pigments described in *Color Index (C.I.) Binran (Color Index (C.I.) Handbook)*, *Saishin Ganryo Binran (Latest Pigment Handbook)* (compiled by Japan Pigment Technical Association (1977), and *Saishin Ganryo Oyo Gijutsu (Latest Pigment Applied Technology)* (CMC Shuppan, 1986), and examples thereof include an insoluble azo pigment, an azo lake pigment, a condensed azo pigment, a chelate azo pigment, a phthalocyanine-based pigment, an anthraquinone-based pigment, perylene- and perinone-based pigments, a thioindigo-based pigment, a quinacridone-based pigment, a dioxazine-based pigment, an isoindolinone-based pigment, a quinophthalone-based pigment, a vat lake pigment, an azine pigment, a nitroso pigment, a nitro pigment, a natural pigment, a fluorescence pigment, an inorganic pigment, and carbon black. In particular, carbon black is preferably used.

By incorporating the infrared absorber into the lower layer of the image recording layer, the balance between sensitivity and ablation resistance during image recording is improved.

As for the amount of the infrared absorber added, the infrared absorber may be added in a ratio of generally from 0.01 to 50 mass %, preferably from 0.1 to 30 mass %, more preferably from 1.0 to 30 mass %, based on the entire solid content of the lower layer. With the content in this range, the achieving temperature of the upper layer during image recording can be decreased, and adequate sensitivity can be obtained while suppressing the ablation.

The lower layer of the image recording layer may further contain other additives described later.

(C) Water-Insoluble and Alkali-Soluble Resin

The alkali-soluble resin which can be used in the upper layer is not particularly limited as long as it is a resin having a property of being dissolved upon contact with an alkali developer, but the resin is preferably a homopolymer obtained from a monomer having an acidic group in at least either the main chain or the side chain of the polymer, a copolymer thereof, or a mixture of these polymers.

The alkali-soluble resin having such an acidic group includes particularly a polymer compound having, in the molecule, any one functional group of (1) a phenolic hydroxyl group, (2) a sulfonamide group, and (3) an active imide group. For example, those described in paragraphs [0072] to [0076] of JP-A-2009-069384 are preferably used, but the present invention is not limited thereto.

In the present invention, the upper layer of the image recording layer preferably contains (C') a water-insoluble and alkali-soluble polyurethane The polyurethane contained in the upper layer is not particularly limited as long as it is insoluble in water and soluble in an aqueous alkali solution, but among others, those having a carboxy group in the polymer main chain are preferred, and specific examples thereof include a polyurethane in which the basic skeleton is a reaction product of a diisocyanate compound represented by the following formula (I) and at least one diol compound having a carboxy group represented by the following formula (II) or (III):

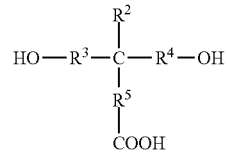

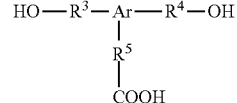

In formula (I), $R^1$ represents a divalent linking group.

The divalent linking group which can be taken for $R^1$ includes an aliphatic hydrocarbon group, an alicyclic hydrocarbon group and an aromatic hydrocarbon group and is preferably an alkylene group having a carbon number of 2 to 10, or an arylene group having a carbon number of 6 to 30.

Also, $R^1$ may have another functional group incapable of reacting with an isocyanate group.

In formula (II), $R^2$ represents a hydrogen atom, an alkyl group, an aralkyl group, an aryl group, an alkoxy group, or an aryloxy group. Here, $R^2$ may have a substituent.

$R^2$ is preferably a hydrogen atom, an unsubstituted alkyl group having a carbon number of 1 to 8, or an unsubstituted aryl group having a carbon number of 6 to 15.

In formula (II) or (III), $R^3$, $R^4$ and $R^5$, which may be the same or different, each represents a single bond or a divalent linking group.

The divalent linking group which can be taken for $R^3$, $R^4$ and $R^5$ includes an aliphatic hydrocarbon group and an aromatic hydrocarbon group. Here, $R^3$, $R^4$ and $R^5$ may have a substituent. Each of $R^3$, $R^4$ and $R^5$ is preferably an unsubstituted alkylene group having a carbon number of 1 to 20, or an unsubstituted arylene group having a carbon number of 6 to 15, more preferably an unsubstituted alkylene group having a carbon number of 1 to 8.

Also, $R^3$, $R^4$ and $R^5$ may have another functional group incapable of reacting with an isocyanate group.

In formula (III), Ar represents a trivalent aromatic hydrocarbon which may have a substituent, and is preferably an arylene group having a carbon number of 6 to 15.

Specific examples of the diisocyanate compound represented by formula (I) include the following compounds, but the present invention is not limited thereto:

an aromatic diisocyanate compound such as 2,4-tolylene diisocyanate, 2,4-tolylene diisocyanate dimer, 2,6-tolylene diisocyanate, p-xylylene diisocyanate, metaxylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound such as hexamethylene diisocyanate, trimethylhexamethylene diisocyanate, lysine diisocyanate and dimer acid diisocyanate; an alicyclic diisocyanate compound such as isophorone diisocyanate, 4,4'-methylene bis(cyclohexylisocyanate), methylcyclohexane-2,4 (or 2,6)-diisocyanate and 1,3-(isocyanatomethyl) cyclohexane; and a diisocyanate compound that is a reaction product of a diol and a diisocyanate, such as adduct of 1 mol of 1,3-butylene glycol and 2 mol of tolylene diisocyanate.

Among these, compounds having an aromatic ring, such as 4,4'-diphenylmethane diisocyanate, xylylene diisocyanate and tolylene diisocyanate, are preferred in view of press life.

Specific examples of the diol compound having a carboxy group represented by formula (II) or (III) include the following compounds, but the present invention is not limited thereto:

3,5-dihydroxybenzoic acid, 2,2-bis(hydroxymethyl)propionic acid, 2,2-bis(hydroxyethyl)propionic acid, 2,2-bis(3-hydroxypropylpropionic acid, 2,2-bis(hydroxymethyl)acetic acid, bis-(4-hydroxy phenyl)acetic acid, 4,4-bis-(4-hydroxyphenyl)pentanoic acid, and tartaric acid.

Among these, 2,2-bis(hydroxymethyl)propionic acid and 2,2-bis(hydroxyethyl)propionic acid are preferred in view of reactivity with isocyanate.

The water-insoluble and alkali-soluble polyurethane (C') according to the present invention can be synthesized by adding a diisocyanate compound, a diol compound and a known catalyst having activity according to the reactivity of each compound to an aprotic solvent, and heating the solution.

The molar ratio between the diisocyanate and the diol compound used is preferably from 0.8:1 to 1.2:1. In the case where an isocyanate group remains on the polymer terminal, a treatment with alcohols, amines or the like is applied, whereby the polymer is finally synthesized with no remaining of an isocyanate group.

In view of chemical resistance, the water-insoluble and alkali-soluble polyurethane (C') according to the present invention preferably has an aromatic skeleton.

Specific examples of the water-insoluble and alkali-soluble polyurethane (C') for use in the present invention include reaction products of isocyanate compounds and diol compounds illustrated below. The compositional ratio may be freely set as long as the resin can be synthesized and alkali solubility can be maintained.

(1)
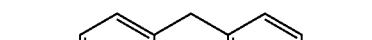

(2)
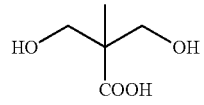

(3)
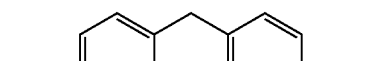
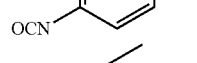

(4)
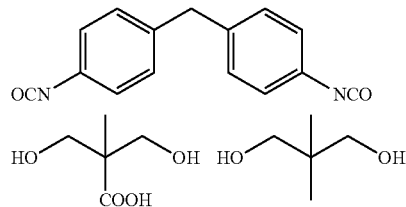

(5)
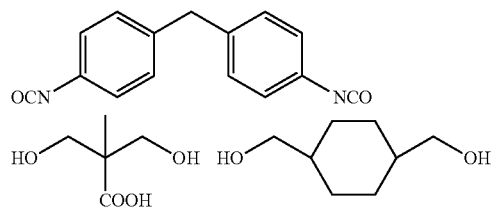

(6)
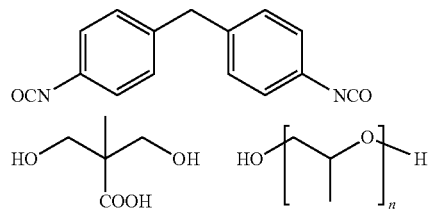

(7)
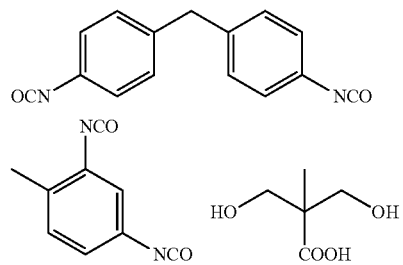

(8)
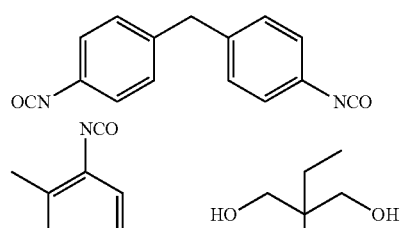

(9)
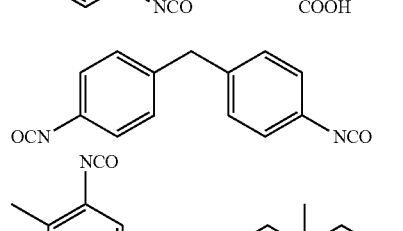

(10)
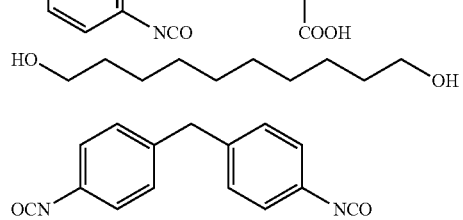

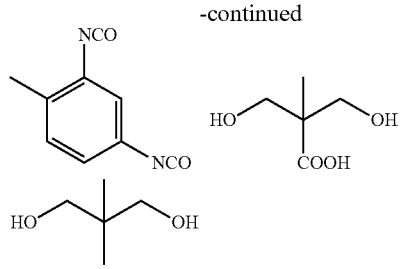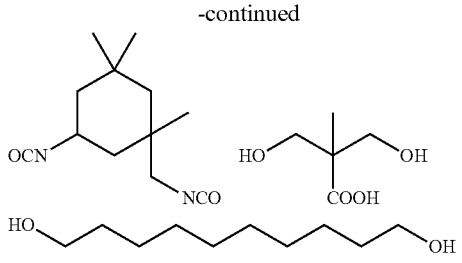

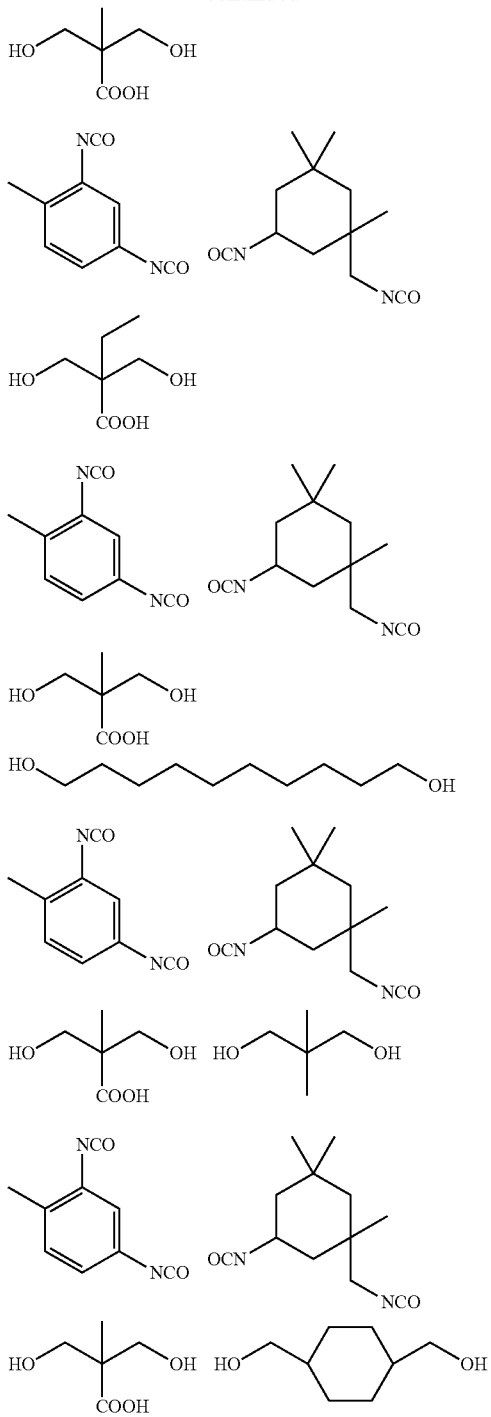

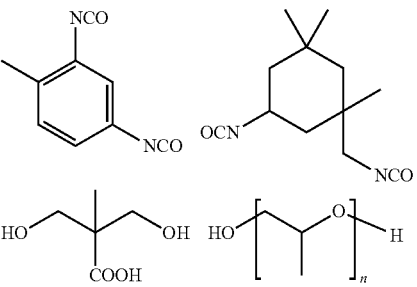

Among these, preferred are (1), (3), (4), (7), (8), (9), (11), (13), (15), (19), (21) and (22).

The molecular weight of the water-insoluble and alkali-soluble polyurethane resin (C) according to the present invention is, in terms of mass average molecular weight, preferably 1,000 or more, more preferably from 5,000 to 100,000. One of these water-insoluble and alkali-soluble polyurethane resins (C) may be used alone, or a mixture of two or more thereof may be used.

The content of the water-insoluble and alkali-soluble resin such as the above-described polyurethane in the upper layer components according to the present invention is preferably from 2 to 99.5 mass %, more preferably from 5 to 99 mass %, still more preferably from 10 to 98 mass %, based on the entire solid content of the upper layer. When the content is in this range, the effect of preventing time-dependent generation of development scum is well-balanced with image formability and press life.

(D) Polyorganosiloxane

The upper layer of the image recording layer for use in the present invention preferably contains (D) a polyorganosiloxane.

The polyorganosiloxane (D) is not particularly limited as long as it contains a nonpolar moiety composed of siloxane and a polar moiety having an oxygen atom or the like. For example, a polyether-modified polyorganosiloxane, an alcohol-modified polyorganosiloxane or a carboxyl-modified polyorganosiloxane may be used.

As specific examples of the polyorganosiloxane, a polyorganosiloxane obtained by hydrolysis condensation of an alkoxysilane in a compound represented by the following formula is preferred:

$$RSi(OR')_3$$

[wherein R represents an alkyl group or an aryl group, and R' represents an alkyl group].

In the formula, R is preferably a phenyl group. R' is preferably a methyl group, an ethyl group or a propyl group, and each R' may be the same as or different from every other R'.

A graft block polysiloxane represented by the following formula (I) or a block polysiloxane represented by the following formula (II) is also preferably used.

In the formulae (I) and (II), each of n, p and q is an integer of 1 or more.

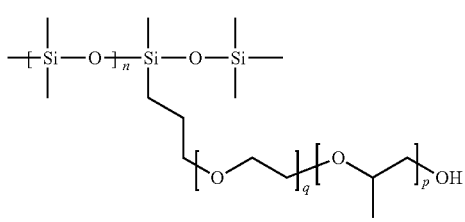

(I)

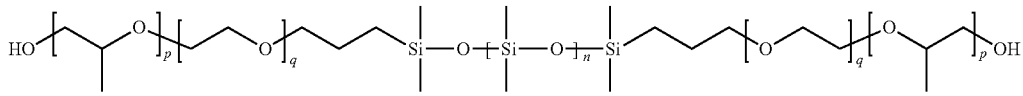

(II)

The production method of organopolysiloxane is specifically described in WO2000/035994.

Also, examples of the commercial product of polyorganosiloxane include BYK-333 (produced by BYK-Chemie) that is a polyether-modified polydimethylsiloxane, and TEGO GLIDE 410 (available from TegoChemie Service GmbH) that is a polysiloxane polyether copolymer.

The content of the polyorganosiloxane (D) in the upper layer of the image recording layer according to the present invention is preferably from 0.01 to 10 mass %, more preferably from 0.03 to 5 mass %, still more preferably from 0.1 to 3 mass %, based on the entire solid content of the upper layer.

Within the range above, this component can improve the scratch resistance owing to low friction coefficient and work as a dispersant to promote the dispersion of the polyurethane resin in the developer, as a result, an effect of preventing time-dependent generation of development scum can be obtained.

Furthermore, in the upper layer components according to the present invention, another resin may be used in combination as long as the effects of the present invention are not impaired. The upper layer itself must express alkali solubility particularly in the non-image area and therefore, a resin not impairing this characteristic must be selected.

In the case where the upper layer contains a water-insoluble and alkali-soluble polyurethane, another water-insoluble and alkali-soluble resin may be used in combination, in addition to the polyurethane In the case of using another water-soluble and alkali-soluble resin in combination, examples thereof include the water-insoluble and alkali-soluble resin (A) described as an essential component for the lower layer. The structure may be the same as or different from that of the resin used in the lower layer.

The content of the another water-insoluble and alkali-soluble resin used in combination with the water-insoluble and alkali-soluble polyurethane is preferably 50 mass % or less based on the water-insoluble and alkali-soluble polyurethane resin (C').

Furthermore, in the upper layer components according to the present invention, an infrared absorber may be added as long as the effects of the present invention are not impaired. By the addition to the upper layer, diffusion of heat to a metal substrate with high thermal conductivity during exposure can be prevented, and high sensitivity is achieved. Those described in (B) Infrared Absorber can be used similarly.

[Other Components]

Each of the upper and lower layers of the image recording layer in the positive lithographic printing plate may contain other additives according to the purpose, if desired.

Other additives include various additives, but usually, a dissolution inhibitor capable of decreasing the solubility of the water-insoluble and alkali-soluble resin in an alkali developer before thermal decomposition but losing its function by thermal decomposition is added to at least either the upper layer or the lower layer of the image recording layer.

Examples of the dissolution inhibitor include an onium salt, an o-quinonediazide compound, an aromatic sulfone compound, and an aromatic sulfonic acid ester compound. This substance is pyrolytic and in a state of being not decomposed, can substantially decrease the solubility of the water-insoluble and alkali-soluble resin in an alkali developer, making it possible to enhance the effect of inhibiting dissolution of the image area in the developer.

Examples of the onium salt as the dissolution inhibitor include a diazonium salt, an ammonium salt, a phosphonium salt, an iodonium salt, a sulfonium salt, a selenonium salt, and an arsonium salt.

Preferred examples of the onium salt include diazonium salts described in S.I. Schlesinger, *Photogr. Sci. Eng.*, 18, 387 (1974), T. S. Bal et al., *Polymer*, 21, 423 (1980), and JP-A-5-158230; ammonium salts described in U.S. Pat. Nos. 4,069,055 and 4,069,056, and JP-A-3-140140; phosphonium salts described in D. C. Necker et al., *Macromolecules*, 17, 2468 (1984), C. S. Wen et al., *Teh, Proc. Conf. Rad. Curing ASIA*, p 478 Tokyo, October (1988), and U.S. Pat. Nos. 4,069,055 and 4,069,056; iodonium salts described in J. V. Crivello et al., *Macromorecules*, 10 (6), 1307 (1977), *Chem. & amp; Eng. News, November.* 28, p. 31 (1988), European Patent 104,143, U.S. Pat. Nos. 339,049 and 410,201, JP-A-2-150848, and JP-A-2-296514;

sulfonium salts described in J. V. Crivello et al., *Polymer J.* 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromorecules*, 14 (5), 1141 (1981), J. V. Crivello et al., *J. Polymer Sci., PolymerChem. Ed.*, 17, 2877 (1979), European Patents 370,693, 233, 567, 297,443 and 297,442, U.S. Pat. Nos. 4,933,377, 3,902,114, 410, 201, 339,049, 4,760,013, 4,734,444 and 2,833,827, and German Patents 2,904,626, 3,604,580 and 3,604,581; selenonium salts described in J. V. Crivello et al., *Macromorecules*, 10 (6), 1307 (1977), J. V. Crivello et al., *J. Polymer Sci., Polymer Chem. Ed.*, 17, 1047 (1979); and arsonium salts described in C. S. Wen et al., *Teh, Proc. Conf. Rad. Curing ASIA*, p. 478 Tokyo, October (1988).

Among these, diazonium salts are preferred, and those described in JP-A-5-158230 are preferred as the diazonium salt.

Examples of the counter ion of the onium salt include tetrafluoroboric acid, hexafluorophosphoric acid, triisopropylnaphthalenesulfonic acid, 5-sulfosalicylic acid, 2,5-dimethylbenzenesulfonic acid, 2,4,6-trimethylbenzenesulfonic acid, 2-nitrobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and para-toluenesulfonic acid. Among these, an alkyl aromatic sulfonic acid such as hexafluorophosphoric acid, triisopropylnaphthalenesulfonic acid and 2,5-dimethylbenzenesulfonic acid is preferred.

As the o-quinone diazide compound, compounds having various structures, which are a compound having one or more o-quinonediazide groups and being increased in the alkali solubility by thermal decomposition, are preferred. The o-quinonediazide produces, upon thermal decomposition, both an effect of depriving the binder of the dissolution inhibiting ability and an effect of changing the o-quinonediazide itself into an alkali-soluble substance and therefore, can act as a dissolution promoter for the binder.

As for the amount of the dissolution inhibitor added to the upper or lower layer of the image recording layer, in the case of adding the additive to the lower layer, the amount added is preferably from 0.1 to 20 mass %, more preferably from 0.5 to 10 mass %, and in the case of adding the additive to the upper layer, the amount added is preferably from 0.1 to 30 mass %, more preferably from 0.5 to 20 mass %, based on the entire solid content of the layer to which the additive is added.

Also, for the purpose of more enhancing the sensitivity, a cyclic acid anhydride, phenols or organic acids may be added to either one or both of the upper layer and the lower layer of the image recording layer.

Examples of the cyclic acid anhydride include phthalic anhydride, tetrahydrophthalic anhydride, hexahydrophthalic anhydride, maleic anhydride, succinic anhydride, and pyromellitic anhydride.

Examples of the phenols include bisphenol A, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

Examples of the acids include sulfonic acids, sulfinic acids, alkylsulfuric acids, phosphonic acids, phosphoric acid esters, and carboxylic acids, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The proportion of the cyclic acid anhydride, phenols or organic acids in the upper layer or lower layer of the image recording layer is preferably from 0.05 to 20 mass %, more preferably from 0.1 to 15 mass %, still more preferably from 0.1 to 10 mass %.

In order to improve the coatability, either one or both of the upper layer and the lower layer of the image recording layer may contain a surfactant such as fluorine-containing surfactant described in JP-A-62-170950. The content of the surfactant is preferably from 0.01 to 1 mass %, more preferably from 0.05 to 0.5 mass %, based on the coating solution composition for the upper or lower layer of the image recording layer. Also, in order to increase the processing stability against various development conditions, nonionic surfactants described in JP-A-62-251740 and JP-A-3-208514, and amphoteric surfactants described in JP-A-59-121044 and JP-A-4-13149 may be incorporated.

Examples of the nonionic surfactant include sorbitan tristearate, sorbitan monopalmitate, sorbitan trioleate, stearic acid monoglyceride, and polyoxyethylene nonylphenyl ether. Examples of the amphoteric surfactant include an alkyldi(aminoethyl)glycine, an alkylpolyaminoethyl glycine hydrochloride, a 2-alkyl-N-carboxyethyl-N-hydroxyethyl imidazolinium betaine, and an N-tetradecyl-N,N-betaine type.

The content of the nonionic surfactant and amphoteric surfactant in the coating solution composition for the upper layer or lower layer of the image recording layer is preferably from 0.05 to 15 mass %, more preferably from 0.1 to 5 mass %.

In either one or both of the upper layer and the lower layer of the image recording layer, a print-out agent for obtaining a visible image immediately after heating by exposure, and a dye or pigment as an image coloring agent may be incorporated. A representative print-out agent is a combination of a compound capable of releasing an acid upon heating by exposure (photoacid releasing agent) and an organic dye capable of forming a salt. Specific examples thereof include a combination of o-naphthoquinonediazide-4-sulfonic acid halogenide and a salt-forming organic dye described in JP-A-50-36209 and JP-A-53-8128, and a combination of a trihalomethyl compound and a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole-based compound and a triazine-based compound, and both compounds are excellent in the aging stability and give a sharp print-out image.

As the coloring agent used for improving visibility of the image area, various dyes may be used. The suitable dye includes an oil-soluble dye and a basic dye. Specific examples thereof include brilliant green, Oil Green BG, Oil Blue BOS, Oil Blue #603, Oil Black BY, Oil Black BS, Oil Black T-505 (all produced by Orient Chemical Industries, Co., Ltd.), Victoria Pure Blue, Crystal Violet (CI-42555), Methyl Violet (CI-42535), Ethyl Violet, Rhodamine B (CI 145170B), Malachite Green (CI-42000), and Methylene Blue (CI-52015). In particular, dyes described in JP-A-62-293247 are preferred.

The content of the dye is preferably from 0.01 to 10 mass %, more preferably from 0.1 to 3 mass %, based on the entire solid content of the upper layer or lower layer of the image recording layer.

Furthermore, in either one or both of the upper and the lower layer of the image recording layer, a plasticizer for imparting flexibility or the like to the image recording layer may be added, if desired. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and an oligomer and a polymer of acrylic acid or methacrylic acid.

<Formation of Image Recording Layer (Photosensitive Layer) of Negative Lithographic Printing Plate Precursor>

The photosensitive layer of the negative lithographic printing plate precursor is formed by dispersing or dissolving each of the above-described necessary constituting components in a solvent to prepare a coating solution and coating the solution. Examples of the solvent used here include, but are not limited to, methyl ethyl ketone, ethylene glycol monomethyl ether, 1-methoxy-2-propanol, 2-methoxyethyl acetate, 1-methoxy-2-propyl acetate, and γ-butyrolactone. The solvents may be used individually or as a mixture. The solid content concentration of the coating solution is preferably from 1 to 50 mass %.

The coating amount (solid content) of the photosensitive layer obtained on the support after coating and drying is preferably from 0.3 to 3.0 g/m$^2$. As for the coating method, various methods can be used. Examples thereof include bar coater coating, spin coating, spray coating, curtain coating, dip coating, air knife coating, blade coating, and roll coating.

<Formation of Image Recording Layer of Positive Lithographic Printing Plate Precursor>

The image recording layer of the positive lithographic printing plate precursor can be provided by coating in the same manner as the photosensitive layer of the negative lithographic printing plate precursor, and the preferred range of the coating amount (solid content) when the image recording layer is a single layer is also the same as that described for the photosensitive layer of the negative lithographic printing plate precursor.

In the case where the image recording layer of the positive lithographic printing plate precursor comprises a lower layer and an upper layer, the coating amount (entire solid content after drying) of the lower layer is preferably from 0.5 to 2.0 g/m$^2$, and the coating amount (entire solid content after drying) of the upper layer is preferably from 0.1 to 0.8 g/m$^2$.

<Protective Layer>

In the negative lithographic printing plate precursor, a protective layer (oxygen-blocking layer) is preferably provided on the photosensitive layer so as to block diffusion and invasion of oxygen that inhibits the polymerization reaction during exposure. As the material which can be used for the protective layer, either a water-soluble polymer or a water-insoluble polymer may be appropriately selected and used and, if desired, a mixture of two or more kinds of polymers may be used. Specific examples of the polymer include a polyvinyl alcohol, a modified polyvinyl alcohol, a polyvinylpyrrolidone, a water-soluble cellulose derivative, and a poly(meth)acrylonitrile. Among these, a water-soluble polymer relatively excellent in the crystallinity is preferably used. Specifically, use of a polyvinyl alcohol as the main component produces most preferred results in terms of fundamental characteristics such as oxygen-blocking property and removability by development.

The polyvinyl alcohol used for the protective layer may be partially substituted with an ester, an ether or an acetal as long as it contains an unsubstituted vinyl alcohol unit for having necessary oxygen-blocking property and water solubility. Also, the polyvinyl alcohol may partially have another copolymer component. The polyvinyl alcohol is obtained by hydrolyzing polyvinyl acetate and specifically includes, for example, a polyvinyl alcohol having a hydrolysis degree of 69.0 to 100 mo % and containing from 300 to 2,400 polymerization repeating units. Specific examples thereof include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706 and L-8, all produced by Kuraray Co., Ltd. These polyvinyl alcohols may be used individually or as a mixture. In a preferred embodiment, the content of the polyvinyl alcohol in the protective layer is from 20 to 95 mass %, more preferably from 30 to 90 mass %.

In addition, a known modified polyvinyl alcohol can be also preferably used. Among others, an acid-modified polyvinyl alcohol having a carboxylic acid group or a sulfonic acid group is preferably used. Specific preferred examples thereof include polyvinyl alcohols described in JP-A-2005-250216 and JP-A-2006-259137.

In the case of using the polyvinyl alcohol by mixing it with another material, the component mixed is preferably a modified polyvinyl alcohol, a polyvinylpyrrolidone or a modified product thereof from the standpoint of oxygen-blocking property and removability by development. The content thereof in the protective layer is preferably from 3.5 to 80 mass %, more preferably from 10 to 60 mass %, still more preferably from 15 to 30 mass %.

As another composition for the protective layer, glycerin, dipropylene glycol or the like may be added in an amount corresponding to several mass % based on the (co)polymer so as to impart flexibility. Furthermore, an anionic surfactant such as sodium alkylsulfate and sodium alkylsulfonate, an amphoteric surfactant such as alkylaminocarboxylate and alkylaminodicarboxylate, or a nonionic surfactant such as polyoxyethylene alkylphenyl ether, may be added in an amount of several mass % based on the (co)polymer.

In addition, it is also preferred to incorporate an inorganic layered compound into the protective layer for the purpose of enhancing the oxygen-blocking property and the effect of protecting the photosensitive layer surface. Out of inorganic layered compounds, a fluorine-based swellable synthetic mica that is a synthetic inorganic layered compound is particularly useful. Specific preferred examples thereof include inorganic layered compounds described in JP-A-2005-119273.

The coating amount of the protective layer is preferably from 0.05 to 10 g/m$^2$ in terms of coating amount after drying. In the case of containing an inorganic layered compound, the coating amount is more preferably from 0.1 to 5 g/m$^2$, and in the case of not containing an inorganic layered compound, the coating amount is more preferably from 0.5 to 5 g/m$^2$.

[Hydrophilic Support]

The hydrophilic support used in the lithographic printing plate precursor is not particularly limited and may be sufficient if it is a dimensionally stable plate-like support having a hydrophilic surface. Particularly, an aluminum plate is preferred. In advance of use, the aluminum plate is preferably subjected to a surface treatment such as roughening treatment and anodization treatment. The roughening treatment of the aluminum plate surface is performed by various methods, and examples thereof include a mechanical roughening treatment, an electrochemical roughening treatment (a roughening treatment of electrochemically dissolving the surface), and a chemical roughening treatment (a roughening treatment of chemically dissolving the surface selectively). With respect to these treatments, methods described in paragraphs [0241] to [0245] of JP-2007-206217 are preferably used.

The centerline average roughness of the support is preferably from 0.10 to 1.2 μm. Within this range, good adherence to the image recording layer, good press life, and good stain resistance are obtained.

The color density of the support is preferably from 0.15 to 0.65 in terms of reflection density value. Within this range, good image formability due to prevention of halation during image exposure and good suitability for plate inspection after development can be obtained.

The thickness of the support is preferably from 0.1 to 0.6 mm, more preferably from 0.15 to 0.4 mm, still more preferably from 0.2 to 0.3 mm.

[Hydrophilization Treatment of Support and Undercoat Layer]

In the lithographic printing plate precursor, in order to increase hydrophilicity of the non-image area and prevent printing stain, it is also preferred to perform a hydrophilization treatment for the support surface or provide an undercoat layer between the support and the image recording layer.

Examples of the hydrophilization treatment for the support surface include an alkali metal silicate treatment method of subjecting the support to a dipping treatment or an electrolytic treatment in an aqueous solution of sodium silicate or the like, a method of treating the support with potassium fluorozirconate, and a method of treating the support with polyvinylphosphonic acid or the like. A method of surface-treating the support with at least either an alkali metal silicate or an organic phosphonic acid is preferably used.

As the undercoat layer, an undercoat layer containing a compound having an acid group such as phosphonic acid, phosphoric acid and sulfonic acid is preferably used. This compound preferably further contains a polymerizable group so as to enhance the adherence to the image recording layer. The polymerizable group is preferably an ethylenically unsaturated bond group. A compound further having a hydrophilicity-imparting group such as ethyleneoxy group is also a preferred compound. Such a compound may be a low molecular compound or a high molecular polymer. Also, two or more of these compounds may be used as a mixture, if desired.

Preferred examples of the compound include a silane coupling agent having an addition-polymerizable ethylenically unsaturated bond group described in JP-A-10-282679 and a phosphorus compound having an ethylenically unsaturated bond group described in JP-A-2-304441. In addition, compounds containing a low molecular or polymer compound having a crosslinking group (preferably an ethylenically unsaturated bond group), a functional group capable of interacting with the support surface, and a hydrophilic group described in JP-A-2005-238816, JP-A-2005-125749, JP-A-2006-239867 and JP-A-2006-215263 are also preferably used.

The undercoat layer is coated by a known method. The coating amount (solid content) of the undercoat layer is preferably from 0.1 to 100 mg/m$^2$, more preferably from 1 to 30 mg/m$^2$.

[Backcoat Layer]

In the lithographic printing plate precursor of the present invention, a backcoat layer may be provided on the back surface of the support, if desired, and the backcoat layer can be provided on the back surface of the support, for example, after applying a surface treatment to the support or forming an undercoat layer.

Preferred examples of the backcoat include a coat layer comprising an organic polymer compound described in JP-A-5-45885 or a metal oxide obtained by hydrolyzing and polycondensing an organic metal compound or inorganic metal compound described in JP-A-6-35174. Above all, use of an alkoxy compound of silicon, such as $Si(OCH_3)_4$, $Si(OC_2H_5)_4$, $Si(OC_3H_7)_4$ and $Si(OC_4H_9)_4$, is preferred from the standpoint that the raw materials are inexpensive and easily available.

The printing method of the present invention is characterized in that a lithographic printing plate is manufactured by the above-described manufacturing method of a lithographic printing plate and printing is performed using the lithographic printing plate. The method for printing is not particularly limited except that printing is performed using a lithographic printing plate obtained by the manufacturing method of a lithographic printing plate of the present invention, and a known printing method may be employed.

In the description of the present invention, the printing indicates a series of operations from loading of a lithographic printing plate on a printing machine.

The printing method of the present invention preferably contains no water washing step after manufacture of the lithographic printing plate until starting the printing. In this case, a water washing step, for example, as a preprocessing of printing is not separately provided, so that printing can be performed more easily.

Also, in the printing method of the present invention, it is preferred that the lithographic printing plate manufactured by the manufacturing method of a lithographic printing plate of the present invention is manufactured without passing through a water washing step and printing is performed using the lithographic printing plate without including a water washing step after the manufacture of the lithographic printing plate until starting the printing (in other words, this embodiment means that a lithographic printing plate is manufactured through a development step after the exposure step of a lithographic printing plate precursor and absolutely no water washing step is included until the lithographic printing plate is loaded on a printing machine). Thanks to such an embodiment, printing by use of a lithographic printing plate excellent in developability and dispersibility of development scum and reduced in staining of the non-image area can be more easily performed even by a simple processing of one solution and one step.

EXAMPLES

The present invention is described in greater detail below by referring to Examples, but the present invention should not be construed as being limited thereto. With respect to a polymer compound, the ratio of repeating units is a molar ratio, and the molecular weight is a mass average molecular weight.

<Production of Support 1>

An aluminum plate having a thickness of 0.3 mm was dipped in an aqueous 10 mass % sodium hydroxide solution at 60° C. for 25 seconds to effect etching, washed with running water, neutralized and cleaned with an aqueous 20 mass % nitric acid solution and then washed with water. The aluminum plate was subjected to an electrolytic surface-roughening treatment in an aqueous 1 mass % nitric acid solution by using an alternating current with a sinusoidal waveform at an anode time electricity of 300 coulomb/dm$^2$. Subsequently, the aluminum plate was dipped in an aqueous 1 mass % sodium hydroxide solution at 40° C. for 5 seconds, further dipped in an aqueous 30 mass % sulfuric acid solution to effect a desmutting treatment at 60° C. for 40 seconds, and then anodized in an aqueous 20 mass % sulfuric acid solution for 2 minutes under the condition of a current density of 2 A/dm$^2$ to give an anodic oxide film having a thickness of 2.7 g/m$^2$. The surface roughness thereof was measured and found to be 0.28 µm (Ra indication according to JIS B0601). The thus-obtained support is designated as Support 1.

<Production of Support 2>

Support 1 was further dipped in a treating solution at 53° C. for 10 seconds, the solution being obtained by dissolving 0.4 w % of polyvinylphosphonic acid (produced by PCAS) in pure water, and the excess treating solution was removed by nip rollers. Thereafter, the support was washed with well water at 60° C. containing calcium ion at a concentration of 20 to 400 ppm for 4 seconds and then washed with pure water at 25° C. for 4 seconds, and the excess pure water was removed by nip rollers. In the subsequent drying step, water on the aluminum plate was completely removed. The thus-obtained support is designated as Support 2.

<Preparation of Support 3>

An aluminum plate (material: 1050, refining: H16) having a thickness of 0.24 mm was dipped in an aqueous 5 mass % sodium hydroxide solution kept at 65° C. to effect a degreasing treatment for 1 minute, and then washed with water. The degreased aluminum plate was dipped in an aqueous 10 mass % hydrochloric acid solution kept at 25° C. for 1 minute to effect neutralization and then washed with water. Subsequently, the aluminum plate was subjected to electrolytic surface roughening in an aqueous 0.3 mass % hydrochloric acid solution at 25° C. for 60 seconds by using an alternating current under the condition of a current density of 100 A/dm$^2$ and then to a desmutting treatment in an aqueous 5 mass % sodium hydroxide solution kept at 60° C. for 10 seconds. The surface-roughened aluminum plate after desmutting treatment was anodized in an aqueous 15 mass % sulfuric acid solution at 25° C. for 1 minute under the conditions of a current density of 10 A/dm$^2$ and a voltage of 15 V and then subjected to a hydrophilization treatment using an aqueous 1 mass % polyvinylphosphonic acid solution at 75° C. to produce a support. The surface roughness thereof was measured and found to be 0.44 μm (Ra indication according to JIS B0601). The thus-obtained support was designated as Support 3.

<Production of Support 4>

Support 1 was further dipped in a treatment tank containing an aqueous 1 mass % No. 3 sodium silicate solution at a temperature of 30° C. for 10 seconds to effect a hydrophilization treatment (a silicate treatment) and then water-washed by spraying. The thus-obtained support was designated as Support 4.

[Manufacture of Negative Lithographic Printing Plate Precursor]

<Manufacture of Lithographic Printing Plate Precursor 1>

<Formation of Photosensitive Layer 1>

Photosensitive Layer Coating Solution (1) having the following composition was bar-coated on Support 2 and then dried in an oven at 90° C. for 60 seconds to form Photosensitive Layer 1 having a dry coating amount of 1.3 g/m².

| <Photosensitive Layer Coating Solution (1)> | |
|---|---|
| Binder Polymer (1) shown below (mass average molecular weight: 80,000) | 0.34 g |
| Polymerizable Compound (1) shown below (PLEX6661-O, produced by Degussa Japan) | 0.68 g |
| Sensitizing Dye (1) shown below | 0.06 g |
| Polymerization Initiator (1) shown below | 0.18 g |
| Chain Transfer Agent (1) shown below | 0.02 g |
| Dispersion of ε-phthalocyanine pigment (pigment: 15 parts by mass, dispersant (allyl methacrylate/methacrylic acid copolymer (mass average molecular weight: 60,000, copolymerization molar ratio: 83/17)): 10 parts by mass, cyclohexanone: 15 parts by mass) | 0.40 g |
| Thermal polymerization inhibitor: N-nitrosophenylhydroxylamine aluminum salt | 0.01 g |
| Fluorine-Containing Surfactant (1) shown below (mass average molecular weight: 10,000) | 0.001 g |
| Polyoxyethylene-polyoxypropylene condensate (PLURONIC L44, produced by ADEKA Corp.) | 0.02 g |
| 1-Methoxy-2-propanol | 3.5 g |
| Methyl ethyl ketone | 8.0 g |

Binder Polymer (1)

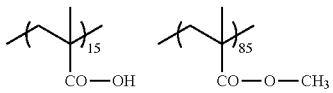

(acid value = 85 mgKOH/g)

Polymerizable Compound (1)

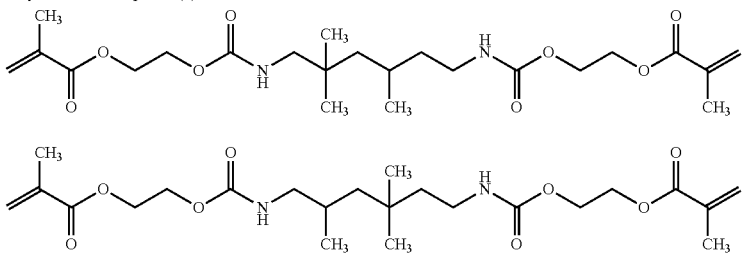

[a mixture of isomers above]

Sensitizing Dye (1)

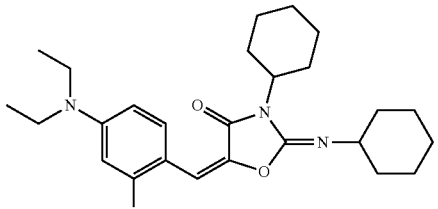

Polymerization Initiator (1)

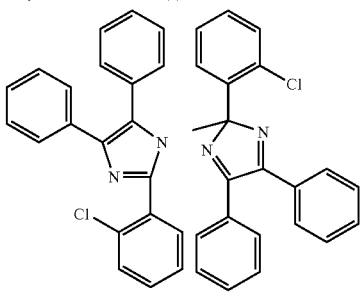

<Photosensitive Layer Coating Solution (1)>

Chain Transfer Agent (1)

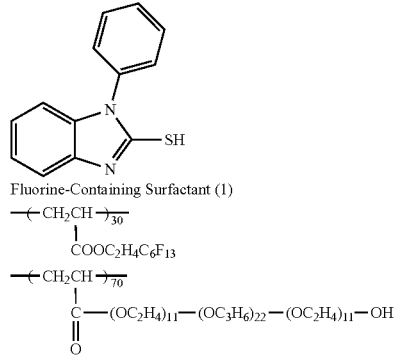

Fluorine-Containing Surfactant (1)

$-(CH_2CH)_{30}-$
    |
    $COOC_2H_4C_6F_{13}$ $-(CH_2CH)_{70}-$
    |
    $C-(OC_2H_4)_{11}-(OC_3H_6)_{22}-(OC_2H_4)_{11}-OH$
    ‖
    O

<Formation of Protective Layer 1>

Protective Layer Coating Solution (1) having the following composition was bar-coated on Photosensitive Layer 1 to have a dry coating amount of 1.5 g/m² and then dried at 125° C. for 70 seconds to form a protective layer, whereby Lithographic Printing Plate Precursor 1 was obtained.

| <Protective Layer Coating Solution (1)> | |
|---|---|
| Mica Liquid Dispersion (1) shown below | 0.6 g |
| Sulfonic acid-modified polyvinyl alcohol: (GOHSERAN CKS-50, produced by The Nippon Synthetic Chemical Industry Co., Ltd. [saponification degree: 99 mol %, average polymerization degree: 300, modification degree: about 0.4 mol %]) | 0.8 g |
| Poly(vinylpyrrolidone/vinyl acetate (1/1)) (molecular weight: 70,000) | 0.001 g |
| Surfactant (Emalex 710, produced by Nihon Emulsion Co., Ltd.) | 0.002 g |
| Water | 13 g |

(Preparation of Mica Liquid Dispersion (1))

32 g of synthetic mica (SOMASIF ME-100, produced by CO—OP Chemical, aspect ratio: 1,000 or more) was added to 368 g of water and dispersed using a homogenizer until the average particle diameter (laser scattering method) became 0.5 μm to obtain Mica Liquid Dispersion (1).

<Manufacture of Lithographic Printing Plate Precursor 2>
<Formation of Photosensitive Layer 2>

Photosensitive Layer Coating Solution (2) having the following composition was bar-coated on Support 3 and then dried in an oven at 90° C. for 60 seconds to form Photosensitive Layer 2 having a dry coating amount of 1.3 g/m².

| <Photosensitive Layer Coating Solution (2)> | |
|---|---|
| Binder Polymer (1) (mass average molecular weight: 50,000) | 0.04 g |
| Binder Polymer (2) shown below (mass average molecular weight: 80,000) | 0.30 g |
| Polymerizable Compound (1) (PLEX 6661-O, produced by Degussa Japan) | 0.17 g |
| Polymerizable Compound (2) shown below | 0.51 g |
| Sensitizing Dye (2) shown below | 0.03 g |
| Sensitizing Dye (3) shown below | 0.015 g |
| Sensitizing Dye (4) shown below | 0.015 g |
| Polymerization Initiator (1) | 0.13 g |
| Chain transfer agent: mercaptobenzothiazole | 0.01 g |
| Dispersion of ε-phthalocyanine pigment (pigment: 15 parts by mass, dispersant (allyl methacrylate/methacrylic acid copolymer (mass average molecular weight: 60,000, copolymerization molar ratio: 83/17)): 10 parts by mass, cyclohexanone: 15 parts by mass) | 0.40 g |
| Thermal polymerization inhibitor: N-nitrosophenylhydroxylamine aluminum salt | 0.01 g |
| Fluorine-Containing Surfactant (1) (mass average molecular weight: 10,000) | 0.001 g |
| 1-Methoxy-2-propanol | 3.5 g |
| Methyl ethyl ketone | 8.0 g |

Binder Polymer (2)

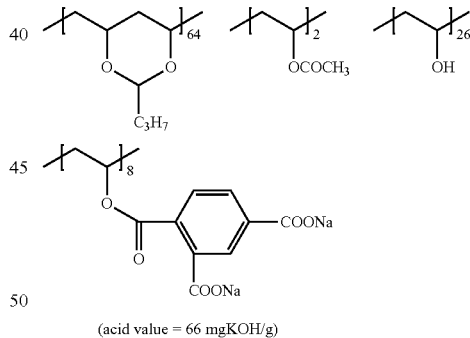

(acid value = 66 mgKOH/g)

Polymerizable Compound (2)

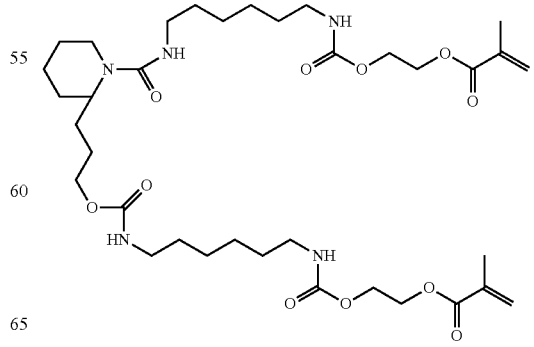

<Photosensitive Layer Coating Solution (2)>

Sensitizing Dye (2)

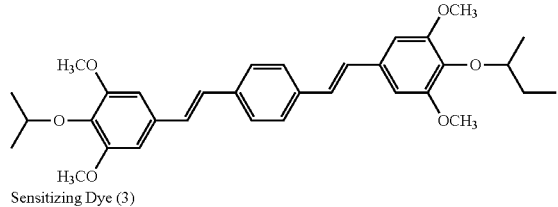

Sensitizing Dye (3)

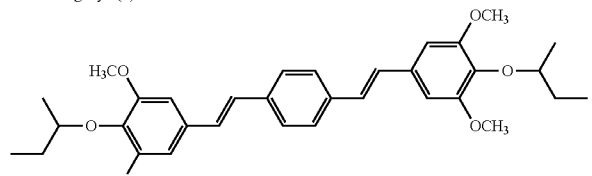

Sensitizing Dye (4)

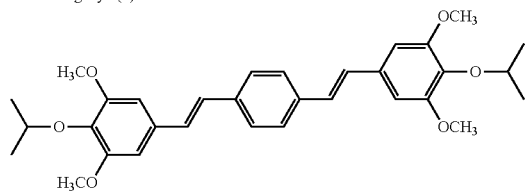

<Formation of Protective Layer 2>

Protective Layer Coating Solution (2) having the following composition was coated on Photosensitive Layer 1 by using a bar to have a dry coating amount of 1.2 g/m² and then dried at 125° C. for 70 seconds to form a protective layer, whereby Lithographic Printing Plate Precursor 2 was obtained.

| <Protective Layer Coating Solution (2)> | |
|---|---|
| PVA-205 (partially hydrolyzed polyvinyl alcohol, produced by Kuraray Co., Ltd., saponification degree = from 86.5 to 89.5 mol %, viscosity = from 4.6 to 5.4 mPa · s (in an aqueous 4 mass % solution at 20° C.)) | 0.658 g |
| PVA-105 (completely hydrolyzed polyvinyl alcohol, produced by Kuraray Co., Ltd., saponification degree = from 98.0 to 99.0 mol %, viscosity = from 5.2 to 6.0 mPa · s (in an aqueous 4 mass % solution at 20° C.)) | 0.142 g |
| Poly(vinylpyrrolidone/vinyl acetate) (molar ratio: 1/1)) (molecular weight: 70,000) | 0.001 g |
| Surfactant (Emalex 710, Nihon Emulsion Co., Ltd.) | 0.002 g |
| Water | 13 g |

<Manufacture of Lithographic Printing Plate Precursor 3>
<Production of Undercoat Layer 1>

Undercoating Solution (1) shown below was coated on Support 4 by using a bar coater and then dried at 80° C. for 15 seconds to produce Undercoat Layer 1. The coating amount of the undercoat layer after drying was 15 mg/m².

| -Undercoat Solution (1)- | |
|---|---|
| β-Alanine | 0.5 g |
| Methanol | 95 g |
| Water | 5 g |

<Formation of Photosensitive Layer 3>

After coating and drying Undercoat Layer (1) on Support 4, a lower layer coating solution having the following composition was coated by a bar coater to have a coating amount of 1.5 g/m², then dried at 160° C. for 44 seconds, and immediately cooled with cold air at 17 to 20° C. until the support temperature decreased to 35° C.

| -Lower Layer Coating Solution- | |
|---|---|
| N-Phenylmaleimide/methacrylic acid/methacrylamide copolymer (compositional ratio: 40/20/40, mass average molecular weight = 50,000) | 1.0 g |
| Cyanine Dye A represented by the structural formula shown below | 0.017 g |
| Crystal Violet (produced by Hodogaya Chemical Co., Ltd.) | 0.015 g |
| Megaface F-177 (produced by DIC Corporation, fluorine-containing surfactant) | 0.05 g |
| γ-Butyl lactone | 10 g |
| Methyl ethyl ketone | 10 g |
| 1-Methoxy-2-propanol | 8 g |

Cyanine Dye A

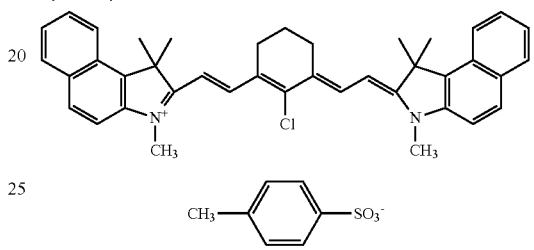

Thereafter, an upper layer coating solution having the following composition was coated by a bar coater to have a coating amount of 0.5 g/m², then dried at 130° C. for 40 seconds, and furthermore, slowly cooled with air at 20 to 26° C. to produce Lithographic Printing Plate Precursor 3.

| -Upper Layer Coating Solution- | |
|---|---|
| Polyurethane Resin (1) shown below | 30.0 g |
| BYK-333 (produced by BYK-Chemie, polyether-modified polydimethylsiloxane) | 0.3 g |
| Ethyl Violet | 0.03 g |
| Megaface F-177 (fluorine-containing surfactant) | 0.05 g |
| 3-Pentanone | 60 g |
| Propylene glycol monomethyl ether acetate | 8 g |

<Polyurethane Resin (1)>

[Synthesis of Polyurethane Resin (1)]

In a 500-ml three-neck flask, the following four kinds of compounds were dissolved in dioxane in the following ratio. After adding 1 g of N,N-diethylaniline, the mixture was stirred under reflux in dioxane for 6 hours. After the reaction, the reaction product was added little by little to a solution containing 4 L of water and 40 ml of acetic acid, thereby precipitating a polymer. This solid was dried in vacuum to obtain 185 g of Polyurethane Resin (1). The acid content thereof was 2.47 meq/g. The molecular weight was measured by GPC, as a result, the mass average molecular weight (polystyrene standard) was 28,000.

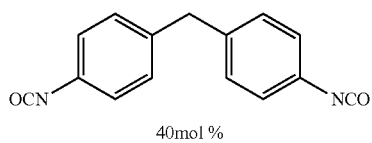

40mol %

-continued

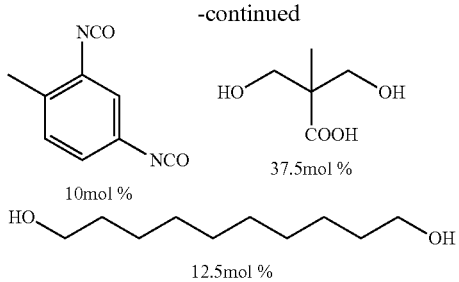

10mol %  37.5mol %

12.5mol %

<Manufacture of Lithographic Printing Plate Precursor 4>
<Formation of Undercoat Layer 2>

Undercoating Solution (2) having the following composition was bar-coated on Support 1 and then dried in an oven at 80° C. for 20 seconds to have a dry coating amount of 10 mg/m², whereby Undercoat Layer 2 was formed.

| Undercoating Solution (2): | |
| --- | --- |
| Sol solution shown below | 100 g |
| Methanol | 900 g |
| Sol Solution: | |
| Phosmer PE (produced by Unichemical Co., Ltd.) | 5 g |
| Methanol | 45 g |
| Water | 10 g |
| Aqueous 85 mss % phosphoric acid solution | 5 g |
| Tetraethoxysilane | 20 g |
| 3-Methacryloxypropyltrimethoxysilane | 15 g |

After coating and drying Undercoat Layer 2, Photosensitive Layer Coating Solution (4) having the following composition was bar-coated and then dried in an oven at 90° C. for 60 seconds to form Photosensitive Layer 4 having a dry coating amount of 1.3 g/m².
<Formation of Photosensitive Layer 4>

| <Photosensitive Layer Coating Solution (4)> | |
| --- | --- |
| Binder Polymer (1) (mass average molecular weight: 80,000) | 0.34 g |
| Polymerizable Compound (1) (PLEX 6661-O, produced by Degussa Japan) | 0.68 g |
| Sensitizing Dye (1) | 0.06 g |
| Polymerization Initiator (1) | 0.18 g |
| Chain Transfer Agent (2) shown below | 0.02 g |
| Dispersion of ε-phthalocyanine pigment (pigment: 15 parts by mass, dispersant (allyl methacrylate/methacrylic acid copolymer (mass average molecular weight: 60,000, copolymerization molar ratio: 83/17)): 10 parts by mass, cyclohexanone: 15 parts by mass) | 0.40 g |
| Thermal polymerization inhibitor: N-nitrosophenylhydroxylamine aluminum salt | 0.01 g |
| Fluorine-Containing Surfactant (1) (mass average molecular weight: 10,000) | 0.001 g |
| Polyoxyethylene-polyoxypropylene condensate (PLURONIC L44, produced by ADEKA Corp.) | 0.02 g |
| 1-Methoxy-2-propanol | 3.5 g |
| Methyl ethyl ketone | 8.0 g |

Chain Transfer Agent (2)

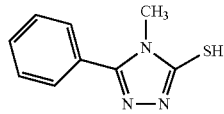

Protective Layer Coating Solution (3) having the following composition was coated on Photosensitive Layer 4 by using a bar to have a dry coating amount of 1.5 g/m² and then dried at 125° C. for 70 seconds to form a protective layer, whereby Lithographic Printing Plate Precursor 4 was obtained.

| <Protective Layer Coating Solution (3)> | |
| --- | --- |
| Polyvinyl alcohol (saponification degree: 98 mol %, polymerization degree: 500) | 44 g |
| Polyvinylpyrrolidone (mass average molecular weight: 50,000) | 1 g |
| Poly(vinylpyrrolidone/vinyl acetate (molar ratio: 1/1)) (mass average molecular weight: 70,000) | 0.5 g |
| Surfactant (Emalex 710, produced by Nihon Emulsion Co., Ltd.) | 0.5 g |
| Surfactant (Pionin D230, produced by Takemoto Oil & Fat Co., Ltd.) | 0.5 g |
| Water | 950 g |

<Manufacture of Lithographic Printing Plate Precursor 5>
<Formation of Undercoat Layer 3>

Undercoating Solution (3) having the following composition was coated on Support 1 by using a bar coater and then dried at 80° C. for 15 seconds to produce Undercoat Layer 3. The coating amount of the undercoat layer after drying was 15 mg/m².

| Undercoat Solution (3): | |
| --- | --- |
| Polymer (SP1) shown below | 0.87 g |
| Polymer (SP2) shown below | 0.73 g |
| Pure water | 1000.0 g |

Polymer (SP1)

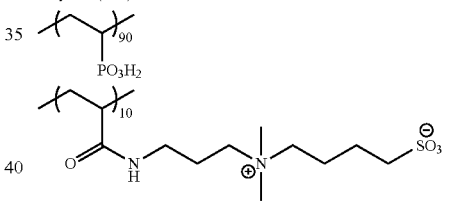

Polymer (SP2)

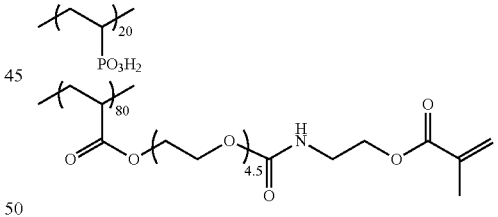

<Formation of Photosensitive Layer 5>

Photosensitive Layer Coating Solution (5) having the following composition was bar-coated on Undercoat Layer 3 and dried in a hot air drying apparatus at 125° C. for 34 seconds to form Photosensitive Layer 5 having a dry coating amount of 1.4 g/m².

| <Photosensitive Layer Coating Solution (5)> | |
| --- | --- |
| Infrared Absorber (IR-1) shown below | 0.038 g |
| Polymerization Initiator A (S-1) shown below | 0.061 g |
| Polymerization Initiator B (I-2) shown below | 0.094 g |
| Mercapto Compound (E-1) shown below | 0.015 g |
| Polymerizable Compound (M-2) (A-BPE-4, trade name, produced by Shin-Nakamura Chemical Co., Ltd.) | 0.629 g |

| <Photosensitive Layer Coating Solution (5)> | |
|---|---|
| Binder Polymer (B-1) shown below | 0.419 g |
| Additive (T-1) shown below | 0.079 g |
| Thermal polymerization inhibitor (Q-1) | 0.0012 g |
| Ethyl Violet (EV-1) | 0.021 g |
| Fluorine-Containing Surfactant (1) (mass average molecular weight: 10,000) | 0.0081 g |
| Methyl ethyl ketone | 5.886 g |
| Methanol | 2.733 g |
| 1-Methoxy-2-propanol | 5.886 g |

Structures of Infrared Absorber (IR-1), Polymerization Initiator A (S-1), Polymerization Initiator B (I-2), Mercapto Compound (E-1), Polymerizable Compound (M-2), Binder (B-1), Additive (T-1), Polymerization Inhibitor (Q-1), and Ethyl Violet (EV-1) used in Photosensitive Layer Coating Solution (5) are shown below.

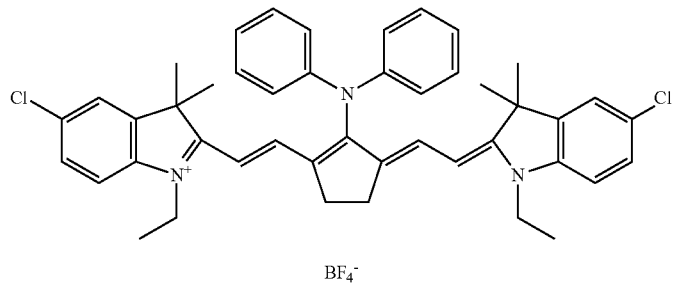
(IR-1)

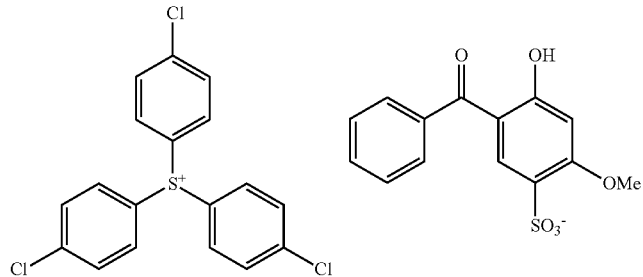
(S-1)

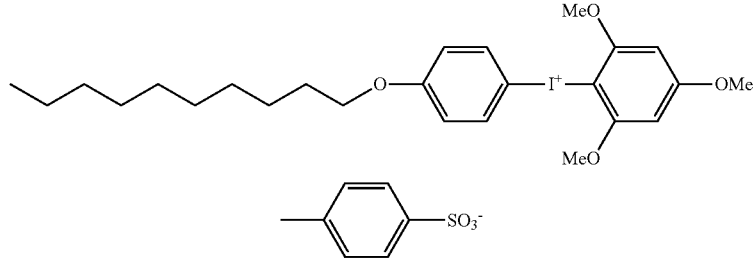
(I-2)

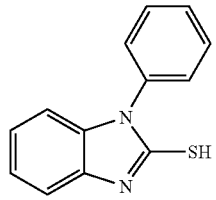
(E-1)

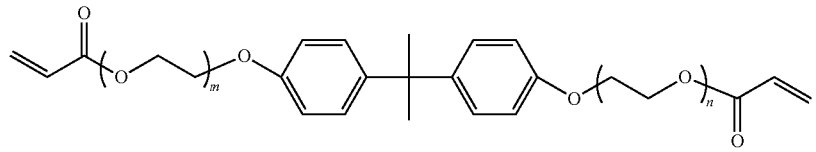
(M-2)

$m + n = 4$

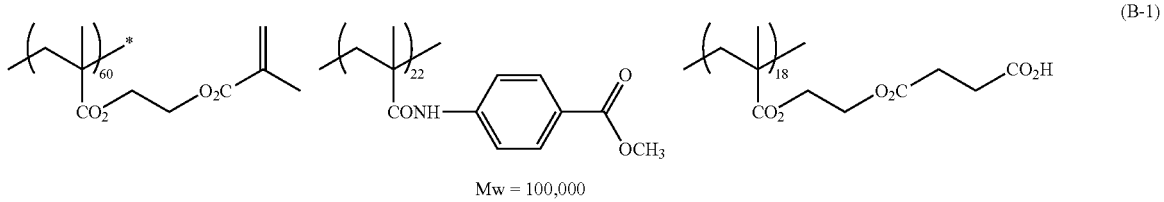

(B-1)

Mw = 100,000

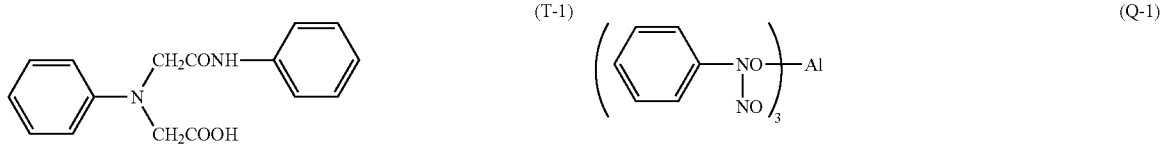

(T-1)    (Q-1)

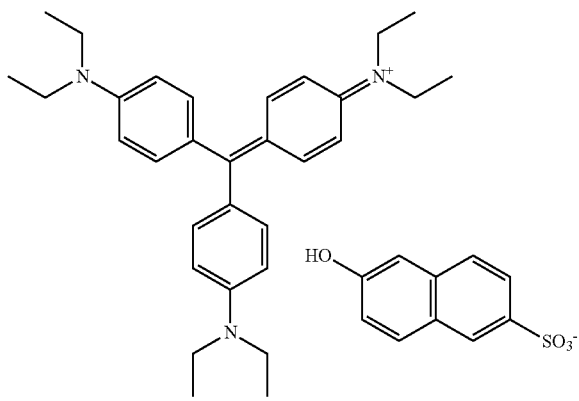

(EV-1)

Protective Layer Coating Solution (1) was coated on Photosensitive Layer 5 by using a bar to have a dry coating amount of 1.2 g/m² and then dried at 125° C. for 70 seconds to form Protective Layer (1), whereby Lithographic Printing Plate Precursor 5 was obtained.

<Manufacture of Lithographic Printing Plate Precursor 6>

Lithographic Printing Plate Precursor 6 was obtained in the same manner as Lithographic Printing Plate Precursor 1 except for changing the support of Lithographic Printing Plate Precursor 1 to Support 3 from Support 2.

<Manufacture of Lithographic Printing Plate Precursor 7>

Lithographic Printing Plate Precursor 7 was obtained in the same manner as Lithographic Printing Plate Precursor 3 except for changing the support of Lithographic Printing Plate Precursor 3 to Support 1 from Support 4.

<Production of Developer>

A developer having the following composition was produced to obtain Developer CD-1.

| | |
|---|---|
| Enzyme-decomposed dextrin (Amycol 1B, produced by Nippon Starch Chemical Co., Ltd., mass average molecular weight: 3,000) | 650 g |
| Surfactant-1 (Softazoline LPB-R, produced by Kawaken Fine Chemicals Co., Ltd.) | 400 g |
| Surfactant-2 (Softazoline LAO, produced by Kawaken Fine Chemicals Co., Ltd.) | 100 g |
| Sodium carbonate | 88 g |
| Sodium hydrogencarbonate | 37 g |
| Sodium gluconate | 50 g |
| Monobasic ammonium phosphate | 20 g |
| 2-Bromo-2-nitropropane-1,3-diol | 0.025 g |
| 2-Methyl-4-isothiazolin-3-one | 0.025 g |
| Chelating agent: trisodium ethylenediaminesuccinate (Octaquest E30, produced by InnoSpec specialty chemicals) | 20 g |
| Silicone-based antifoaming agent (TSA739, produced by GE Toshiba Silicones Co., Ltd.) | 2 g |
| Water | 8,632.8 g |

*The developer having the composition above was adjusted to a pH of 9.8 by appropriately adding phosphoric acid.

Developers containing the sugar or water-soluble compound shown in Table 1 below were produced to obtain Developers CD-2 to CD-6, CD-22, and D-1 to D-11.

Developers having the composition and pH shown in Table 2 below were produced to obtain Developers CD-7 to CD-9 and D-12 to D-14.

Developers having the composition and pH shown in Table 3 below were produced to obtain Developers CD-10 to CD-18 and D-15 to D-21.

Developers having the composition and pH shown in Table 4 below were produced to obtain Developers CD-19, CD-20, D-26 to D-31, and D-40 to D-44.

Developers having the composition and pH shown in Table 5 below were produced to obtain Developers CD-21 and D-32 to D-39.

TABLE 1

Developers CD-2 to CD-6, CD-22, and D-1 to D-11 (unit: g)

| | Component | CD-2 | CD-3 | CD-4 | CD-5 | CD-6 | CD-22 | D-1 | D-2 | D-3 | D-4 | D-5 | D-6 | D-7 | D-8 | D-9 | D-10 | D-11 |
|---|---|---|---|---|---|---|---|---|---|---|---|---|---|---|---|---|---|---|
| Sugar or water-soluble polymer compound | Petrocoat HN-25 | 650 | | | | | | | | | | | | | | | | |
| | Gum arabic | | 650 | | | | | | | | | | | | | | | |
| | Glucose | | | 650 | | | | | | | | | | | | | | |
| | Mannitol | | | | 650 | | | | | | | | | | | | | |
| | Sorbitol | | | | | 650 | | | | | | | | | | | | |
| | Sucrose | | | | | | | 650 | | | | | | | | | | |
| | Trehalose | | | | | | | | 650 | | | | | | | | | |
| | Raffinose | | | | | | | | | 650 | | | | | | | | |
| | Melezitose | | | | | | | | | | 650 | | | | | | | |
| | Stachyose | | | | | | | | | | | 650 | | | | | | |
| | S-1 | | | | | | | | | | | | 650 | | | | | |
| | S-2 | | | | | | | | | | | | | 650 | | | | |
| | S-3 | | | | | | | | | | | | | | 650 | | | |
| | S-4 | | | | | | | | | | | | | | | 650 | | |
| | HS-20 | | | | | | | | | | | | | | | | 650 | |
| | S-5 | | | | | | | | | | | | | | | | | 650 |
| | PVA-405 | | | | | | 650 | | | | | | | | | | | |
| Components other than those above | | Same as Developer CD-1 except for using the sugar or water-soluble polymer compound above in place of Amycol 1B (enzyme-decomposed dextrin) | | | | | | | | | | | | | | | | |
| pH of Developer | | 9.8 | 9.8 | 9.8 | 9.8 | 9.8 | 9.8 | 9.8 | 9.8 | 9.8 | 9.8 | 9.8 | 9.8 | 9.8 | 9.8 | 9.8 | 9.8 | 9.8 |

Petrocoat HN-25: phosphoric acid-modified starch (produced by Nippon Starch Chemical Co., Ltd.)
S-1: A mixture of compounds where in the following formula (X), n = 4.
S-2: A compound where in the following formula (X), n = 6.
S-3: A compound where in the following formula (X), n = 30.
S-4: A compound where in the following formula (X), n = 60.
S-5: A phosphoric acid-modified starch reduction body obtained by using Bribine produced by Nippon Starch Chemical Co., Ltd. as phosphoric acid-modified starch and applying a reduction treatment with use of $NaBH_4$ as the reducing agent (in the following Tables, the same).
HS-20: Reduced starch saccharification product (produced by Hayashibara Co., Ltd.) (in the following Tables, the same)
PVA-405: Polyvinyl alcohol (produced by Kuraray Co., Ltd.)

(X)

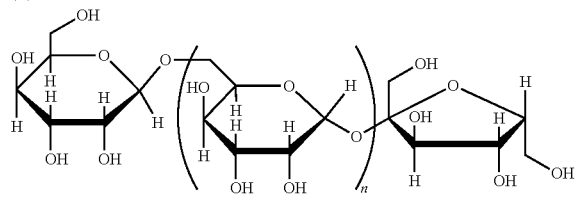

TABLE 2

Developers CD-7 to CD-9 and D-12 to D-14 (unit: g)

| | Component | CD-7 | CD-8 | CD-9 | D-12 | D-13 | D-14 |
|---|---|---|---|---|---|---|---|
| Sugar | Gum arabic | 5 | 5 | 5 | | | |
| | HS-20 | | | | 5 | 5 | 5 |
| Surfactant | Polyoxy naphthyl ether (Newcol B13, produced by Nippon Nyukazai Co., Ltd.) | 10 | 10 | 10 | 10 | 10 | 10 |
| Solvent | Benzyl alcohol | 10 | 10 | 10 | 10 | 10 | 10 |
| Chelating agent | Tetrasodium ethylene-diaminetetraacetate | 0.5 | 0.5 | 0.5 | 0.5 | 0.5 | 0.5 |
| Others | Sodium salt of dioctylsulfosuccinic acid ester | 5 | 5 | 5 | 5 | 5 | 5 |
| | Ethylene glycol | 5 | 5 | 5 | 5 | 5 | 5 |
| | Monobasic ammonium phosphate | 0.5 | 0.5 | 0.5 | 0.5 | 0.5 | 0.5 |
| | Citric acid | 0.5 | 0.5 | 0.5 | 0.5 | 0.5 | 0.5 |
| | Water | 1000 | 1000 | 1000 | 1000 | 1000 | 1000 |
| pH of Developer (adjusted with 1 mass % KOH) | | 14 | 12 | 11 | 14 | 12 | 11 |

TABLE 3

Developers CD-10 to CD-18 and D-15 to D-21 (unit: g)

| | Component | CD-10 | CD-11 | CD-12 | CD-13 | CD-14 | CD-15 | CD-16 | CD-17 | D-15 | D-16 | D-17 | D-18 | D-19 | D-20 | D-21 | CD-18 |
|---|---|---|---|---|---|---|---|---|---|---|---|---|---|---|---|---|---|
| Kind | Gum arabic | 650 | 650 | 650 | 650 | 650 | 650 | 650 | 650 | | | | | | | | |
| | HS-20 | | | | | | | | | 650 | 650 | 650 | 650 | 650 | 650 | 650 | 650 |
| Components other than those above | | Same as Developer CD-1 except for using the sugar above in place of Amycol 1B (enzyme-decomposed dextrin) | | | | | | | | | | | | | | | |
| pH of Developer (adjusted with an aqueous phosphoric acid solution) | | 11 | 10 | 9.0 | 7.0 | 6.8 | 6.5 | 6.0 | 5.5 | 11 | 10 | 9.0 | 7.0 | 6.8 | 6.5 | 6.0 | 5.5 |

TABLE 4

Developers CD-19, CD-20, D-26 to D-31 and D-40 to D-44 (unit: g)

| | Component | CD-19 | D-26 | D-27 | D-28 | D-40 | D-41 | D-42 | D-43 | D-44 | CD-20 | D-29 | D-30 | D-31 |
|---|---|---|---|---|---|---|---|---|---|---|---|---|---|---|
| Kind | Gum arabic | 650 | | | | | | | | | 650 | | | |
| | Raffinose | | 650 | | | | | | | | | 650 | | |
| | HS-20 | | | 650 | | 650 | 650 | 650 | 650 | 650 | | | 650 | |
| | S-5 | | | | 650 | | | | | | | | | 650 |
| Surfactant | Alkyldiphenylether disulfonate (Eleminol MON2, produced by Sanyo Chemical Industries, Ltd.) | 500 | 500 | 500 | 500 | 500 | 500 | 500 | 500 | 500 | | | | |
| | Polyoxy naphthyl ether (Newcol B13, produced by Nippon Nyukazai Co., Ltd.) | | | | | | | | | | 500 | 500 | 500 | 500 |
| Components other than those above | | Same as Developer CD-1 except for using the sugar and surfactant above in place of Amycol 1B (enzyme-decomposed dextrin), Surfactant-1 and Surfactant-2 | | | | | | | | | | | | |
| pH of Developer (adjusted with an aqueous phosphoric acid solution) | | 9.8 | 9.8 | 9.8 | 9.8 | 10 | 9.0 | 7.0 | 6.8 | 6.0 | 9.8 | 9.8 | 9.8 | 9.8 |

TABLE 5

Developers CD-21 and D-32 to D-39 (unit: g)

| | Component | CD-21 | D-32 | D-33 | D-34 | D-35 | D-36 | D-37 | D-38 | D-39 |
|---|---|---|---|---|---|---|---|---|---|---|
| Kind | Gum arabic | 650 | | | | | | | | |
| | Raffinose | | 650 | | | | | | | |
| | HS-20 | | | 650 | | 650 | 650 | 650 | 650 | 650 |
| | S-5 | | | | 650 | | | | | |
| Surfactant | Compound (W-1) | 250 | 250 | 250 | 250 | 250 | 250 | 250 | 250 | 250 |
| | Compound (W-2) | 250 | 250 | 250 | 250 | 250 | 250 | 250 | 250 | 250 |
| pH Buffer | Diethanolamine | 100 | 100 | 100 | 100 | 100 | 100 | 100 | 100 | 100 |
| | Triethanolamine | 200 | 200 | 200 | 200 | 200 | 200 | 200 | 200 | 200 |
| | Phosphoric acid | to make pH below | to make pH below | to make pH below | to make pH below | to make pH below | to make pH below | to make pH below | to make pH below | to make pH below |
| Others | Sodium gluconate | 50 | 50 | 50 | 50 | 50 | 50 | 50 | 50 | 50 |
| | Monobasic ammonium phosphate | 20 | 20 | 20 | 20 | 20 | 20 | 20 | 20 | 20 |
| | 2-Bromo-2-nitropropane-1,3-diol | 0.1 | 0.1 | 0.1 | 0.1 | 0.1 | 0.1 | 0.1 | 0.1 | 0.1 |
| | 2-Methyl-4-isothiazolin-3-one | 0.1 | 0.1 | 0.1 | 0.1 | 0.1 | 0.1 | 0.1 | 0.1 | 0.1 |
| | Ethylenediamine disuccinate | 20 | 20 | 20 | 20 | 20 | 20 | 20 | 20 | 20 |

TABLE 5-continued

Developers CD-21 and D-32 to D-39 (unit: g)

| Component | Developer | | | | | | | | |
|---|---|---|---|---|---|---|---|---|---|
| | CD-21 | D-32 | D-33 | D-34 | D-35 | D-36 | D-37 | D-38 | D-39 |
| Defoaming agent (TSA739, produced by Toshiba Silicones Co., Ltd.) | 2 | 2 | 2 | 2 | 2 | 2 | 2 | 2 | 2 |
| Water | 8632.8 | 8632.8 | 8632.8 | 8632.8 | 8632.8 | 8632.8 | 8632.8 | 8632.8 | 8632.8 |
| pH of Developer | 6.9 | 6.9 | 6.9 | 6.9 | 10 | 9.0 | 7.0 | 6.8 | 6.0 |

(W-1)

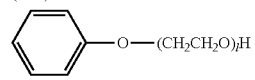

$l = 13-28$ (W-2)

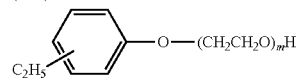

$m = 12-26$

Examples 1 to 47 and Comparative Examples 1 to 27

(1) Exposure, Development and Printing
[Exposure of Negative Lithographic Printing Plate Precursor]

Each of Lithographic Printing Plate Precursors 1, 2, 4 and 6 was imagewise exposed using Violet Semiconductor Laser Plate Setter Vx9600 manufactured by FUJIFILM Electronic Imaging Ltd. (equipped with an InGaN-based semiconductor laser, emission: 405 nm±10 nm/output: 30 mW). Image drawing was performed using an FM screen (TAFFETA 20) manufactured by Fujifilm Corporation at a resolution of 2,438 dpi under the conditions of a halftone dot of 50% and a plate surface exposure amount of 0.03 mJ/cm$^2$ (Exposure Condition 1).

Lithographic Printing Plate Precursor 5 was imagewise exposed by Trendsetter 3244VX manufactured by Creo Co. equipped with a water-cooled 40 W infrared semiconductor laser under the conditions of an output of 9 W, an external drum rotation speed of 210 rpm and a resolution of 2,400 dpi. The exposure was performed by using a square dot of 50% as the exposure pattern and setting the plate surface exposure amount to 60 mJ/cm$^2$ (Exposure Condition 2).

[Development of Negative Lithographic Printing Plate Precursor]

Lithographic Printing Plate Precursors 1, 2, 5 and 6 were developed as follows.

The development processing was performed using the developer shown in Table 6 in an automatic developing processor having a structure shown in FIG. 1 at such a transport speed that the preheating time at 100° C. becomes 10 seconds and the immersion time in the developer (developing time) becomes 20 seconds. The plate surface temperature after passing through the drying unit was adjusted to become 80° C. as measured by a radiation thermometer in a non-contact manner, and the achieving temperature in the center of the plate surface after passing through the drying unit was adjusted to become 40° C. as measured by a radiation thermometer in a non-contact manner. The heating time (time spent at passing through the drying unit) was 7.4 seconds (Development Condition 1).

Lithographic Printing Plate Precursor 4 was developed as follows. The development processing was performed in an automatic developing processor having a structure shown in FIG. 2 by charging the developer shown in Table 6 not only to the developing bath but also to the finisher unit, setting the transport speed such that the total of the dipping time in the developer in the developing bath and the time spent in receiving supply of the developer in the finisher unit (development time) becomes 20 seconds, and operating a transport roller pair and a drying apparatus in a water washing Off mode. Other settings were the same as in Development Condition 1 (Development Condition 2).

[Exposure of Positive Lithographic Printing Plate Precursor]

Lithographic Printing Plate Precursors 3 and 7 were exposed using an exposure apparatus (TRENDSETTER F, manufactured by Kodak) (laser power: 8.5 W, rotation speed: 185 rpm) (Exposure Condition 3).

The exposure was performed by using a square dot of 50% as the exposure pattern and setting the plate surface exposure amount to 100 mJ/cm$^2$.

[Development of Positive Lithographic Printing Plate Precursor]

Lithographic Printing Plate Precursors 3 and 7 were developed using the developer shown in Table 6 under Development Condition 1.

[Printing]

The lithographic printing plate after development was loaded on a printing machine, SOR-M, manufactured by Heidelberger, and printing was performed using a fountain solution (EU-3 (etchant, produced by Fujifilm Corporation)/water/isopropyl alcohol=1/89/10 (by volume)) and black ink TRANS-G(N) (produced by Dainippon Ink and Chemicals, Inc.), at a printing speed of 6,000 sheets per hour.

(2) Evaluation

<pH of Developer>

In order to evaluate the fluctuation with aging of pH of the developer, the pH of the developer was measured using a pH meter immediately after preparation and after passing of 2 months in dark place at room temperature from the preparation.

[Film-Forming Property]
<Scratch Staining Propensity of Non-Image Area>

As an index of the film-forming ability on the support surface owing to the sugar or water-soluble polymer compound contained in the developer, a scratch staining propensity of the lithographic printing plate surface after development processing was evaluated. In the evaluation of scratch resistance, a 0.3 R diamond needle was fixed to a scratching tester manufactured by Shinto Scientific Co., Ltd., and the plate surface after processing with the developer shown in Tables 1 to 5 was scratched under a load of 20 g, 50 g, 75 g, 100 g, 150 g, and 200 g. Subsequently, the scratched lithographic printing plate was loaded on a printing machine, SOR-M, manufactured by Heidelberger, and printing was performed using a fountain solution (EU-3 (etchant, produced by Fujifilm Corporation)/water/isopropyl alcohol=1/89/10 (by volume)) and black ink TRANS-G(N) (produced by Dainippon Ink and Chemicals, Inc.), at a printing speed of 6,000 sheets per hour. The presence or absence of staining due to each scratch was examined, and the g of load under which scratch staining is generated was evaluated.

<Stickiness>

As an index of the film-forming ability on the support surface owing to the sugar or water-soluble polymer compound contained in the developer, sensory evaluation of stickiness on the lithographic printing plate surface after development processing was performed based on the following criteria.

As for stickiness of the plate, each developer was charged into an automatic developing processor, and the surface of the final lithographic printing plate precursor after processing of 500 m$^2$ was touched with a hand to sensorily evaluate the stickiness. The stickiness on the plate surface was evaluated by 10 operators. The plate was rated A when with respect to 10 operators, the number of operators judged as unpleasant stickiness was 2 out of 10, rated B when from 3 to 4 out of 10, and rated C when 5 or more out of 10.

[Printing Plate Performance]
<Developability>

According to the combination shown in Table 6, Lithographic Printing Plate Precursors 1 to 7 were exposed as above and developed using Developers CD-1 to CD-22, D-1 to D-21 and D-26 to D-44. After the development processing, the non-image area of the lithographic printing plate was checked with an eye, and remaining of the image recording layer (photosensitive layer) was evaluated. This evaluation was performed (1) immediately after preparation of the developer, (2) after standing still for 2 months in dark plate at room temperature from the preparation of developer, and (3) after 20 m$^2$ development processing (running processing) of the lithographic printing plate precursor per 1 liter of developer by using the developer after standing still for 2 months in dark place at room temperature from the preparation of developer.

Evaluation was made according to the following criteria:

A: good developability with no remaining of photosensitive layer, B: slight remaining of photosensitive layer but no problem in developability, and C: development failure with remaining of photosensitive layer.

<Dispersibility of Development Scum>

The non-image area of the lithographic printing plate subjected to development processing using the developer after running processing in the evaluation of developability above was checked with an eye, and the presence or absence of attachment of development scum was evaluated.

Evaluation was made according to the following criteria:

A: no visible scum attachment per 1 m$^2$; B: from 1 to 3 visible scum attachments per 1 m$^2$; and C: 4 or more visible scum attachments per 1 m$^2$.

[Printing Performance]
<Stain Resistance>

The lithographic printing plate used in the evaluation of developability above was subjected to printing as described above, and first 500 printed matters were evaluated for staining propensity of the non-image area.

The staining propensity of the non-image area was evaluated by rating:

C: when the non-image area of 500th sheet has ink staining,

B: when the non-image area of 100th sheet has ink staining and the non-image area of 500th sheet has no ink staining, A: when the non-image area of 30th sheet has ink staining and the non-image area of 100th sheet has no ink staining, and AA: when the non-image area of 30th sheet has no ink staining.

These evaluation results are shown in Table 6.

TABLE 6

| Example | Developer | pH (immediately after preparation) | pH Stability pH (after 2 months) | Printing Plate Precursor Evaluated | Film-Forming Property | | Developability | | | Dispersibility of Development Scum | Stain Resistance | | |
|---|---|---|---|---|---|---|---|---|---|---|---|---|---|
| | | | | | Scratch Staining (g) of Non-Image Area | Stickiness | Immediately after Preparation | After Standing Still for 2 Months | Standing Still for 2 Months + Running Processing | | Immediately after Preparation | After Standing Still for 2 Months | Standing Still for 2 Months + Running Processing |
| Comparative Example 1 | Developer CD-1 | 9.8 | 8.5 | 1 | 100 | A | A | C | C | C | A | C | C |
| Comparative Example 2 | Developer CD-2 | 9.8 | 8.5 | 1 | 150 | A | A | C | C | C | A | C | C |
| Comparative Example 3 | Developer CD-3 | 9.8 | 8.5 | 1 | 200< | A | A | B | C | C | AA | B | C |
| Comparative Example 4 | Developer CD-4 | 9.8 | 8.0 | 1 | 20 | C | A | C | C | C | A | C | C |
| Comparative Example 5 | Developer CD-5 | 9.8 | 9.8 | 1 | 20 | C | A | A | A | A | A | B | C |
| Comparative Example 6 | Developer CD-6 | 9.8 | 9.8 | 1 | 20 | C | A | A | A | A | A | C | C |
| Example 1 | Developer D-1 | 9.8 | 9.8 | 1 | 50 | B | A | A | A | A | A | B | B |
| Example 2 | Developer D-2 | 9.8 | 9.8 | 1 | 50 | B | A | A | A | A | A | B | B |
| Example 3 | Developer D-3 | 9.8 | 9.8 | 1 | 75 | A | A | A | A | A | A | A | A |
| Example 4 | Developer D-4 | 9.8 | 9.8 | 1 | 75 | A | A | A | A | A | A | A | A |
| Example 5 | Developer D-5 | 9.8 | 9.8 | 1 | 100 | A | A | A | A | A | A | A | A |
| Example 6 | Developer D-6 | 9.8 | 9.8 | 1 | 150 | A | A | A | A | A | A | A | AA |
| Example 7 | Developer D-7 | 9.8 | 9.8 | 1 | 150 | A | A | A | A | A | AA | AA | AA |
| Example 8 | Developer D-8 | 9.8 | 9.8 | 1 | 200 | A | A | A | A | A | AA | AA | AA |
| Example 9 | Developer D-9 | 9.8 | 9.8 | 1 | 200< | A | A | A | A | A | AA | AA | AA |
| Example 10 | Developer D-10 | 9.8 | 9.8 | 1 | 150 | A | A | A | A | A | AA | AA | AA |
| Example 11 | Developer D-11 | 9.8 | 9.8 | 1 | 150 | A | A | A | A | A | AA | AA | AA |
| Comparative Example 7 | Developer CD-7 | 14 | 11 | 4 | 200< | A | A | B | C | B | AA | B | C |
| Comparative Example 8 | Developer CD-8 | 12 | 10 | 4 | 200< | A | A | B | B | B | AA | C | C |
| Comparative Example 9 | Developer CD-9 | 11 | 9.5 | 4 | 200< | A | A | C | C | C | AA | C | C |
| Comparative Example 10 | Developer CD-10 | 11 | 9.5 | 1 | 150 | A | A | A | A | A | AA | A | B |
| Comparative Example 11 | Developer CD-11 | 10 | 8.7 | 1 | 150 | A | A | B | B | B | A | B | C |

TABLE 6-continued

| Example | Developer | pH (immediately after preparation) | pH Stability pH (after 2 months) | Printing Plate Precursor Evaluated | Film-Forming Property | | Developability | | | Dispersibility of Development Scum | Stain Resistance | | |
|---|---|---|---|---|---|---|---|---|---|---|---|---|---|
| | | | | | Scratch Staining (g) of Non-Image Area | Stickiness | Immediately after Preparation | After Standing Still for 2 Months | Standing Still for 2 Months + Running Processing | | Immediately after Preparation | After Standing Still for 2 Months | Standing Still for 2 Months + Running Processing |
| Comparative Example 12 | Developer CD-12 | 9.0 | 7.5 | 1 | 150 | A | A | B | B | B | AA | B | C |
| Comparative Example 13 | Developer CD-13 | 7.0 | 6.2 | 1 | 150 | A | B | B | B | B | B | B | C |
| Comparative Example 14 | Developer CD-14 | 6.8 | 6.0 | 1 | 150 | A | B | B | B | B | B | B | C |
| Comparative Example 15 | Developer CD-15 | 6.5 | 6.0 | 1 | 150 | A | B | B | B | B | B | B | B |
| Comparative Example 16 | Developer CD-16 | 6.0 | 5.7 | 1 | 150 | A | B | B | B | B | B | B | B |
| Comparative Example 17 | Developer CD-17 | 5.5 | 5.5 | 1 | 150 | A | C | C | C | C | B | B | C |
| Example 12 | Developer D-12 | 14 | 13.8 | 4 | 150 | A | A | A | A | A | AA | A | A |
| Example 13 | Developer D-13 | 12 | 11.8 | 4 | 150 | A | A | A | A | A | AA | A | A |
| Example 14 | Developer D-14 | 11 | 11 | 4 | 150 | A | A | A | A | A | AA | A | A |
| Example 15 | Developer D-15 | 11 | 11 | 1 | 150 | A | A | A | A | A | AA | A | B |
| Example 16 | Developer D-16 | 10 | 10 | 1 | 150 | A | A | A | A | A | AA | AA | AA |
| Example 17 | Developer D-17 | 9.0 | 9.0 | 1 | 150 | A | A | A | A | A | A | A | A |
| Example 18 | Developer D-18 | 7.0 | 7.0 | 1 | 150 | A | B | B | A | A | A | A | A |
| Example 19 | Developer D-19 | 6.8 | 6.8 | 1 | 150 | A | B | B | A | A | A | A | C |
| Example 20 | Developer D-20 | 6.5 | 6.5 | 1 | 150 | A | B | B | B | B | A | A | C |
| Example 21 | Developer D-21 | 6.0 | 6.0 | 1 | 150 | A | B | B | B | B | B | B | C |
| Comparative Example 18 | Developer CD-18 | 5.5 | 5.5 | 1 | 150 | A | C | C | C | B | B | B | C |

TABLE 7

| Example | Developer | pH (immediately after preparation) | pH Stability pH (after 2 months) | Printing Plate Precursor Evaluated | Film-Forming Property: Scratch Staining (g) of Non-Image Area | Film-Forming Property: Stickiness | Developability: Immediately after Preparation | Developability: After Standing Still for 2 Months | Developability: Standing Still for 2 Months + Running Processing | Dispersibility of Development Scum | Stain Resistance: Immediately after Preparation | Stain Resistance: After Standing Still for 2 Months | Stain Resistance: Standing Still for 2 Months + Running Processing |
|---|---|---|---|---|---|---|---|---|---|---|---|---|---|
| Comparative Example 19 | Developer CD-19 | 9.8 | 8.5 | 1 | 200< | A | A | B | C | C | A | B | C |
| Example 22 | Developer D-26 | 9.8 | 9.8 | 1 | 75 | A | A | A | A | A | A | A | A |
| Example 23 | Developer D-27 | 9.8 | 9.8 | 1 | 150 | A | A | A | A | A | A | A | A |
| Example 24 | Developer D-28 | 9.8 | 9.8 | 1 | 150 | A | A | A | A | A | A | A | A |
| Comparative Example 20 | Developer CD-20 | 9.8 | 8.5 | 1 | 200< | A | A | B | C | C | A | B | C |
| Example 25 | Developer D-29 | 9.8 | 9.8 | 1 | 75 | A | A | A | A | A | A | A | A |
| Example 26 | Developer D-30 | 9.8 | 9.8 | 1 | 150 | A | A | A | A | A | A | A | A |
| Example 27 | Developer D-31 | 9.8 | 9.8 | 1 | 150 | A | A | B | A | A | A | A | A |
| Comparative Example 21 | Developer CD-21 | 6.9 | 6.0 | 2 | 200< | A | A | B | C | C | A | B | C |
| Example 28 | Developer D-32 | 6.9 | 6.9 | 2 | 75 | A | A | A | A | A | A | A | A |
| Example 29 | Developer D-33 | 6.9 | 6.9 | 2 | 150 | A | A | A | A | A | A | A | A |
| Example 30 | Developer D-34 | 6.9 | 6.9 | 2 | 150 | A | A | A | A | A | A | A | A |
| Example 31 | Developer D-35 | 10 | 10 | 2 | 150 | A | A | A | B | B | A | A | B |
| Example 32 | Developer D-36 | 9.0 | 9.0 | 2 | 150 | A | A | A | A | A | A | A | A |
| Example 33 | Developer D-37 | 7.0 | 7.0 | 2 | 150 | A | A | A | A | A | A | A | A |
| Example 34 | Developer D-38 | 6.8 | 6.8 | 2 | 150 | A | A | A | A | A | A | A | A |
| Example 35 | Developer D-39 | 6.0 | 6.0 | 2 | 150 | A | A | A | A | A | A | A | A |
| Comparative Example 22 | Developer CD-19 | 9.8 | 8.5 | 3 | 200< | A | A | B | C | C | A | B | C |
| Example 36 | Developer D-26 | 9.8 | 9.8 | 3 | 75 | A | A | A | A | A | A | A | A |
| Example 37 | Developer D-27 | 9.8 | 9.8 | 3 | 150 | A | A | A | A | A | A | A | A |
| Example 38 | Developer D-28 | 9.8 | 9.8 | 3 | 150 | A | A | A | A | A | A | A | A |
| Example 39 | Developer D-40 | 10 | 10 | 3 | 150 | A | A | A | B | B | A | A | B |

TABLE 7-continued

| Example | Developer | pH (immediately after preparation) | pH Stability pH (after 2 months) | Printing Plate Precursor Evaluated | Film-Forming Property | | Developability | | | Dispersibility of Development Scum | Stain Resistance | | |
|---|---|---|---|---|---|---|---|---|---|---|---|---|---|
| | | | | | Scratch Staining (g) of Non-Image Area | Stickiness | Immediately after Preparation | After Standing Still for 2 Months | Standing Still for 2 Months + Running Processing | | Immediately after Preparation | After Standing Still for 2 Months | Standing Still for 2 Months + Running Processing |
| Example 40 | Developer D-41 | 9.0 | 9.0 | 3 | 150 | A | A | A | A | A | A | A | A |
| Example 41 | Developer D-42 | 7.0 | 7.0 | 3 | 150 | A | A | A | A | A | A | A | A |
| Example 42 | Developer D-43 | 6.8 | 6.8 | 3 | 150 | A | A | A | A | A | A | A | A |
| Example 43 | Developer D-44 | 6.0 | 6.0 | 3 | 150 | A | A | A | A | A | A | A | A |
| Comparative Example 23 | Developer CD-8 | 12 | 10 | 5 | 200< | A | A | B | B | B | AA | C | C |
| Comparative Example 24 | Developer CD-9 | 11 | 9.5 | 5 | 200< | A | A | C | C | C | AA | C | C |
| Example 44 | Developer D-13 | 12 | 11.8 | 5 | 150 | A | A | A | A | A | AA | A | A |
| Example 45 | Developer D-14 | 11 | 11 | 5 | 150 | A | A | A | A | A | AA | A | A |
| comparative Example 25 | Developer CD-3 | 9.8 | 8.5 | 6 | 200< | A | A | B | C | C | AA | C | C |
| Example 46 | Developer D-10 | 9.8 | 9.8 | 6 | 150 | A | A | A | A | A | A | A | A |
| Comparative Example 26 | Developer CD-19 | 9.8 | 8.5 | 7 | 200< | A | A | B | C | C | A | B | C |
| Example 47 | Developer D-27 | 9.8 | 9.8 | 7 | 150 | A | A | A | A | A | A | A | A |
| Comparative Example 27 | Developer CD-22 | 9.8 | 9.8 | 1 | 100 | A | A | A | B | B | A | B | C |

It is seen from the results of pH stability that the developer containing a sugar having a component with a reducing terminal is decreased in pH with aging, but the developer containing a non-reducing sugar (not having a reducing terminal) is kept from decrease in pH.

Also, among non-reducing sugars, in the case of a sugar alcohol in which the molecular weight corresponding to a monosaccharide is 200 or less, scratch resistance of the non-image area and stickiness on the plate surface after development are poor as compared with the developer containing the specific non-reducing sugar, and this reveals that the film-forming ability is low.

It is seen that a sugar having a large molecular weight and a compound obtained by subjecting a phosphoric acid-modified starch to a reducing treatment and thereby converting it into a non-reducing sugar are excellent in stain resistance.

In the developer containing a non-reducing reduced starch saccharification product, irrespective of the pH immediately after preparation, the pH is scarcely decreased after passing of 2 months from the preparation. On the other hand, in the developer containing gum arabic having a reducing terminal, the pH is decreased with the passing of 2 months, but as the pH is lower, the decrease of pH is reduced, and when the pH is 5.5, there is no difference. Details of the cause thereof are not analyzed, but this is considered to be a result because a reducing reaction more proceeds as the system is more basic.

Accordingly, it is understood that the effect of preventing pH reduction by the non-reducing sugar is produced in the pH range of 6 to 14. Also, the developer reduced in the pH is poor not only in developability but also in stain resistance.

It is seen that not only by an amphoteric (betainic) surfactant, the same effects as the amphoteric (betainic) surfactant are obtained also by an anionic surfactant and a nonionic surfactant.

It is understood that as regards the effect of preventing the pH reduction with aging and preventing deterioration of developability and stain resistance, the developer containing the specific non-reducing sugar produces the same effect as above also during processing containing a water-soluble amine compound and an ion of the amine compound.

It is seen that as regards the effect of preventing deterioration of developability and stain resistance with aging, the developer containing the specific non-reducing sugar produces the same effect as above also on a positive lithographic printing plate precursor.

It is seen that as regards the effect of preventing deterioration of developability and stain resistance with aging, the developer containing the specific non-reducing sugar produces the same effect as above also on a thermal negative lithographic printing plate precursor.

It is seen that the same effects as above are obtained also on a lithographic printing plate precursor using an Si-treated support.

It is seen that in view of stain resistance, the sugar is advantageous to a hydrophilic resin typified by polyvinyl alcohol.

As verified from these results, the developer of the present invention has a pH stable to aging and excellent film-forming property, enables a simple processing of one solution and one step requiring no water washing step, makes it possible to suppress staining of the non-image area because of high developability and high dispersibility of development scum, and can provide a method capable of manufacturing an excellent lithographic printing plate.

Industrial Applicability

According to the present invention, a developer having a pH stable to aging and having excellent film-forming property can be provided. Also, thanks to this developer, a manufacturing method of a lithographic printing plate, ensuring that even by simple processing of one solution and one step requiring no water washing step, a lithographic printing plate excellent in developability and dispersibility of development scum and kept from staining of the non-image area can be manufactured, and a printing method of performing printing by using this manufacturing method of a lithographic printing plate can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2010-084414) filed on Mar. 31, 2010, the contents of which are incorporated herein by way of reference.

DESCRIPTION OF REFERENCE NUMERALS AND SIGNS

11: Transport path for lithographic printing plate precursor
50: External tank
51: Overflow opening
52: Upper limit liquid level meter
53: Lower limit liquid level meter
54: Filter unit
55: Developer supply pump
71: Water tank for replenishment
72: Water-replenishing pump
100: Automatic developing processor
101: Transport roller pair
102: Transport roller pair
103: Rotating brush roller
104: Transport roller pair
105: Transport roller pair
106: Rotating brush roller
107: Rotating brush roller
108: Transport roller pair
109: Transport roller pair
110: Receiving roller
111: Transport roller pair
112: Transport roller pair
113: Transport roller pair
200: Pre-heating unit
202: Machine frame
208: Heating chamber
210: Skewer roller
212: Transport inlet
214: Heater
216: Circulation fan
218: Transport outlet
300: Developing unit
304: Insertion roller pair
306: Processing tank
308: Developing tank
310: Outer panel
312: Slit-like insertion opening
316: Submerged roller pair
318: Carrying-out roller pair
322: Brush roller pair
324: Shielding cover
326: Brush roller pair
330: Spray pipe
332: Partition board
334: Slit-like insertion opening 336: Liquid temperature sensor
338: Liquid level meter
342: Guide member
344: Guide roller
400: Drying unit
402: Support roller
404: Discharge port
406: Transport roller pair
408: Transport roller pair
410: Duct
412: Duct
414: Slit hole
C1: First circulation pipeline
C2: Second circulation pipeline
C3: Third circulation pipeline

The invention claimed is:

1. A method for manufacturing a lithographic printing plate, comprising imagewise exposing a negative lithographic printing plate precursor comprising a hydrophilic support having thereon, in the following order, a photosensitive layer containing (i) a polymerization initiator, (ii) a polymerizable compound and (iii) a binder polymer, and a protective layer, and removing the protective layer and the photosensitive layer of an unexposed area and performing a gum solution treatment with a developer comprising a non-reducing sugar having bonded therein two or more monosaccharides and having a pH of 6 to 14, wherein said non-reducing sugar is a reduced starch saccharification product having a molecular weight of 1,000 or more.

2. The method for manufacturing a lithographic printing plate as claimed in claim 1, which does not include a water washing step either before or after the step of removing the protective layer and the photosensitive layer of the unexposed area.

3. The method for manufacturing a lithographic printing plate as claimed in claim 1, wherein the hydrophilic support of said lithographic printing plate precursor is an aluminum support surface-treated with at least either one of an alkali metal silicate and an organic phosphonic acid.

4. A method for manufacturing a lithographic printing plate, comprising imagewise exposing a positive lithographic printing plate precursor comprising a hydrophilic support having thereon an image recording layer containing a binder polymer and an infrared absorber, and removing the image recording layer of an exposed area in the presence of a developer comprising a non-reducing sugar having bonded therein two or more monosaccharides and having a pH of 6 to 14, wherein:
    the non-reducing sugar is a reduced starch saccharification product having a molecular weight of 1,000 or more, and
    the image recording layer on the hydrophilic support of the positive lithographic printing precursor comprises a lower layer containing a water-insoluble and alkali-soluble resin and the infrared absorber and an upper layer containing a water-insoluble and alkali-soluble polyurethane and a polyorganosiloxane.

* * * * *